US008878143B2

(12) United States Patent
Yasuda

(10) Patent No.: US 8,878,143 B2
(45) Date of Patent: Nov. 4, 2014

(54) ELECTRON BEAM LITHOGRAPHY DEVICE AND LITHOGRAPHIC METHOD

(71) Applicant: Param Corporation, Tokyo (JP)

(72) Inventor: Hiroshi Yasuda, Hasuda (JP)

(73) Assignee: Param Corporation, Tokyo (JP)

( * ) Notice: Subject to any disclaimer, the term of this patent is extended or adjusted under 35 U.S.C. 154(b) by 0 days.

(21) Appl. No.: 14/349,390

(22) PCT Filed: Sep. 27, 2012

(86) PCT No.: PCT/JP2012/074980
§ 371 (c)(1),
(2), (4) Date: Apr. 3, 2014

(87) PCT Pub. No.: WO2013/051467
PCT Pub. Date: Apr. 11, 2013

(65) Prior Publication Data
US 2014/0231668 A1      Aug. 21, 2014

(30) Foreign Application Priority Data

Oct. 3, 2011    (JP) ................................ 2011-219530
May 25, 2012   (JP) ................................ 2012-120130

(51) Int. Cl.
| H01J 37/147 | (2006.01) |
| H01J 37/244 | (2006.01) |
| H01J 3/26 | (2006.01) |
| G01J 1/42 | (2006.01) |
| H01J 37/317 | (2006.01) |
| H01J 37/30 | (2006.01) |

(52) U.S. Cl.
CPC ........... *H01J 37/147* (2013.01); *H01J 37/3177* (2013.01); *H01J 37/3007* (2013.01)
USPC .... 250/396 R; 250/306; 250/307; 250/208.2; 250/398; 250/492.2; 250/492.22

(58) Field of Classification Search
CPC ..................... H01J 37/3177; H01J 2237/0492; H01J 37/04; H01J 37/045; H01J 2237/0435; H01J 37/06; H01J 3/02
USPC ....... 250/396 R, 306, 307, 208.2, 398, 492.2, 250/492.22
See application file for complete search history.

(56) References Cited

U.S. PATENT DOCUMENTS 5,399,872 A *  3/1995  Yasuda et al. ............ 250/492.22
5,834,783 A    11/1998  Muraki et al.

(Continued)

FOREIGN PATENT DOCUMENTS

GB    2349737 A    8/2000
JP    H6-132203 A    5/1994

(Continued)

OTHER PUBLICATIONS

H. Yasuda et al., "Fast Electron Beam Lithography System with 1024 Beams Individually Controlled by Blanking Aperture Array" Jpn. J. Appl. Phys. vol. 32 (1993) pp. 6012-6017 Part 1, No. 12B, Dec. 1993.

*Primary Examiner* — Nikita Wells
(74) *Attorney, Agent, or Firm* — Nixon Peabody LLP

(57) ABSTRACT

A high-accuracy and high-speed lithographic pattern is acquired by forming a square lattice matrix beam group with an interval which is an integral multiple of a beam size in a two-dimensional plane, switching on and off the mesh of a device to be drawn by a bitmap signal, forming a desired beam shape, deflecting the beam to a necessary position, and radiating a beam with a whole blanker being opened after the beam state is stabilized. On and off signals and a vector scan signal of each beam are provided, and the whole blanker is released after the beam is stabilized, and thus high-accuracy and high-speed lithography is performed with a small amount of data. When the total number of shots exceeds a constant value, the pattern data are modified and high-speed lithography is achieved. A semiconductor reversed bias p-n junction technique is preferably used for an individual blanker electrode.

11 Claims, 36 Drawing Sheets

(56) References Cited

U.S. PATENT DOCUMENTS

| | | |
|---|---|---|
| 5,973,332 A | 10/1999 | Muraki et al. |
| 6,166,387 A | 12/2000 | Muraki et al. |
| 6,323,499 B1 | 11/2001 | Muraki et al. |
| 7,105,842 B2 * | 9/2006 | Tanimoto et al. ........ 250/492.22 |
| 8,258,484 B2 * | 9/2012 | Wieland et al. ........... 250/396 R |
| 2004/0143356 A1 | 7/2004 | Yoda et al. |
| 2005/0072941 A1 | 4/2005 | Tanimoto et al. |
| 2006/0017021 A1 | 1/2006 | Yoda et al. |
| 2009/0212240 A1 | 8/2009 | Platzgummer et al. |

FOREIGN PATENT DOCUMENTS

| | | |
|---|---|---|
| JP | H9-245708 A | 9/1997 |
| JP | 2001-015428 A | 1/2001 |
| JP | 2004-063870 A | 2/2004 |
| JP | 2005-116743 A | 4/2005 |
| JP | 2007-158235 A | 6/2007 |
| JP | 2009-514200 A | 4/2009 |

* cited by examiner

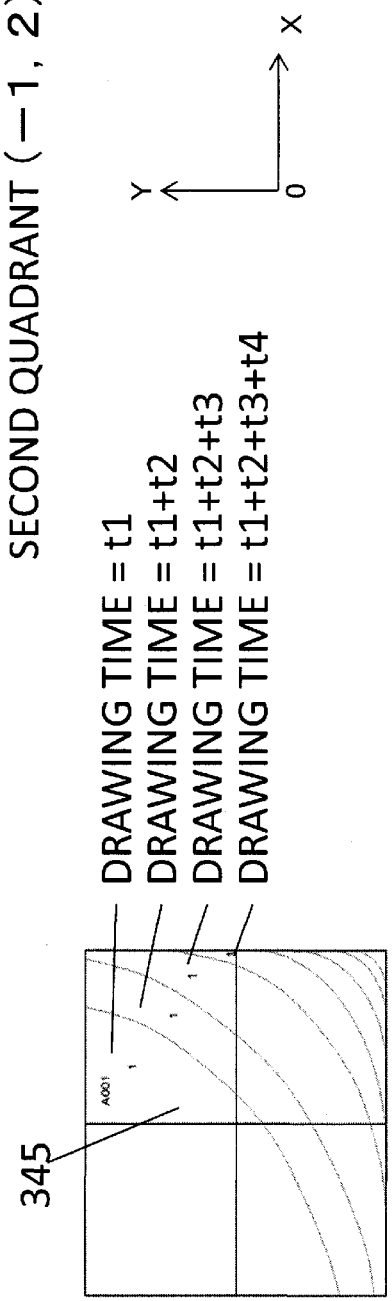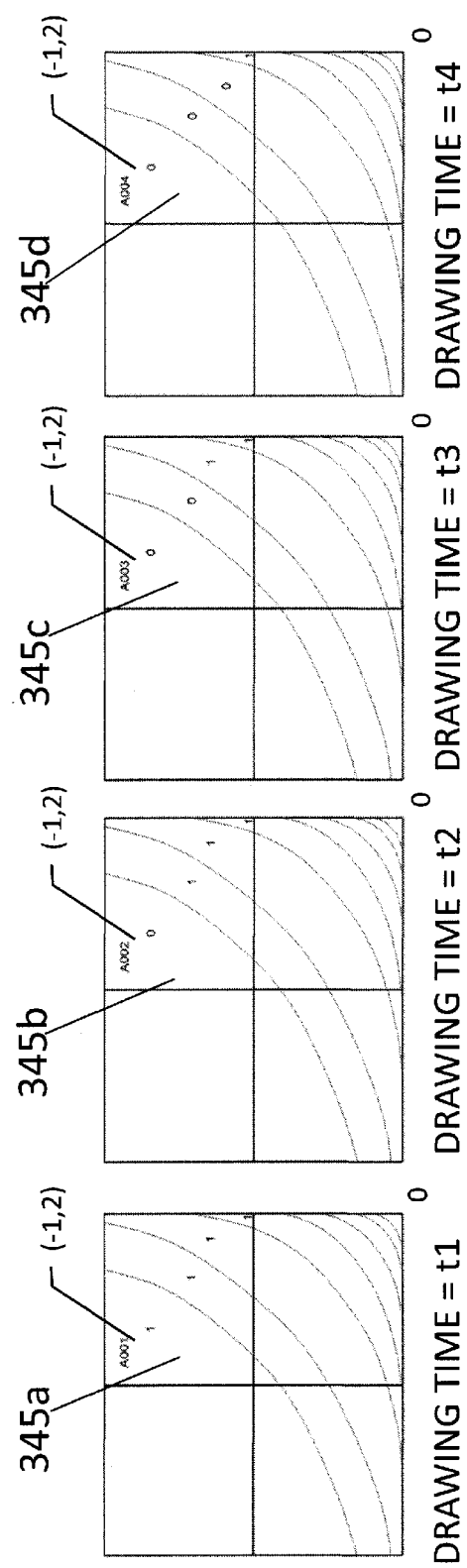
FIG. 27

ELECTRON BEAM LITHOGRAPHY DEVICE AND LITHOGRAPHIC METHOD

CROSS-REFERENCE TO RELATED APPLICATIONS

This application is a U.S. National Stage of International Application No. PCT/JP2012/074980, entitled "Electron Beam Lithography Device and Lithographic Method," filed Sep. 27, 2012, which claims the benefit of Japanese Patent Application No. 2011-219530, filed Oct. 3, 2011, and of Japanese Patent Application No. 2012-120130, filed May 25, 2012, all of which are incorporated herein by reference in their entireties.

TECHNICAL FIELD

The present invention relates to an improvement in an electron beam lithography device and a lithography method.

The present application claims priority to Japan Patent Application No. 2011-219530 and Japan Patent Application No. 2012-120130, the contents of which are incorporated herein by reference.

BACKGROUND ART

Electron beam lithography technology has been used in the field of lithography in which a circuit pattern is exposed in a semiconductor (LSI) manufacturing process.

Electron beam lithography methods include various types of methods, among them is a multibeam lithography method in which a great number of beams are used to perform continuous scanning in one direction for drawing.

Patent Document 1 and Non-Patent Document 1 disclose a BAA system in which a blanker aperture array (BAA) is used in the multibeam lithography method. As illustrated in FIG. 3, this BAA system employs a lithography method in which a beam is first divided into a great number of discrete individual element beams, so that the great number of individual element beams are scanned continuously in one direction while independently being turned ON and OFF. Accordingly, a single drawing point on a resist is exposed by the great number of discrete individual element beams in an overlapping manner.

PRIOR ART DOCUMENTS

Patent Document

Patent Document 1: JP 06-132203 A

Non-Patent Document

Non-Patent Document 1: H. Yasuda, S. Arai, J. Kai, Y. Ooae, T. Abe, Y. Takahashi, S. Fueki, S. Maruyama, and T. Betsui: *Jpn. J. Appl. Phys.* 32 (1993): 6012.

DISCLOSURE OF THE INVENTION

Technical Problems

In the BAA system as described above, because the identical beams trace in the scanning direction and therefore an identical pattern is subjected to multiple exposure, and also because scanning is also overlapped, drawing involves much unnecessary time. Further, as multiple exposure is performed in the scanning direction, it is difficult to recognize the status of an erroneous shot. In addition, as the sharpness of a beam edge differs between the scanning direction and the non-scanning direction, pattern accuracy is insufficient.

Moreover, because the individual element beams are turned ON and OFF in synchronism with the scanning, it is difficult to maintain high beam position accuracy.

Solution to Problems

According to the invention, there is provided an electron beam lithographic method in which an electron beam lithography device is used for scanning a plurality of individual element beams on a specimen for lithography, the electron beam lithography device including an electron gun which emits an electron beam in a Z-axis direction; a shielding plate having a plurality of openings arranged in X and Y directions at a predetermined arrangement pitch, the shielding plate obtaining a plurality of individual element beams having a beam size which is restricted to a size of the opening from the electron beam emitted from the electron gun; a plurality of individual blankers configured to turn the plurality of individual element beams obtained by the shielding plate ON/OFF individually; a whole blanker configured to turn the plurality of individual element beams emitted from the plurality of individual blankers ON/OFF as a whole; and a deflector which deflects the plurality of individual element beams having passed through the plurality of individual blankers and the whole blanker as a whole by every predetermined pitch, so as to scan the plurality of individual element beams stepwise with respect to the specimen, wherein in a state in which emission of the plurality of individual element beams from the whole blanker is turned OFF, a direction of emission of the plurality of individual element beams is determined by the deflector, and, in accordance with a bitmap indicating ON/OFF of emission of the individual element beam from each individual blanker which is generated per shot in each emission direction, the plurality of individual element blankers are controlled to control ON/OFF of the individual element beams emitted from the respective individual element blankers, after processing for emitting the individual element beam from each individual blanker is settled, with the emission of the plurality of individual element beams from the whole blanker being turned ON, one shot formed by the individual element beams from a plurality of individual blankers in the ON state is emitted to the specimen, and, with repetition of this one-shot emission formed by a plurality of individual beams while shifting positions of the plurality of individual element beams by the deflector, a pattern in accordance with pattern data which is a target of lithography is drawn on the specimen, and the bitmap is generated based on comparison between the pattern data and irradiation positions of the plurality of individual element beams onto the specimen that are determined in accordance with the arrangement pitch of the openings in the shielding plate, and, at the time of generating the bitmap, the number of shots that is necessary for performing lithography corresponding to the pattern data is calculated, and when the number of necessary shots which is calculated exceeds the predetermined number, the pattern data are changed.

Further, in one aspect, the individual blanker includes a pair of electrodes for deflecting the individual element beam, and the pair of electrodes are formed using a semiconductor layer which is provided at a location of a P-type or N-type semiconductor substrate through which the individual element beam passes and in which N-type or P-type impurities which are of a type opposite to the type of the semiconductor substrate are doped on a side surface of the opening.

Advantageous Effects of Invention

According to the present invention, there can be provided a high-accuracy and super-high-speed electron beam lithography device and method.

BRIEF DESCRIPTION OF THE DRAWINGS

[FIG. 27] View for explaining an exposure intensity distribution in the proximity effect correction.

BEST MODE FOR CARRYING OUT THE INVENTION

Embodiments of the present invention will be described below.

Figure 1:
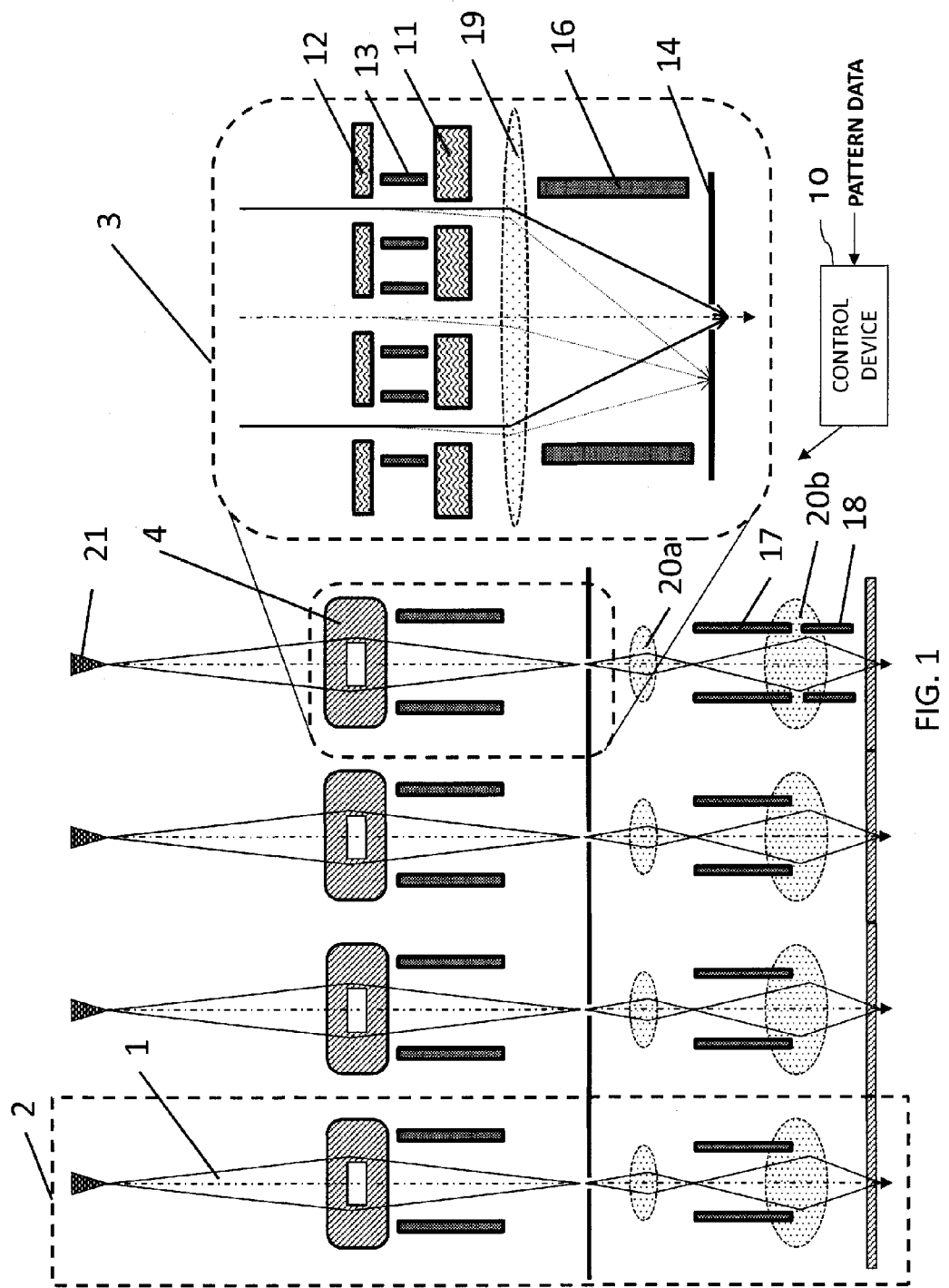
[FIG. 1] View illustrating an electronic optical column for use in a multi-axis PSA (Programmable Shaping Aperture system), and illustrating a cross section having a plurality of columns.

As illustrated in FIG. 1, a lithography device according to the present embodiment is a multi-column type lithography device in which there are arranged a predetermined number of columns, each producing a plurality of square beams (individual element beams) from an electron beam emitted from a single electron gun 21 in the Z-axis direction and irradiating a specimen with the square beams.

One column includes one electron gun 21, and an electron beam emitted from this electron gun 21 is evenly radiated onto a PSA-BA substrate 4. The PSA-BA substrate 4 includes electronic shielding plates 11 and 12 in which a plurality of square openings are arranged in a square lattice shape, and with these electronic shielding plates 11 and 12, a plurality of square individual element beams arranged in a square lattice shape in X and Y directions at a predetermined arrangement pitch can be obtained from the electron beam from the electron gun 21. In this example, 4×4=16 individual element beams can be obtained. An individual blanker 13 is provided between the electron shield plates 11 and 12. By controlling a voltage applied to a pair of electrodes of this individual blanker 13, the individual element beam is deflected as indicated by a dotted line in FIG. 1, thereby turning ON/OFF the individual element beam. Further, a whole blanker 16 is provided for one column, for deflecting a plurality of individual element beams in one column as a whole. A round aperture 14 includes an opening at the center portion thereof. The individual element beams deflected by the individual blanker 13 or the whole blanker 16 cannot pass through the round aperture 14 and are turned OFF. The individual element beams that are not turned OFF by the individual blanker 13 and the whole blanker pass through the round aperture 14 and are emitted in the Z-axis direction.

Further, by moving the individual element beam passing through the round aperture 14 with deflection devices (a main deflector 17 and a sub deflector 18) in predetermined steps, a plurality of individual element beams are scanned to perform drawing of a predetermined pattern.

In the present embodiment, with all the individual element beams from one column being turned OFF by the whole blanker 16, in this state, ON/OFF of each of the individual blankers 13 is determined in accordance with a bitmap which is determined corresponding to pattern data, and after this operation is stabilized, the whole blanker 16 is turned ON, so that the individual element beams corresponding to one column that are controlled ON/OFF are emitted onto a specimen. Then, the irradiation positions of the individual element beams are moved stepwise, and irradiation of the individual element beams based on the bitmap at each position is repeated, thereby drawing a pattern within a predetermined range.

In the present embodiment, rather than drawing a target lithographic pattern as it is, the target lithographic pattern is changed as appropriate by comparison with an area which can be irradiated with the beams by the lithography device described above. More specifically, the arrangement pitch of the individual element beams is determined by the layout of the openings of the electron shielding plates 11 and 12. Therefore, the ON/OFF (bitmap) of the individual element beams at each shot is determined by the pattern data and the layout of the irradiation positions of the individual element beams onto the specimen which is obtained by the layout of the openings of the electron shielding plates 11 and 12. There is a possibility that, depending on the pattern data, the number of shots is enormous so as to realize the irradiation. Accordingly, in the present embodiment, if the number of shots exceeds a predetermined value, the pattern data are modified to thereby suppress the number of shots (the number of bitmaps to be used) to a predetermined number or less.

As described above, with the lithography device according to the present embodiment, because drawing is performed by turning ON/OFF the square beams in a static state, it is not possible to draw patterns of any size with a desired size. Thus, in spite of imposing slight restrictions on the shape and size of the pattern, it is possible to achieve high accuracy and high throughput simultaneously. Here, according to the present embodiment, a beam is formed by using a beam former corresponding to a pattern rule of the device.

In the following description, a pattern that can be drawn by disposing a natural number of square beam emitting sections having a beam size S in both rows and columns and moving the beam emitting sections at a predetermined pitch will be referred to as a pattern that can be drawn with a square lattice mesh.

In the present embodiment, a pattern shape which is set as a target (a target pattern shape) is deformed into pattern data formed of a pattern mesh in which square element regions having a side length of any one of 20, 18, 16, 14, 12, 10, 8, 6, 4, 3, 2, and 1 nm are arranged in a matrix. More specifically, the target pattern shape to be formed is compared with a pattern mesh, and a bitmap is created in which, concerning each square region of the pattern mesh, an element region (mesh) which corresponds to the target pattern shape is designated by "1" and an element region which does not correspond to the target pattern shape is designated by "0."

Then, a beam is emitted concerning the element regions corresponding to "1" of the bitmap, so that a target is irradiated with a beam. Thus, a pattern which is close to the target pattern shape can be drawn.

As described above, according to the present embodiment, the target pattern shape which is a drawing target is compared with a mesh pattern and converted to a bitmap, which is then used as data for beam control, rather than using the target pattern shape as it is as the drawing data.

In the present embodiment, the mesh pitch of the pattern and the square lattice matrix beam are matched to create highly effective ON/OFF data; i.e. a bitmap, and by performing drawing based on this bitmap, both high lithography accuracy and high lithography speed can be achieved simultaneously.

This means that if a lithography device is suitable to the device rule to be drawn, effective drawing can be achieved. For example, with regard to a pattern which can be drawn by ON/OFF of a mesh having a size S=20 nm, pattern drawing is performed by ON/OFF of square lattice matrix beams with a pitch of 80 nm. After the position scanning of beam is stabilized and the ON/OFF state of the beam is placed in a constant state, the whole blanker is caused to operate to shoot the whole beams onto an object to be exposed.

Embodiments of the present invention will be described with reference to the drawings.

The substrate which is used in FIG. 1 is a PSA-BA substrate 4, in which PSA-BA is abbreviation of Programmable Shaping Aperture Blanker Array.

As illustrated in FIG. 1, the PSA-BA substrate 4 is preferably a rectangular chip of 10 mm, for example, and is attached for use, through a whole multi-column including 87 columns arranged with respect to a wafer having a diameter of 300 mm, one by one, onto the intermediate portion in each column on the substrate formed from ceramic and the like of 300 mmφ or more. With an electron beam 1 emitted from the electron gun 21 of FIG. 1, the PSA-BA substrate 4 is irradiated with a substantially uniform electron beam intensity.

Figure 5:
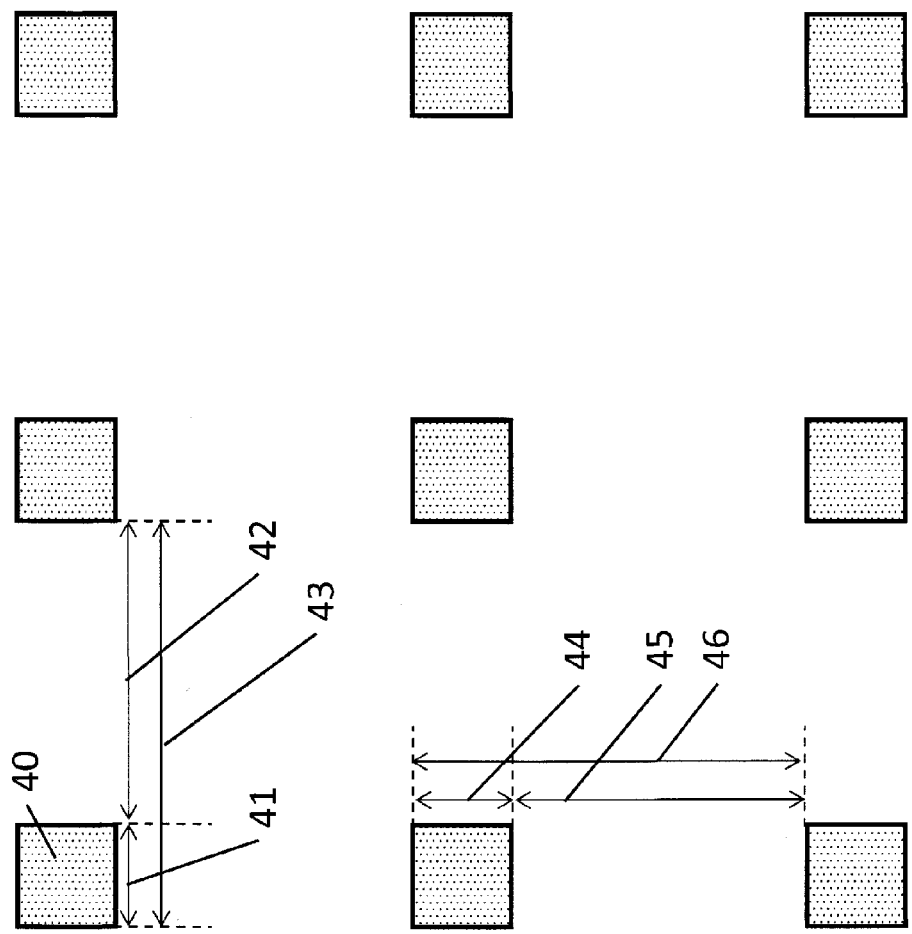
[FIG. 5] View illustrating an array of a square lattice matrix beam group A with a beam size of 20 nm and a pitch of 80 nm.

As illustrated in FIG. 5, the PSA-BA substrate 4 includes apertures 40 for beam formation, that are arranged in a square lattice shape with a pitch 43 (in the X direction) and a pitch 46 (in the Y direction) each having a size which is an integral multiple of the beam size 41 and that allow the square beams (or round beams) to pass through. In a preferable example, the pitch 43 in the X direction and the pitch 46 in the Y direction are identical.

While in the present embodiment, an SiC substrate having high resistance is used as the PSA-BA substrate 4, an Si substrate may also be used. For example, the aperture 40 is a square with a side length of 4 µm and is arranged in a matrix with a pitch of 16 µm. As a result, the beam passing through the PSA-BA substrate 4 has a size of 4 µm (4 µm☐) and a pitch of 16 µm. For example, 40 beams are arranged in the horizontal direction and 40 beams are also arranged in the vertical direction with a pitch of 16 µm. As such, 40×40=1600 square beams are arranged in the form of square lattice matrix beams. The beams are located in a square region with a side length of 640 µm, as a whole.

The region having a side of 640 µm is irradiated with electron beams with uniformity having a fluctuation rate of 0.1% or less.

Referring to FIG. 1, an individual beam (individual element beam) which is shaped by each aperture 40 passes between the electrodes of the individual blanker 13 and further passes through a rectangular opening provided below, and thereafter, is converged, by an electron lens, into an opening of the round aperture 14 which is formed of an aperture plate including a small opening formed therein.

As will be described below, when a voltage is applied to the electrodes of the individual blanker 13, a beam is deflected, and a crossover image of the electron gun is not able to pass through the opening of the round aperture 14 and is shielded by the round aperture 14, and is not radiated onto a specimen surface. When no voltage is applied to the electrodes of the individual blanker 13, a beam passes through the opening of the round aperture 14 and represents an ON state, whereas when a voltage is applied, the beam is deflected and cannot pass through the round aperture 14, which is an OFF state.

As illustrated, the electron shielding plate 11, the individual blanker 13, and the electron shielding plate 12 are formed by using the PSA-BA substrate 4 formed of a semiconductor such as SiC. In this manner, after the ON/OFF state of the 1600 individual element beams is stabilized, voltage application to the electrodes of the whole blanker 16 is controlled to allow the individual element beams that are ON to pass through the opening of the round aperture 14 and to irradiate a specimen, thereby making a resist layer of the specimen photosensitized.

Here, the electron beam passing through the round aperture 14 is subjected to image formation on the specimen surface with the size of the beam being reduced 200 times; for example, by means of a reducing glass 20a and a projection lens 20b.

At the time of image formation, the size of the individual element beam is 20 nm and the beam pitch is 80 nm. When the above-described beams are arranged in the number of 40×40=1600, the whole beam has a square shot size of 3.2 µm containing small square beams inside.

When irradiation of one shot is completed, a voltage is applied to the whole blanker 16, so that the matrix beam as a whole cannot pass through the aperture and does not irradiate the specimen surface. This is a so-called OFF state of the beam.

Thereafter, different voltages are applied to the main deflector 17 and the sub deflector 18, respectively. At the same time, new bitmap data concerning the ON/OFF information of blanking signals for the 1600 individual element beams are loaded in a register, to thereby renew all the bitmap data. While the new bitmap data are being loaded, because a signal for the blanking electrodes of the individual blanker 13 changes and electric current flows in the wiring line of the PSA-BA substrate 4, the magnetic field around the wiring line varies. As the position of the beam which should pass through each opening is not stabilized, the beam is prevented from emitting by the whole blanker 16.

When loading of the bitmap data is completed, the blanker signal for the individual element beams stops changing, and then ON/OFF of the individual element beams is determined. Here, in order to perform beam scanning, a deflection signal of the main deflector 17 and the sub deflector 18 also changes. After the stabilization of the beam deflection is terminated, the whole blanker 16 is released, so that a beam is shot onto the resist layer of the specimen surface.

The electron beam from the electron gun 21, after passing through the PSA-BA substrate 4, passes the reducing glass 20a, the main deflector 17, the projection lens 20b, and the sub deflector 18, and irradiates the specimen. This forms a single column 2.

As described above, in the present method, after the bitmap data are determined and the ON/OFF state of all the square matrix element beams is stabilized and the deflection position for beam shot is also stabilized, the whole blanker 16 is released and drawing is performed.

Accordingly, the beam is always radiated to the resist layer in a stabilized state. The whole mechanism for achieving the multi-beam lithography function described above is illustrated as a PSA-BA function section 3.

Further, the electron beam lithography device preferably includes 87 multi-axis columns for a 12-inch wafer (300 mm wafer). This is because the wafer performance; i.e. throughput, satisfies the value of 10 per hour, which is required by a device mass production engineer. Here, all the 87 columns are identical columns.

Each column includes the electron gun 21 at the top portion of the column. The electron gun 21 is an electron gun having a planar tip portion of LaB6, which can irradiate the PSA-BA substrate 4 uniformly and can achieve high brightness. The temperature is a relatively low temperature of 1600K to 1700K. An intense electric field is applied to the tip surface for extracting electrons. While a cathode of an electron gun generally has a potential of −50 KV, a potential of −45 KV to −40 KV is applied to the extraction electrode, so that the extraction electric field is applied to the electron gun cathode so as to extract electrons.

As an anode has a potential of 0 KV, the electrons emitted from the electron gun 21 are accelerated to an energy of 50 KV. The direction in which electrons travel is designated as a Z-axis direction.

The electrons are shaped by hitting the electron shielding plate 11 or 12 having an opening for forming a square beam having a size S (the length of one side is S). For example, S=4 µm. The electron shielding plate 11 or 12 includes a large number of groups of openings. The groups of openings include a group of openings having a square matrix shape, such that beams which are arranged in a perfect square lattice with a pitch of L, which is an integral multiple of S, can be formed within an X-Y plane orthogonal to the Z axis. A plurality of electron shielding plates different from the electron shielding plate 11 or 12 may exist within a plane which is parallel to the electron shielding plate 11 or 12. In this case, the size S' of a group of openings of the different electron shielding plate can be slightly larger than S.

Each of the beams that are shaped in a size S by the electron shielding plates 11 and 12 and shaped in a group of beams forming a square matrix within an X-Y plane travels between the two electrodes of the individual blanker 13, which are independently deflectable. Because the electrodes of the individual blanker 13 are parallel planar plates and the electrons travel in a straight line without being deflected if the two electrode plates have both 0V, the electrons are focused on a lens 19 and thereafter travel through the opening of the round aperture 14. In this case, the beams are in an ON state.

When the voltages of the two electrodes of the individual blanker 13 differ from each other, the electrons traveling therebetween are deflected and cannot pass through the round aperture 14 and are shielded. The beams that cannot travel through in this manner are in an OFF state.

An output from a voltage amplifier is applied to each of the electrodes of the individual blanker 13. Data indicating the ON/OFF state of the individual element beam, which are signals of "0" or "1," are transferred from the corresponding bitmap and stored in a corresponding register.

With this "0" or "1" signal, the ON/OFF of the beam is controlled. The "0" or "1" signal is referred to as a bitmap. A square lattice matrix beam group generally includes N (integer) beams arranged in the X-direction and M (integer) beams arranged in the Y direction, so that NM beams are arranged overall. Here, N may be equal to M. In this case, the square lattice matrix beam group is a perfect square beam group.

After the individual element beam travels through the individual blanker 13, the electron shielding plate 11 also functions as an electric field interference preventing plate for preventing a large number of individual blankers 13 from electric field interference. The electric field interference preventing plate is disposed adjacent to the individual blanker 13 in order to avoid interference of the voltage of the individual blanker 13 with the locus of the adjacent beam.

The beam then travels through the lens 19, so that a crossover image of the electron gun is formed on the ground aperture 14.

Further, the individual blanker 13 and the whole blanker 16 deflect the beam such that the beam deflects from the opening of the round aperture 14 and is placed in an OFF state.

When all the bitmap data are determined for the square lattice matrix beam group described above, the whole blanker 16 is released, and the beam travels through the opening (round hole) of the round aperture 14 and irradiates the specimen surface. Specifically, the beam passes through the reduction glass 20a and the projection lens 20b and is formed on the specimen surface.

Initially, as 40 apertures each having a size of 4 μm are arranged in the X direction and 40 apertures are also arranged in the Y direction at intervals of 12 μm and with a pitch of 16 μm, a total of 1600 beams are emitted in a square region having one side length of 640 μm.

The entire beam is reduced through the reduction glass 20a and the projection lens 20b, and the beam which has been reduced 200 times from the original size is projected on the specimen surface. Accordingly, 40×40=1600 square beams each having a size of 20 nm are arranged at intervals of 600 nm and with a pitch of 80 nm in a square region having one side length of 3.2 μm.

The 3.2 μm beam described above is scanned by the main deflector 17. The width of this scanning is ±25.6 μm, and a frame of one shot is scanned as a whole.

The beam is further deflected by the sub deflector 18 every 20 nm, so that a square region having a size of 80 nm can be filled by 16 shots.

The exposure time for the whole wafer will be calculated. When drawing of 26 mm/33 mm is performed, with the sensitivity of resist of 40 μC/cm², current density of 400 A/cm², 100 ns shot, sub deflector jump waiting time of 50 ns, shot cycle of 150 ns, and 6.5 MHz, the exposure time would be 206 s. Assuming that a total of 300 s including the return time for stage, a change of wafer, and calibration of a wafer is a required wafer time, drawing can be performed at the wafer processing quantity of 12/hour in the case of 300 mm wafers.

The sub deflector 18 has a deflector width which allows deflection of an 80 nm×80 nm square region. Basically, the sub deflector 18 in the X direction deflects four points of −30 nm, −10 nm, +10 nm, and +30 nm concerning the beam having a size of 20 nm, and the sub deflector 18 in the Y direction deflects four points of −30 nm, −10 nm, +10 nm, and +30 nm concerning the beam having a size of 20 nm, so that an 80 μm square region is filled by 16 deflections and shots.

Figure 11:
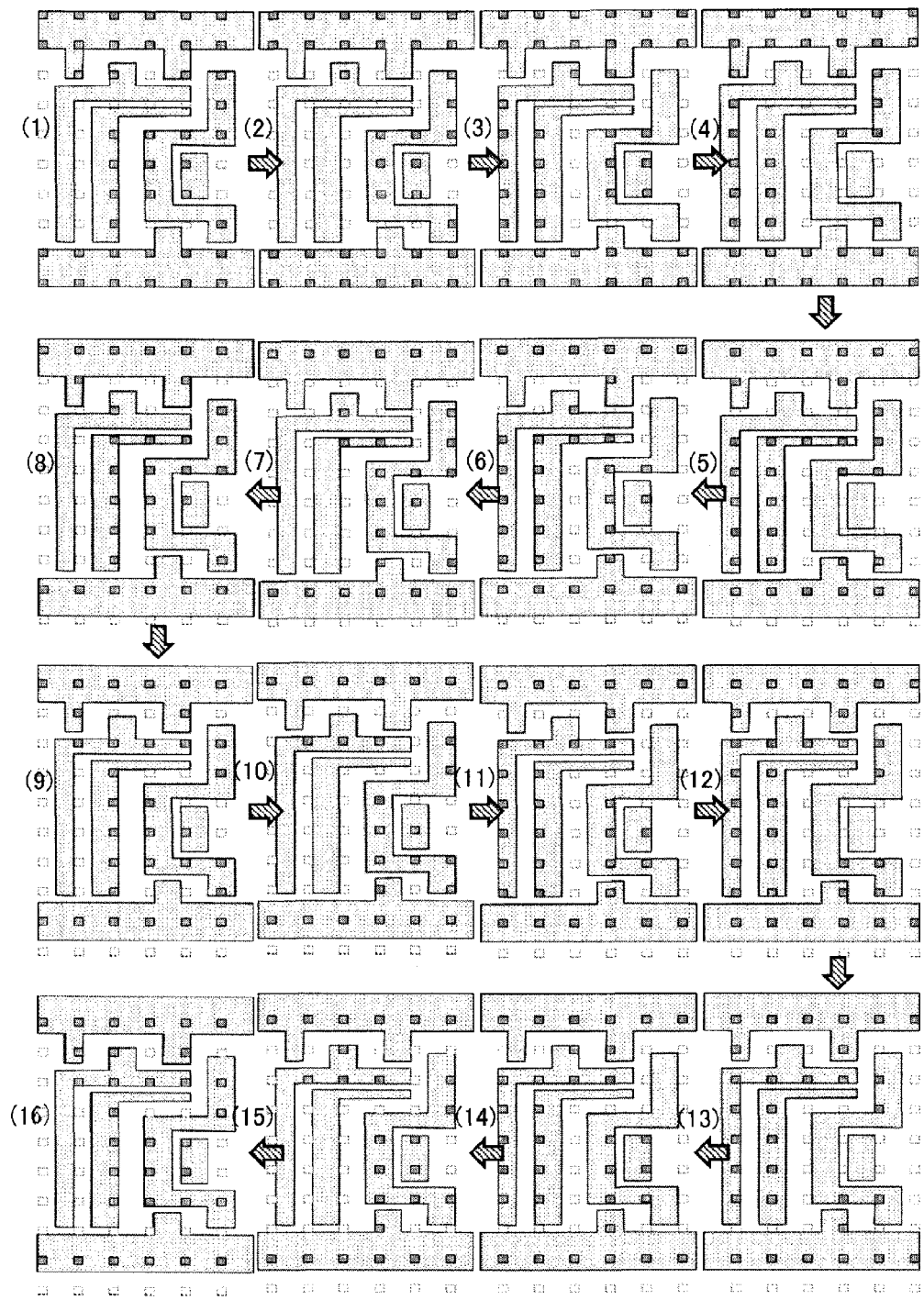
[FIG. 11] View for explaining transition of pattern lithography.

At the same time, if 1600 beams are emitted, the entire surface of a 3.2 μm square region is filled by deflection by the sub deflector 18. At this time, if a voltage from 3.3V to 5V based on desired ON/OFF bitmap data are applied to each individual blanker 13, the beam cannot pass through the round opening of the round aperture 14 in FIG. 1 and is not radiated onto the wafer. As such, by selecting whether or not each of small regions having a size of 20 nm within the 3.2 square region should be filled, a desired pattern which is divided with a 20 nm mesh can be drawn. More specifically, patterns including a checkerboard pattern, a line-and-space pattern, a one-to-one hole array, and an irregular wiring pattern as illustrated in FIG. 11 can be drawn.

In the present embodiment, multiple columns perform drawing of one wafer. Accordingly, the Multi Axis (MA) method is adopted. Also, in this embodiment, with the use of the beams within one column whose beam shape, which is electrically variable and statically fixed, programmably changes, drawing is performed by vector scanning. In this regard, the PSB (Programmable Shaped Beam) method is adopted. Therefore, the method in the present embodiment will be referred to as an MA-PSB method.

Here, FIG. 1 schematically illustrates a control device 10. The control device 10 controls the individual blanker 13, the whole blanker 16, and the deflection device (the main deflector 17 and the sub deflector 18), and also receives pattern data concerning a lithographic pattern to create, based on the received lithographic pattern, a bitmap for determining ON/OFF of the individual blanker in each shot. For example, the control device 10 creates a bitmap in accordance with the pattern data and the arrangement pitch of openings in the electron shielding plates 11 and 12, as will be described below. Further, it is desirable that the control device 10 also performs an operation to change the pattern data, when necessary.

Figure 2:
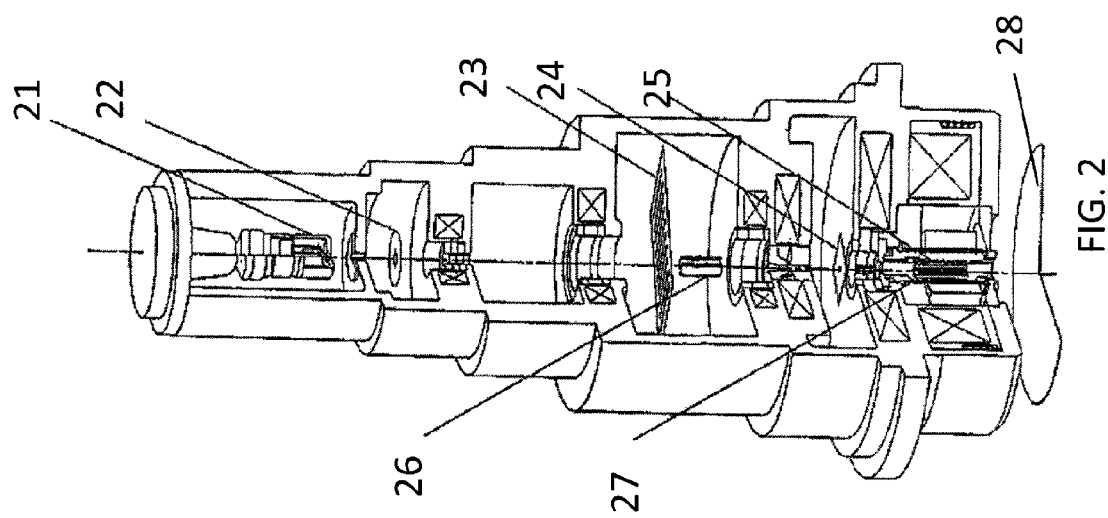
[FIG. 2] View illustrating a cross section of a BAA (Blanker Aperture Array) column in a conventional example.

FIG. 2 is a view illustrating a BAA (Blanker Aperture Array) system. An electron flow emitted from a LaB6 electron gun 21 travels in the Z direction and passes through a rectangular aperture 22, so that the electron flow is shaped into a rectangular beam. The beam then irradiates a BAA via an electron lens and travels through a BAA 23 so that 1024 individual element beams are formed. These individual element beams are controlled ON/OFF by individually independent pairs of small blanker electrodes and a round aperture 24. In the BAA 23, a blanker 26 is also provided so as to cut the beam by turning the blanker ON after completion of each one-column drawing which is performed by continuous scanning by the BAA 23, and the blanker 26 has no function of activating the blanker for each step of the individual element beam.

The beams are scanned in one continuous direction by each of a main deflector 25 and a sub deflector 27. Here, the specimen on which drawing is performed is a wafer 28.

Figure 3:
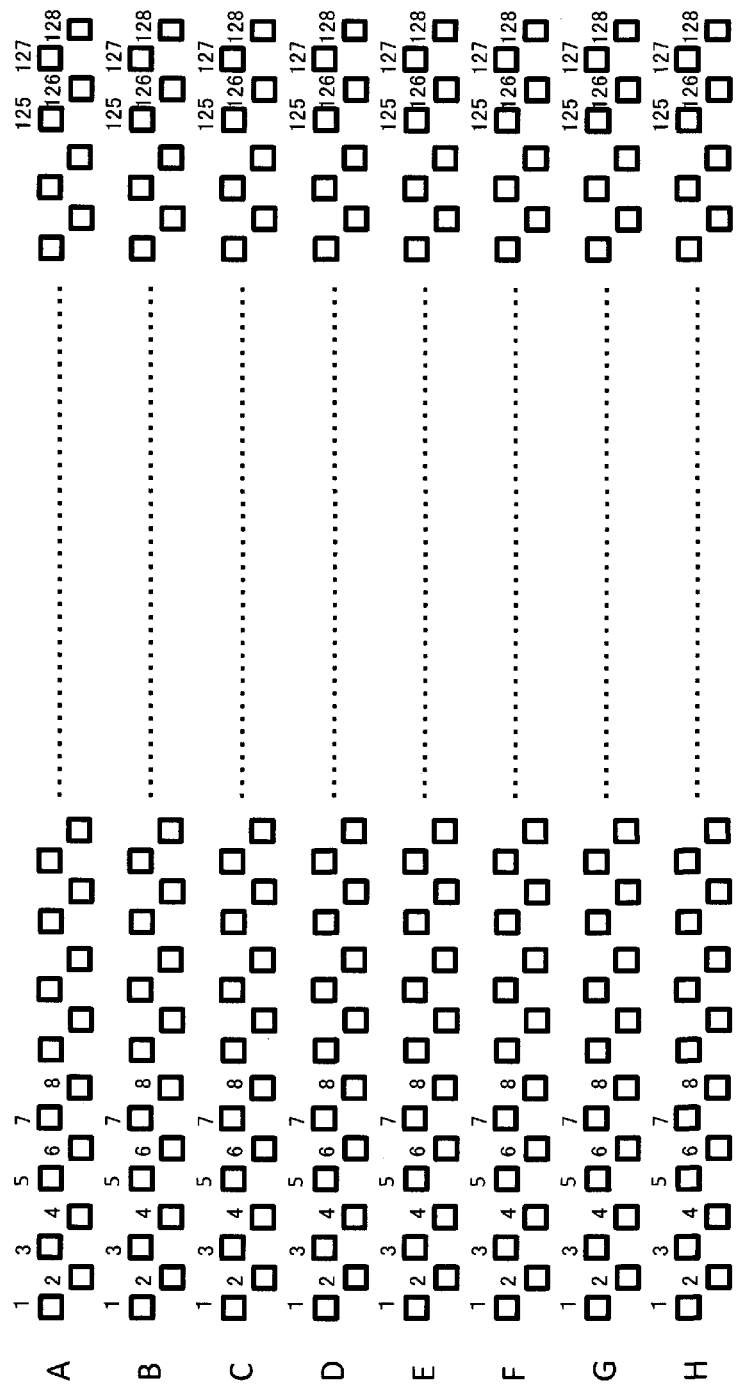
[FIG. 3] View illustrating arrays of individual element beams of a conventional example BAA.

FIG. 3 is a beam layout of the BAA (Blanker Aperture Array) and is also a layout of openings of the electron shielding plate at the same time. A group of openings of BAA is formed in a horizontally elongated shape. Eight rectangular openings, from A to H, are arranged in the vertical direction, and 128 rectangular openings, from 1 to 128, are arranged in the horizontal direction.

The rectangular openings forming beams designated by odd numbers such as 1, 3, and 5 are shifted from each other in the horizontal direction by an amount corresponding to two openings. Accordingly, when these beams are scanned in the vertical direction, a gap corresponding to one rectangle remains undrawn. Therefore, beams designated by even numbers such as 2, 4, and 6 can fill this gap to fill in the region.

However, when the beams are arranged as in the conventional BAA lithography method, only a pattern which is an integral multiple of the individual element beam size can be drawn in the horizontal direction (X direction).

It is not impossible to perform drawing of a pattern other than a pattern of an integral multiple of the beam size by slightly shifting the layout of the beam from each other such as by shifting the beams in column A with respect to the beams in column B by a half pitch to thereby perform drawing while controlling to slightly vary the ON/OFF time of the beams. Further, it is possible to adjust the pattern size in the scan direction in a subtle manner by performing scanning using continuous sawtooth waveforms in the scan direction while controlling the timing of the beam blanker in a subtle manner.

However, there are many problems, as described below.

1. The sharpness of pattern edges differs between the Y direction and the X direction; i.e. between the scan direction and the non-scan direction.

2. As the data capacity in the scan direction becomes enormous, it cannot fall within a data capacity which is appropriate for storing and verifying the whole lithography data. In the case of attempting to describe the bitmap data for describing ON/OFF of each drawing point to a size of 0.1 nm, a data capacity of $10^{20}$ or more would be necessary for a 300 mm wafer as a whole. Accordingly, it is likely that a device which stores only data of a rectangular region, which are pattern data, in spite of storing all of the bitmap data, and creates bitmap data while performing drawing, is being proposed.

However, this type of device ends up a device with very low reliability because, with no bitmap data, which are intermediate data, being stored or held, in the case of failure in the lithographic pattern, the cause of failure cannot be specified.

3. As the wiring length in the BAA device differs for all the element beams, the timing of beam ON/OFF signal also differs for all the element beams. This makes it impossible to control the beam ON/OFF timing, making the accuracy of lithographic pattern of extremely poor quality.

4. As the BAA device has a non-square shape in which the size in the X direction and the size in the Y direction differ from each other and which is elongated in one direction, it is not possible to perform uniform irradiation of electron beams from the electron gun. As a result, many element beams have non-uniform electron beam intensity.

Figure 4:
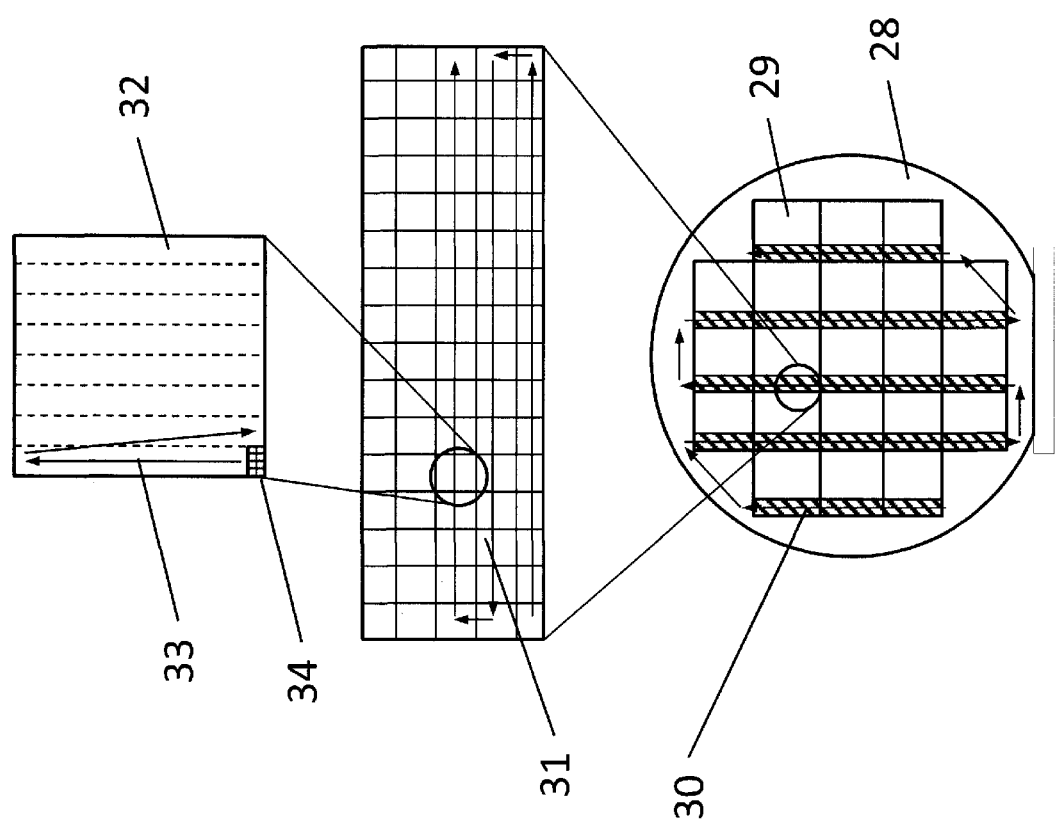
[FIG. 4] View for explaining a conventional example BAA pattern lithography method.

FIG. 4 will be described next. Because the beam group formed by BAA (an image of BAA 34) is elongated in the X direction and short in the Y direction, the frame 33 in the Y direction is continuously scanned. When a predetermined position in the Y direction is reached while scanning is performed continuously, by driving the individual blanker of the beam ON/OFF, a desired pattern is drawn. The characteristic feature of this method is that scanning is continuous and the individual blanker repeats ON/OFF driving at arbitrary timing.

The length of the frame 33 is 100 µm, and when scanning is performed to the last point in the Y direction, the scan point returns to the lower end of the sub field 32 of 100 µm. During the time after completion of the stripe drawing until the start of drawing of the next frame, the blanker 26 cuts the beam to prevent the beam from being emitted.

Next, a new frame is continuously scanned in the +Y direction, and drawing is performed. In this manner, a continuous frame is scanned to draw an inside of a square of the sub field of 100 µm.

Further, the region of the chip pattern on the wafer is formed by a main deflection range 31 which is a collection of a large number of sets of sub fields 32 and which has a length of 2 mm in the X direction, for example. After sequentially drawing 20 sub fields of 100 µm in the X direction, which is in the right direction, for example, as the moving direction of the stage is the Y direction, one step is moved upward in the Y direction, and then the sub fields are drawn one by one to the left in the X direction, thereby drawing the main deflection range 31. In this manner, equivalent stripes 30 in the Y direction in each chip 29 are drawn with respect to the wafer 28.

As described above, in the BAA method and the massive parallel method such as MAPPER method and PML2, between shots of the individual element beam, only the blanking electrodes of the individual element beam are ON/OFF controlled at a high speed, without using the whole blanker, and also high-speed beam scanning is performed in the direction vertical to the stage continuous moving direction, thereby turning ON/OFF the beams at high speed for performing drawing. Accordingly, this method has a characteristic that the individual element beam can be turned ON/OFF with a subtleness unit of 0.1 nm during one long scanning. However, this advantage is only achieved in conjunction with a disadvantage of holding an enormous data capacity and sacrificing the pattern drawing accuracy.

This is a result of disregarding the possibility that, when driving a large number of high speed blankers, electric current flows in the wiring line to cause fluctuation in the electron beams.

Further, in a device which is used for BAA and the like, as an insulating substance such as a silicon oxide film or a silicon nitride film is used, scattering beams are charged up, and breakdown of an insulating film due to electron beam occurs. In the present embodiment, as an insulating means is taken in which an intrinsic semiconductor, an amorphous semiconductor, and PN junction are used to employ a depletion layer of a semiconductor, charge-up of the scattering beam and breakdown of an insulating film due to the electron beam can be reduced.

FIG. 5 is a view for explaining a state of shots of PSB (Programmable Shaping Beam) according to the present embodiment.

The size of a beam 40 in a mesh is 20 nm, and the pitch is 4 times the beam size. Specifically, a square beam having a size S=20 nm is arranged in a square lattice with a pitch of 80 nm, which is a 4-times pitch. In the drawing, 41 denotes a beam size in the X direction, 42 denotes a beam-beam space in the X direction, 43 denotes a beam pitch in the X direction, 44 denotes a beam size in the Y direction, 45 denotes a beam-beam space in the Y direction, and 46 denotes a beam pitch in the Y direction.

While FIG. 5 illustrates only 3×3=9 beams, actually 40×40=1600 beams 40 are arranged. With S=20 nm, an interval of 20×3=60 nm is present between beams. The beam pitch is 20 nm×4=80 nm in each of the X and Y directions. In a general pattern, ON/OFF control of the beam is performed in accordance with appropriate bitmap data, and after the ON state or the OFF state of the individual element beam is stabilized, one-shot exposure is performed by a whole beam. Subsequently, the whole blanker is activated to place all the beams into an OFF state, the bitmap data of the next shot is captured into a register, and after the ON/OFF state of the beam is in a constant state and also deflection of the sub deflector to a predetermined position of 80 nm☐ is stabilized, the whole blanker is released to expose the next shot.

When an 80 nm square is drawn with 16 shots as described above, drawing of 3.2 µm square is completed with 1600 shots. Thereafter, the main deflector may be deflected so as to shift to drawing of the next 3.2 µm square.

It is possible to perform extra shots to positions other than the 16 shots, depending on the pattern data, or to perform drawing with 3.2 µm being an arbitrary intermediate value.

The present embodiment is characterized in that the ON/OFF state of the beams to be shot simultaneously is determined by a bitmap and in that this beam shot is performed after the position and intensity of the beam is stabilized. Specifically, a plurality of square beams having the same size are located at lattice points of a square lattice matrix and simultaneously contribute to lithography in a state in which they are stabilized on the substrate on which drawing is performed for a predetermined time period. As a beam may be either in the ON state or in the OFF state in accordance with the bitmap, whether a specific beam is ON or OFF depends on the pattern data.

Figure 6:
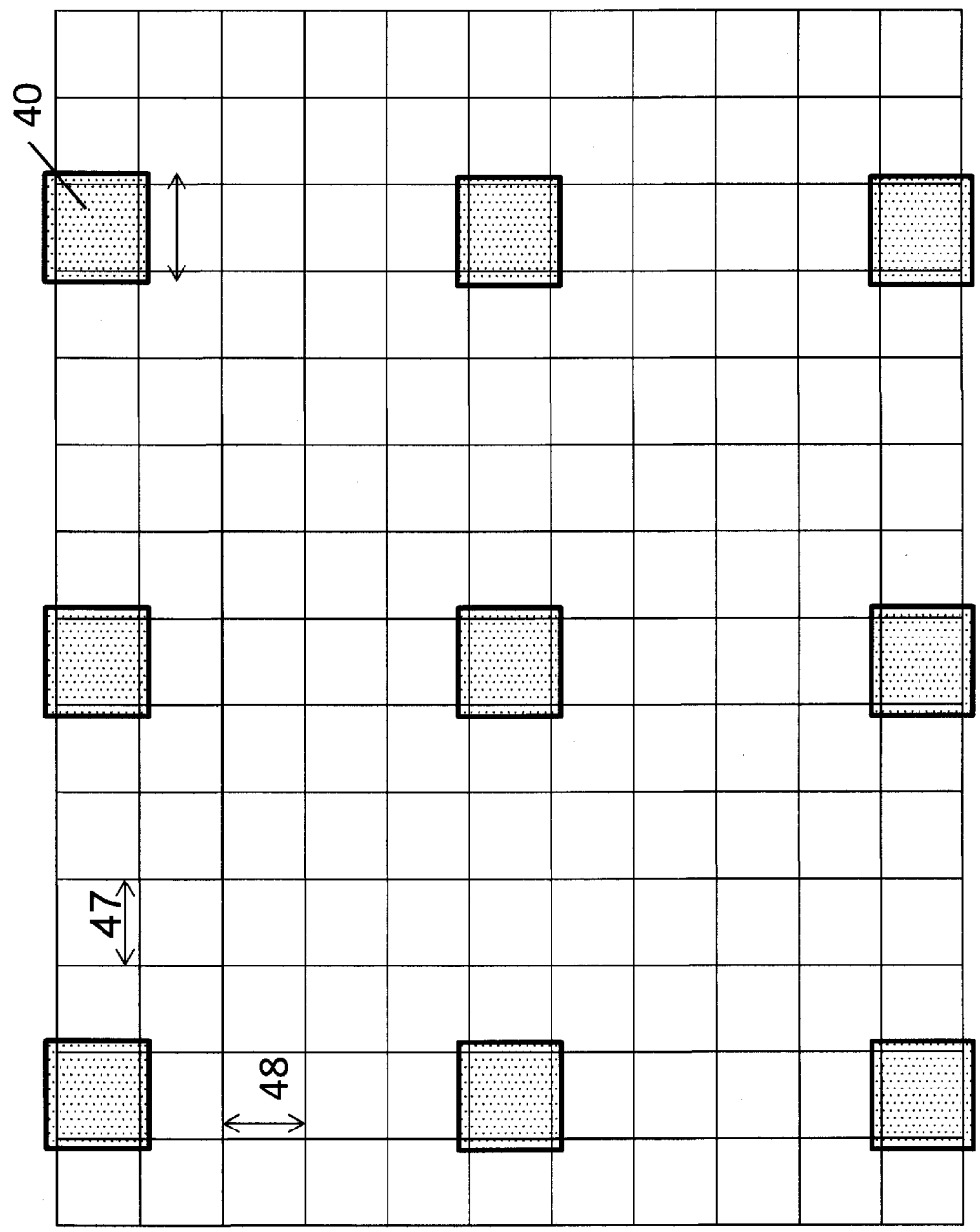
[FIG. 6] View illustrating how pattern data which are cut with a 16 nm mesh are drawn with the array of the square lattice matrix beam group A.

FIG. 6 is a view illustrating that, with the use of a square matrix beam group of a mesh size of 20 nm shown in FIG. 5, a square lattice matrix pattern having a mesh size of 16 nm and a pitch of 80 nm, which is 5×16 nm, can be drawn. Specifically, when drawing the 16 nm mesh, drawing is performed by reducing the time period in which the whole blanker is ON by 0.8×0.8=0.64 times, moving the sub deflector for each interval of 16 nm, and controlling ON/OFF of the individual element beams based on the bitmap data, so that a 16 nm mesh pattern can be drawn. In the drawing, 47 denotes the mesh size in the X direction and 48 denotes the mesh size in the Y direction.

The case of drawing a 16 nm mesh pattern differs from the case of drawing a 20 nm mesh pattern in that the pitch at which the sub deflector moves changes from 20 nm to 16 nm and in that 25 shots, rather than 16 shots, are necessary for fill in the 80 nm square. Further, if the resist sensitivity is the same, the irradiation time per beam is reduced to 64%. Assuming that the waiting time of the sub deflector does not change significantly, the overall drawing time would be somewhat extended. However, it is of great significance that the 16 nm mesh pattern can be drawn by using a lithography device with a 20 nm square lattice matrix beam group as a substitute.

Figure 7:
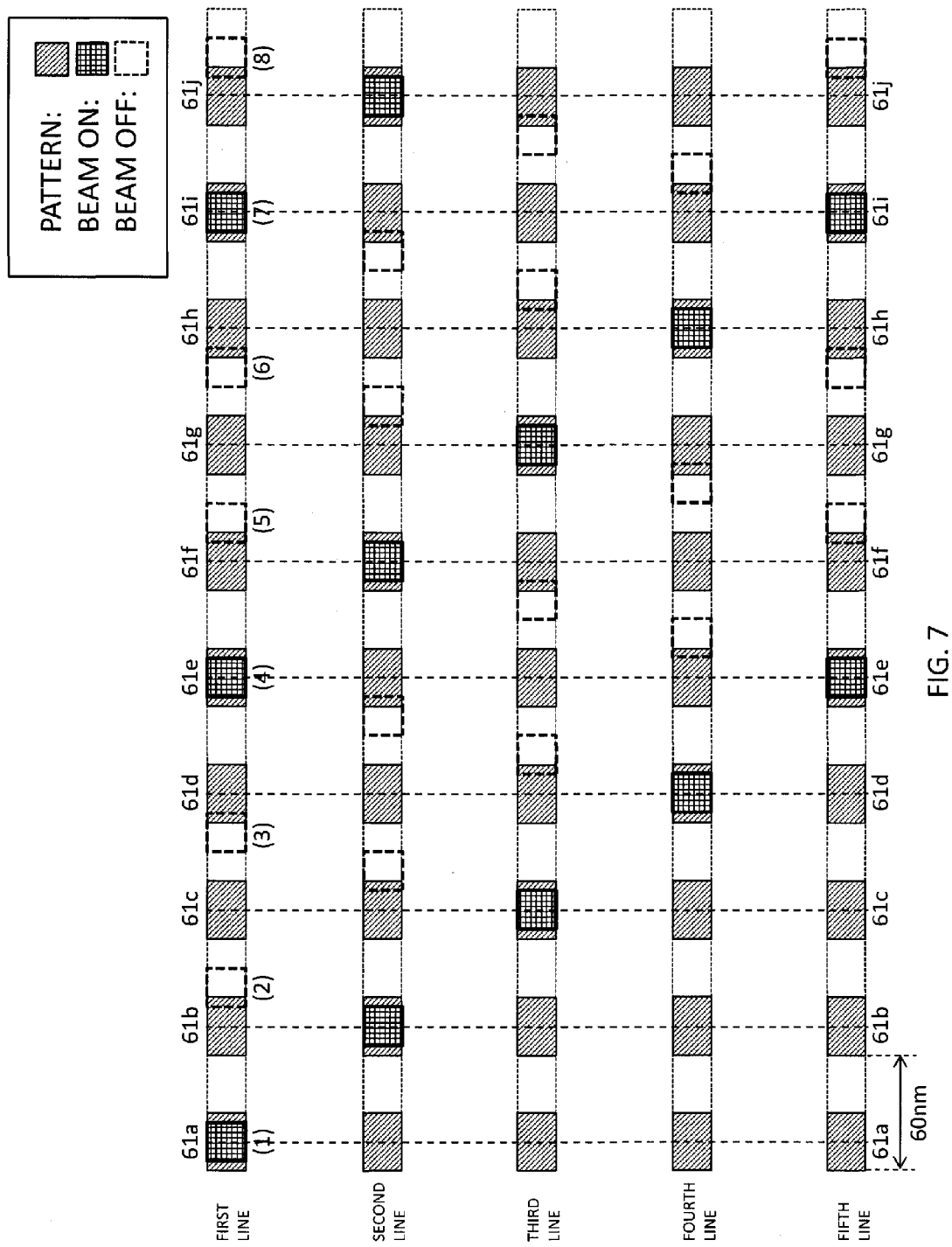
[FIG. 7] View for explaining drawing of a 30 nm line and space pattern.

With reference to FIG. 7, there will be described a method for drawing a pattern having a straight line in the Y direction and repetition of a line of 30 nm and a space of 30 nm (a 30 nm line and space) in the X direction, with the use of a square lattice matrix beam group, which is a 20 nm size and 80 nm pitch mesh. In the drawing, 61*a*, 61*b* to 61*j* denote a line and space pattern in this example.

In general, when using a square lattice matrix beam of 80 nm pitch, assuming that the line and space to be drawn is T, a least common multiple of pitch 80 nm of the square lattice matrix beam and T=60 nm is obtained, which is, in this case, 240 nm.

As, in the original square lattice matrix beam of 80 nm pitch, a beam is also present at a location from a distance of 240 nm from the start point, this beam of a distance of 240 nm can be used in the ON state when drawing the 30 nm line and space in the X direction.

The beams at (1), (4), and (7) in the first line in FIG. 7 may be turned ON simultaneously when drawing the 30 nm line and space. The position of the 30 nm line and space to be drawn is obtained by shifting the 80 nm pitch square lattice matrix beam by 5 nm in the right direction by the main deflector and also increasing the exposure amount such that the 20 nm line width is increased to obtain a 30 nm line width. Alternatively, it is also possible to shift the beams at (1), (4), and (7) slightly and divide the exposure amount into two so that the beams can be divided into two shots with the center of gravity being located at the center of the 30 nm line and space to be drawn.

However, the beams at (2) and (3) used for drawing the normal 20 nm mesh are turned OFF, as indicated by dotted lines in this drawing.

Similarly, in the second line, drawing is performed by shifting the beams at (1), (4), and (7) by 65 nm.

Similarly, in the third line, drawing is performed by shifting the beams at (1), (4), and (7) by 135 nm.

Similarly, in the fourth line, drawing is performed by shifting the beams at (1), (4), and (7) by 195 nm.

While, in the fifth line, drawing should be performed by shifting the beams at (1), (4), and (7) by 245 nm, as the beams to be drawn are turned on in the first line, drawing in the fifth line is not necessary.

As it is necessary to perform drawing with the same deflector data in the Y direction, the number of shots is compared only in the X direction. Specifically, while drawing can be achieved by four shots with the movement of the sub deflectors in the case of fill-in, drawing can be achieved by four shots with the movement of the main deflector in the case of line and space. While, as it can be assumed that the shot time is somewhat extended because of a long waiting time of the deflector, relative speedup cannot be achieved, the drawing speed is not decreased significantly.

Figure 8:
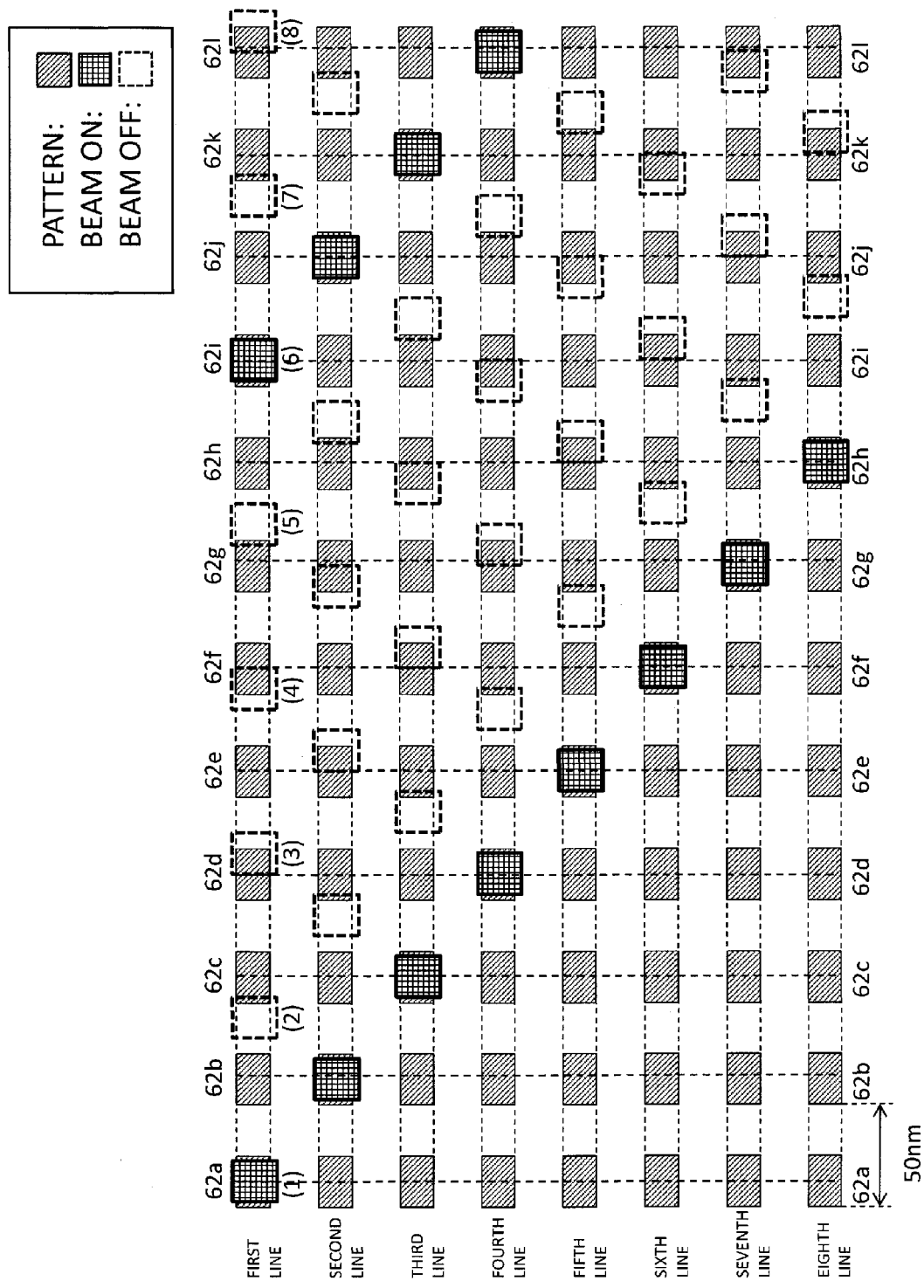
[FIG. 8] View for explaining drawing of a 25 nm line and space pattern.

With reference to FIG. 8, a method for drawing a pattern having a line in the Y direction and 25 nm line and space in the X direction with the use of a square lattice matrix beam group, which is a 20 nm size and 80 nm pitch mesh, will be described. In the drawing, 62*a*, 62*b* to 62*l* denote a line and space pattern in this example.

As the least common multiple of 80 nm and 50 nm is 400 nm, the beams at (1) and (6) can be emitted simultaneously to thereby achieve drawing. Consequently, shots in the first, second, third, fourth, fifth, sixth, seventh, and eights lines are necessary and shots in the ninth line are not necessary. In this case, while eight shots are necessary in this case whereas four shots are necessary in the case of fill-in, the efficiency does not deteriorate significantly despite a decrease in the drawing speed.

As described above, even when the pitch of pattern data does not match the 80 nm pitch of the square lattice matrix beam held by the hardware, it is possible, to a certain degree, to avoid a reduction in the throughput so that a significant increase in the number of shots does not occur, by effectively modifying the lithography method.

However, when the least common multiple with 80 nm is extremely great, as the number of beams that can contribute to drawing simultaneously is significantly small, the number of shots for the entire pattern is enormous.

For example, in the case of a square lattice matrix beam in which the basic beam size is 20 nm, when the basic mesh of the pattern to be drawn is 21 nm, 23 nm, or 19 nm, and the like, which is relatively prime in relation to 20 nm, the least common multiple is an enormous value. This means that the number of beams that can be used simultaneously is significantly small, such as one-twentieth to one-fortieth of 1600 or less, which significantly lowers the efficiency as the multi-beam.

For example, in the case of the PSB beams formed of 40 beams arranged in each of vertical and horizontal directions at a pitch of 80 nm, which is four times as large as 20 nm, when the device pattern to be drawn has only a lithographic pattern with a pitch of 1600 nm, only 9 shots of beam irradiation can be used. In this case, as only 9/1600 shots contribute to beam irradiation, the efficiency is extremely low.

It is therefore necessary that, in the design rule of device patterns, the pattern mesh size should not necessarily be larger than a predetermined value.

In this case, it is desirable to change the pattern rule of the corresponding region to the extent possible to locally relax or tighten the pattern rule such that the least common multiple with 20 nm does not exceed a predetermined value to thereby correct the pattern data within a range in which the speed and area of the device are not significantly deteriorated and the function of the device is not adversely affected, so as to achieve a goal of obtaining modified pattern data for which the least common multiple with 20 nm is appropriately small and the number of beams of the multi-beam that can be used simultaneously can be increased.

In this manner, it is possible to use the multi-beam efficiently to reduce the number of shots, thereby contributing to an increase in the throughput of lithography.

Figure 9:
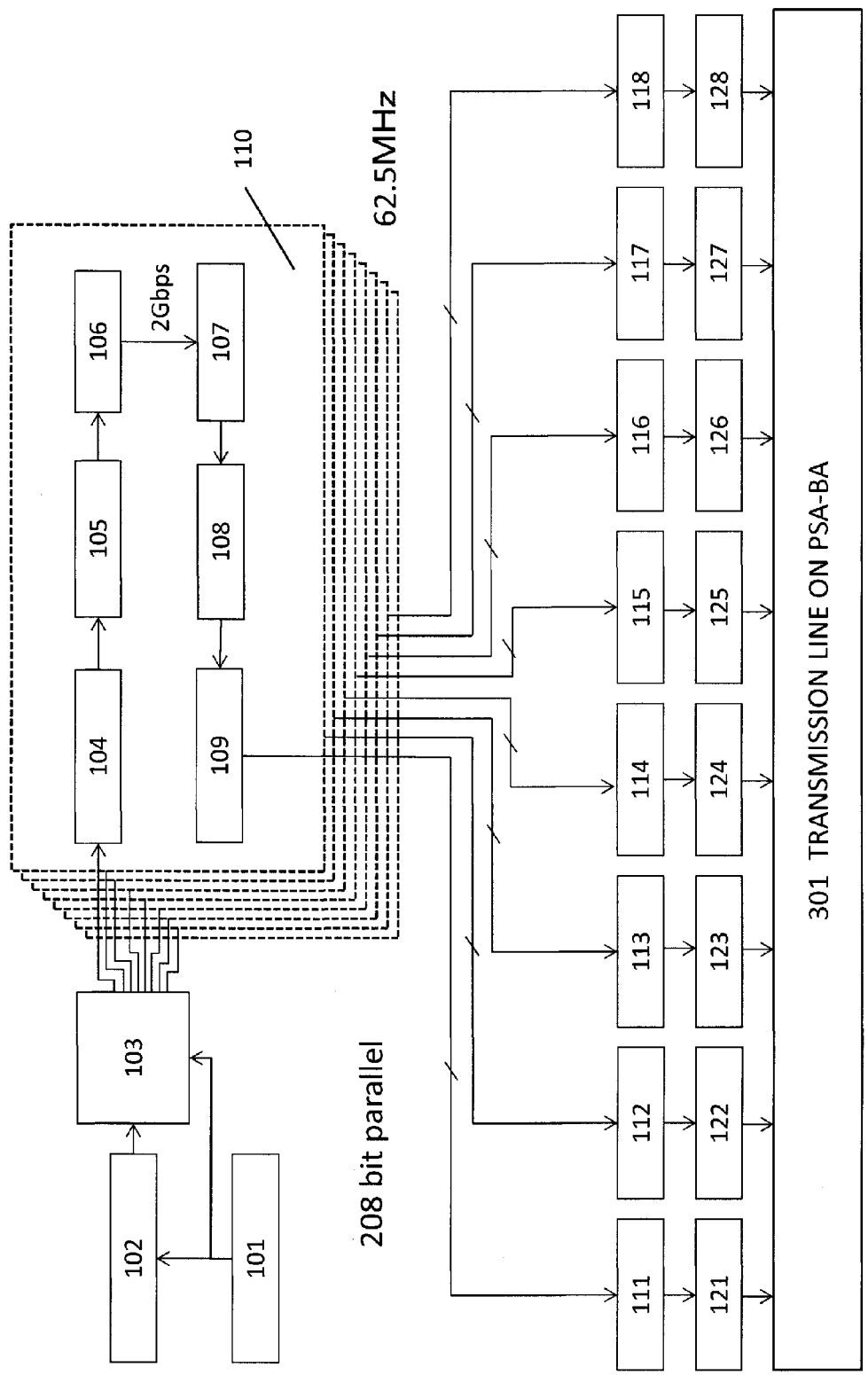
[FIG. 9] View illustrating a method of transferring bitmap data.

FIG. 9 illustrates a circuit for transmitting bitmap data (e.g., bitmap data formed of 1's and 0's in the number of 1600) of a whole square lattice matrix beam to a PSA-BA substrate as a signal.

The lithographic data of all the semiconductor device chips on a wafer can be divided into bitmap data according to a square lattice matrix for each predetermined size S and drawing position coordinate data of the whole beam matrix, on the condition that a plurality of beam sizes S are allowed.

First, all the lithographic pattern data are divided into the bitmap data and the drawing position coordinate data described above, which are then stored in a storage device 102. In the description with reference to FIG. 9, only the method for transmitting the bitmap data will be described.

The bitmap data are read from the storage device 102 according to a signal from a lithography sequence control circuit 101 and transferred, via a data sorting device 103, to a serializer 104, where the data are transformed into a serial bit string which is to be transmitted at high speed. A signal from the serializer 104 is introduced to a laser 106 via a driver 105, in the case of optical transmission. In this case, a laser transmission circuit performs high-speed transmission at a rate of 2 Gbps to 10 Gbps.

Light is received at a photodiode 107 and converted to a voltage signal via an amplifier 108. Thereafter, a deserializer 109 transmits the data to eight registers, which are registers 111 to 118, in parallel. The register length of each of the registers 111 to 118 is 208 bit. Further, the speed of the deserializer 109 is 62.5 MHz. Also, the signal of each of the registers 111 to 118 is amplified by corresponding one of amplifiers 121 to 128 and output.

The total bitmap of 1600 bit from the eight registers is stored. As the whole bitmap is consumed for lithography at the maximum drawing frequency of 10 MHz during lithography, it is necessary to provide a circuit 110 including from the serializer to the deserializer in parallel in a number which is at least 8 or more.

This degree of parallelism can be decreased if the optical transmission device; i.e., the device around a laser, is a high-speed device.

Further, while in the above description of FIG. 9, there is described a configuration in which a serializer and a deserializer based on optical transmission are used, the optical transmission portion may be replaced with an electric transmission circuit. Here, it is intended to reduce the number of data signals by using the serializer and the deserializer and to perform high-speed processing in the intermediate portion of data transmission.

The data from the registers are subjected to voltage amplification through the amplifier circuits and connected to a signal wiring line to the PSA-BA substrate.

Figure 10:
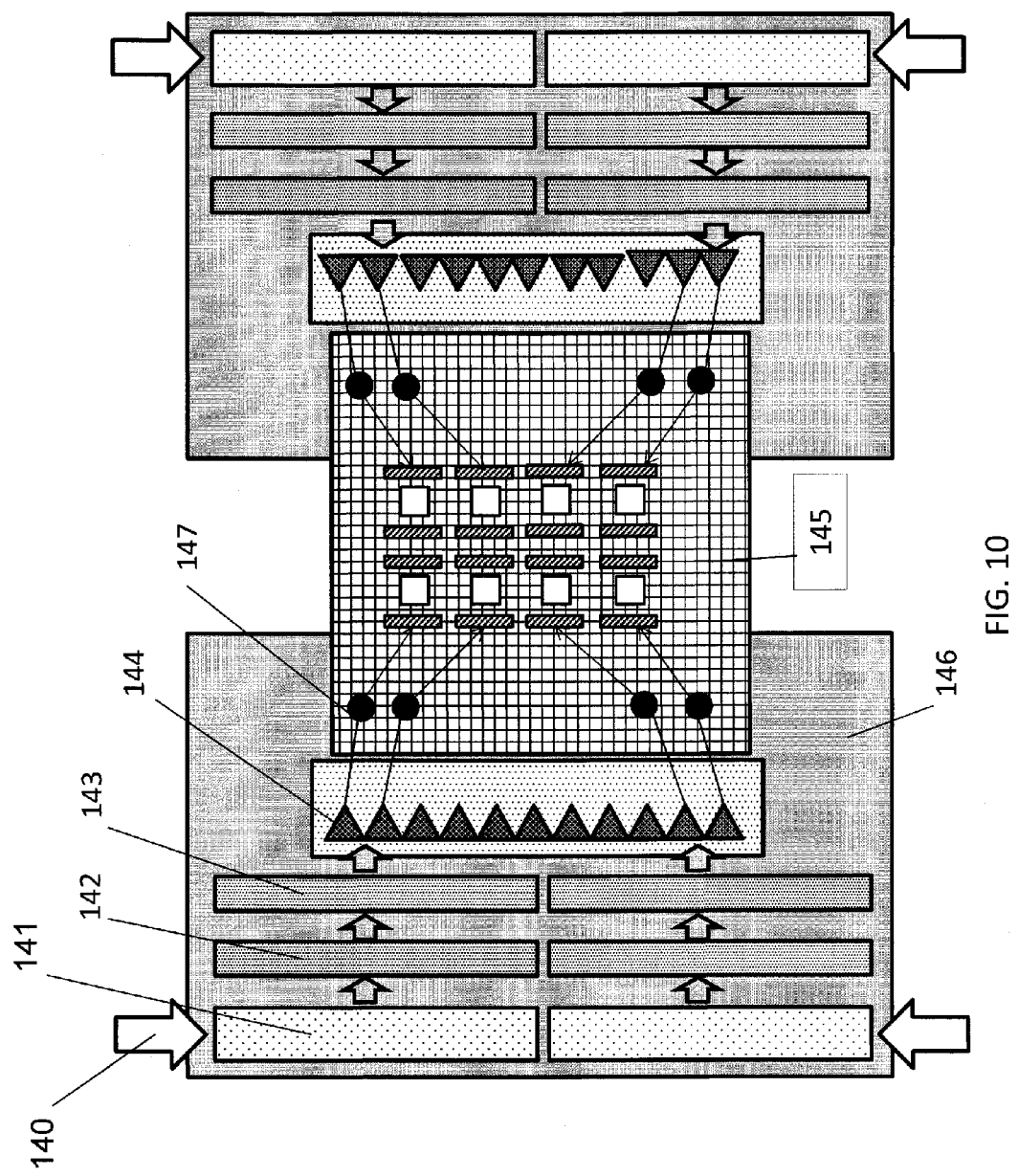
[FIG. 10] View for explaining a flow of bitmap data to a PSA-BBA (Programmable Shaping Aperture Blanker Array) substrate.

FIG. 10 is a view illustrating connection from an optical data serial parallel transmission circuit 141, through registers 142 and 143 and amplifiers, to a wiring line of the PSA-BA (Programmable Shaping Aperture-Blanker Array) substrate. In this example, two stages of registers, the register 142 and the register 142, are used because, even if the latch timing does not match for some of the registers, by latching all the registers simultaneously, the timing for the 1600 beams can be substantially matched except for a small amount of wiring delay.

Assuming that an output of the register 143 is an input of an amplifier 144, the amplifier output when the bit map is <1>; i.e., beam ON, is 0V and the opposing electrode is 0V, and therefore the beam is ON. When the bit map is <0>; i.e., beam OFF, the output of the amplifier 144 is +5V and the opposing electrode is 0V, and therefore the beam is OFF.

FIG. 10 illustrates the PSA-BA substrate and mounting of various functional devices, which corresponds to one column in the multi-column structure.

One group of PSA is formed for each column element. The PSA is configured, from the outer peripheral portion toward the center of the PSA, to include the optical data communication circuit 141 including an optical fiber 140 and a photodetector in the outer peripheral portion. The optical data communication circuit is mainly formed of an optical compound semiconductor.

The registers 142 and 143 concerning serial/parallel data conversion are formed of Si bare chips. These registers may be configured in two or three stages. The amplifier 144 for driving the individual blanker of the PSA is formed of an Si bare chip.

The substrate of the BAA main body (PSA-BA substrate) 145 is mainly formed of SiC, a heavy metal film, and a thermal conductive metal film.

The above-described four elements are mounted on a separate substrate 146 which is made of ceramic, for example, and wiring lines are formed thereon and bonded with an array of ball grids 147 or pads are attached on the substrate for wire bonding.

Further, the registers 142 and 143, and the amplifiers 144, which are formed on the same semiconductor substrate, may be formed integrally.

In this example, the PSA-BA substrate is formed with copper wiring lines on an SiC substrate. The insulating film is mainly a high-resistance SiC, amorphous SiC, high-resistance Si, or amorphous Si.

The amplifier region board is an Si substrate which is formed by a CMOS process. The registers 142 and 143 are also Si substrates and are formed by a CMOS process. The optical data communication serial parallel transmission circuit is often formed of a III-V optical semiconductor including GaAs, and it is rare that these substrates and processes are completely identical. In such a case, various substrates that are cut are bonded to a substrate made of ceramic or epoxy, and line connection by means of a ball grid array or line connection by means of substrate through-holes is used. Alternatively, wire bonding or the like may also be used, though it is labor intensive.

Concerning these PSA-BA substrates and the various devices, it is important to secure temperature stability by causing these substrate and devices to thermally contact an appropriate cooling substrate to perform cooling while paying attention to electric insulation.

In order to avoid charge-up from the beams near the beam axis of the PSA-BA substrate or all the optical transmission devices and an electric breakdown caused by beam irradiation, it is important to limit the range of scattering beams only to the vicinity of the center of the PSA-BA substrate.

Here, the materials of the respective devices are replaceable so long as they satisfy their functions.

FIG. 11 illustrates behavior of the whole square lattice matrix beam for drawing a random wiring pattern.

The wiring pattern to be drawn corresponds to a gray region, and the inside of the bordered portion corresponds to a region that needs to be filled in. Among the square lattice matrix beams, the bitmap data of the individual element beams inside the fill-in region are ON, and the bitmap data of the individual element beams outside the fill-in region are OFF.

The beam is scanned by the sub deflector vertically and horizontally at a pitch of 20 nm, and, with the whole blanker being turned ON in a stabilized state, drawing is performed. In general, it is possible to draw any pattern with 16 shots. The beam scanning method is not raster scanning, and deflection to an adjacent shot position is performed by vector scanning. Further, the scanning waveform is a step shape, and the whole blanker is turned OFF at the rise of the scanning waveform. After the scanning waveform is stabilized to a fixed value, the whole blanker is released and exposure is performed.

With the beam arrangement illustrated in FIG. 11, after the first shot is emitted by the sub deflector toward a position of X=−40 nm and Y=+20 nm, the whole blanker is turned OFF and the bitmap data are rewritten, and with the beam being deflected to the position of X=−20 nm and Y=+20 nm by the sub deflector, the blanking is released to perform drawing with the second shot.

Similarly, the third shot is emitted to a position of X=0 nm and Y=+20 nm by the sub deflector, after rewriting the bitmap data.

The fourth shot is emitted to a position of X=+20 nm and Y=+20 nm.

The fifth shot is emitted to a position of X=+20 nm and Y=+0 nm.

The sixth shot is emitted to a position of X=0 nm and Y=0 nm.

The seventh shot is emitted to a position of X=−20 nm and Y=0 nm.

The eighth shot is emitted to a position of X=−40 nm and Y=0 nm.

The ninth shot is emitted to a position of X=−40 nm and Y=20 nm.

The tenth shot is emitted to a position of X=−20 nm and Y=−20 nm.

The eleventh shot is emitted to a position of X=0 nm and Y=−20 nm.

The twelfth shot is emitted to a position of X=+20 nm and Y=−20 nm.

The thirteenth shot is emitted to a position of X=+20 nm and Y=−40 nm.

The fourteenth shot is emitted to a position of X=0 nm and Y=−40 nm.

The fifteenth shot is emitted to a position of X=−20 nm and Y=−40 nm.

The sixteenth shot is emitted to a position of X=−40 nm and Y=−40 nm.

The normal deflection range of the sub deflector is, with the beam size matched, X=±40 and Y=±40, which is a rectangular region of 80 nm as a whole, and one fill-in scanning is completed with 16 shots. However, deflection to a desired position by the sub deflector is possible so long as the scanning is vector scanning and the deflection range falls within X=±40 and Y=±40. A normal pattern is completed with exposure of 16 shots.

Subsequently, after deflecting the main deflector in the +X direction by 3.2 μm, drawing is performed with 16 shots by using the sub deflector once again. While this is repeated and the stage is moved in the Y direction, square regions of 3.2 μm are drawn in the number of 16 in the X direction in a deflecting manner with a width of 51.2 μm. Once drawing in one line in the X direction is completed, the main deflector is reset toward the moving direction of the 3.2 μm stage in the Y direction, and drawing in the X direction is repeated once again.

Thereafter, with the deflection voltage of the main deflector changed to the +X direction, the main deflector jumps in the adjacent +X direction, for example, by 3.2 μm, and drawing of 3.2 μm square is similarly performed with respect to a new drawing region.

Concerning the stage position, a method of stage position tracking is performed so as to perform deflection control of the beam at the same location on a specimen surface in such a manner as if the stage is not actually moved, by reading a value of the stage position from the laser interferometer and adding to the main deflector a difference with respect to an ideal position.

In this example, the stage is moved in the Y direction.

The position of the stage mounted on a wafer to be exposed in the X-axis direction and the Y-axis direction is read by the laser interferometer at about 10 MHz.

A difference between the target lithographic position and the position read by the laser interferometer is added to the main deflector to track the stage position, so that drawing is performed as if the wafer to be exposed is stationary with respect to the beam.

The scan width in the X direction is 51.2 μm, and, with exposure of 3.2 μm square 16 times, one line exposure in the X direction is completed.

At this time, it can be said that a frame having a frame width of 51.2 μm is exposed in the Y direction.

In the X direction, a stripe having a width from −25.6 μm to +25.6 μm is drawn. The center of the main deflector deflects the beam to 16 locations at −24 μm, −20.8 μm, −17.6 μm, −14.4 μm, −11.2 μm, −8 μm, −4.8 μm, −1.6 μm, 1.6 μm, 4.8 μm, 8 μm, 11.2 μm, 14.4 μm, 17.6 μm, 20.8 μm, and 24 μm.

While FIG. 11 illustrates an example in which the size of each individual beam is 20 nm, the individual beam size may be 16 nm, 12 nm, 8 nm, or 4 nm in this drawing.

In such a case, in order to prevent a reduction in throughput, it is necessary to increase the number of element beams of a square lattice matrix to thereby maintain the whole electronic beam amount to substantially a fixed value.

Figure 12:
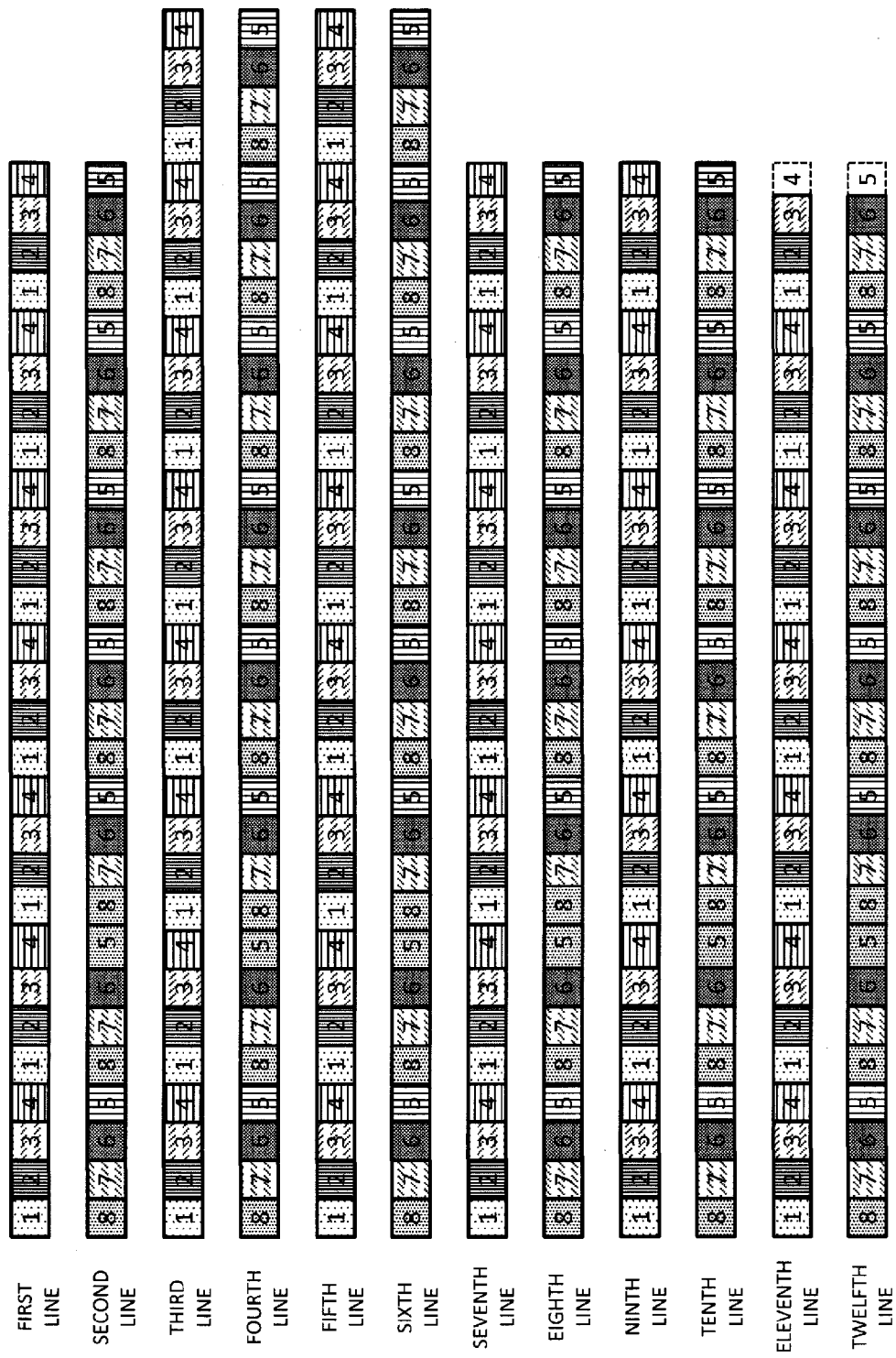
[FIG. 12] View for explaining drawing of line and space.

FIG. 12 will next be described. The pattern to be drawn is a 1:1 line and space which is horizontally long.

Concerning the square lattice matrix beam, as illustrated in the left end portion of the drawing, there is formed a bitmap in which 7 consecutive beams are ON in the first line, 8 consecutive beams are ON in the third line, 8 consecutive beams are ON in the fifth line, 7 consecutive beams are ON in the seventh, ninth, and eleventh lines, and other adjacent beams are OFF.

First, with the whole blanker being cut, the individual element beams are turned ON/OFF in accordance with the bitmap described above and the main deflector and the sub deflector are deflected to predetermined positions in a vector scanning manner. Then, the whole blanker is released and a beam group denoted by number 1 is exposed.

Next, the whole blanker is operated to cut the beams, and the bitmap for a new beam group of number 2 is loaded. However, in FIG. 12, the bitmaps for numbers 1, 2, 3, 4, 5, 6, 7, and 8 are completely the same within the range which is illustrated. It is possible to register the same bitmap as a new bitmap and to reload it.

However, there may be adopted a method in which, concerning the completely identical bitmap, a new bitmap is not loaded. Such an arrangement is one of the methods of data compression. Here, all the bitmaps for 1600 bits corresponding to the number of elements are not always the same, and unless all the bitmaps match, even if only a portion of the bitmaps are the same, the data compression method becomes complicated and the whole data amount increases, which may conversely make it impossible to achieve the true target of data compression. Accordingly, as effective data compression, a compression method in which, if bitmaps for approximately 100 bits, which is obtained by dividing 1600 bits by 16, match, the immediately previous data are used may be effective.

After loading the bitmap for number 2, the sub deflector is moved in the X direction by +20 nm and the whole blanker is released to perform exposure with the square lattice matrix beam. When the exposure time is terminated, the whole blanker is operated to cut the beams.

Beam exposure for numbers 3 and 4 is performed in a similar manner. As a result, line drawing in the first, third, fifth, seventh, ninth, and eleventh lines is completed.

After completion of exposure of the beams denoted by number 4, the sub deflector is moved in the Y direction by −40 nm. Then, exposure is performed with the beams of number 5, and subsequently, exposure with the beams of numbers 6, 7, and 8 is performed with the sub deflector being moved in the X direction by −20 nm each time, thereby completing line drawing in the second, fourth, sixth, eighth, tenth, and twelfth lines.

For the 1:1 line and space pattern illustrated in FIG. 12, the whole exposure is completed with 8 shots by using vector scanning. When compared to the all region fill-in pattern, which requires drawing with 16 shots, only half the drawing time is necessary.

Figure 13:
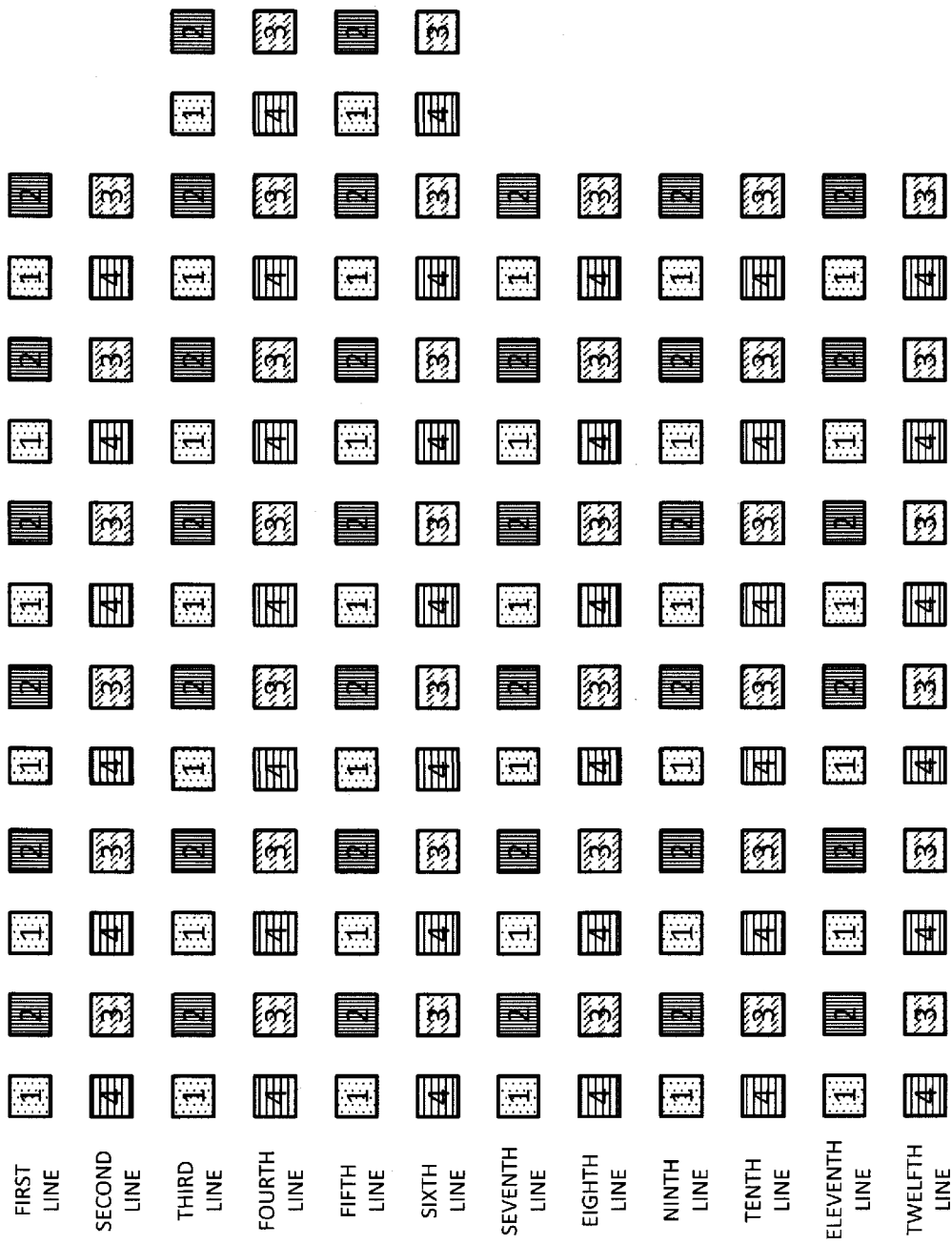
[FIG. 13] View for explaining drawing of a whole array.

With reference to FIG. 13, drawing of a pattern in which a hole and a space is arranged in 1:1 will be described.

In the square lattice matrix beams, beams are ON in the bitmaps concerning the consecutive beams from (1,1) to (1,6) in the first line, the consecutive beams from (2,1) to (2,7) in the third line, the consecutive beams from (3,1) to (3,7) in the fifth line, the consecutive beams from (4,1) to (4,6) in the seventh line, the consecutive beams from (5,1) to (5,6) in the ninth line, and the consecutive beams from (6,1) to (6,6) in the eleventh line.

First, in a state in which the sub deflector is at a hole of number 1, the whole blanker is released to perform exposure irradiation of the beam. After the whole blanker turns the beam into an OFF state, the sub deflector is moved in the X direction by +40 nm, and a hole of number 2 is exposed. Then, after the whole blanker turns the beam into the OFF state, the sub deflector is moved in the Y direction by −40 nm, and a hole of number 3 is exposed. Further, after the whole blanker turns the beam into the OFF state, the sub deflector is moved in the X direction by −40 nm, and a hole of number 4 is exposed.

As described above, because, in drawing a pattern of 1:1 hole and space, the 3.2 μm square region can be drawn with 4 shots, only the exposure time, which is 0.25 times as long as the exposure time for drawing a complete fill-in pattern which requires 16 shots, is necessary. It is therefore highly likely that the throughput is 4 times.

Figure 14:
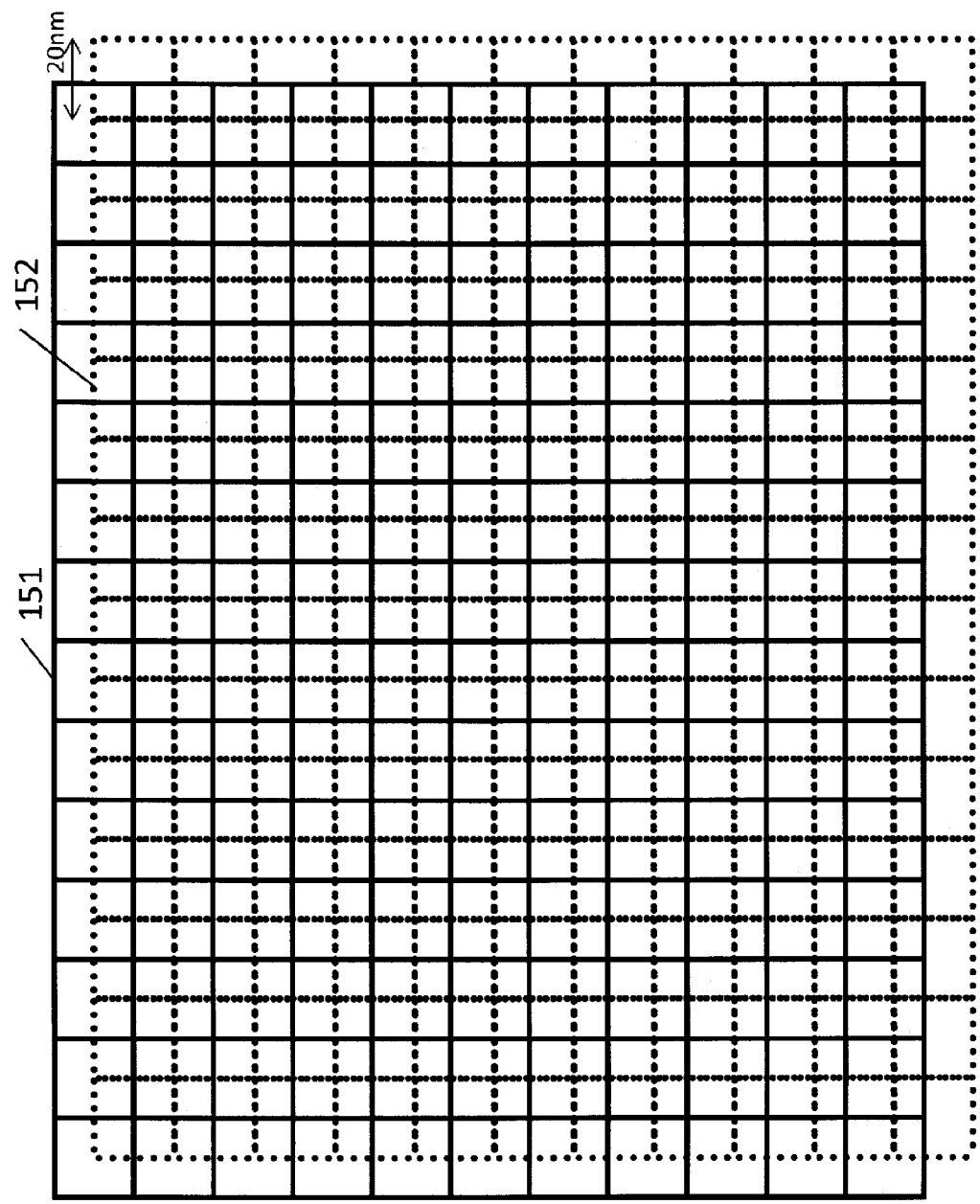
[FIG. 14] View for explaining a case in which a first pattern mesh and a second pattern mesh having the same mesh size of 20 nm are shifted from each other by 10 nm in the X direction and the Y direction.

FIG. 14 illustrates a view of a lattice when mesh shift occurs. Specifically, there are often cases in which a square lattice matrix of a 20 nm mesh is rough. However, as vector deflection can be achieved by a deflector even with square lattice matrix beams having a beam arrangement with an 80 nm pitch, which is 4 times 20 nm, it is also possible to perform drawing with lattice points that are shifted with respect to the mesh 151 indicated by solid lines by 10 nm in the vertical and horizontal directions, as indicated by a mesh 152 in dotted lines. Beams shifted in other manners may also be used for drawing. As such, by allowing a certain degree of increase in the number of shots, mesh patterns that are shifted in various manners can be drawn in the same region.

Figure 15:
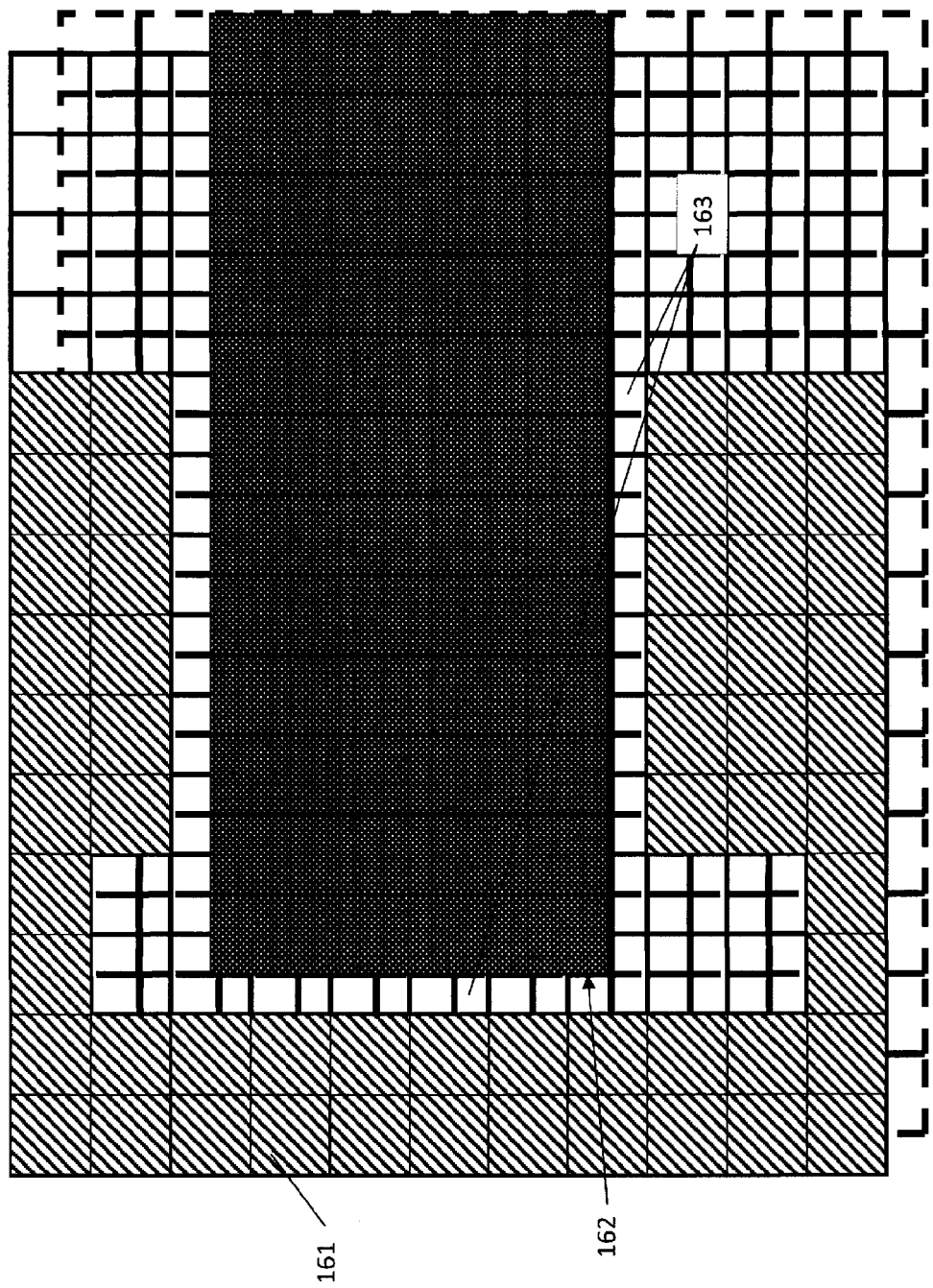
[FIG. 15] View for explaining a case in which a first pattern is drawn in the first pattern mesh of FIG. 14 and a second pattern is drawn on the second pattern and these patterns are shifted from each other by 10 nm in the X direction and the Y direction.

FIG. 15 illustrates an example in which drawing is performed with a mesh being shifted. In FIG. 15, the ON/OFF pattern is defined by bitmap data with respect to the mesh of FIG. 14, to form pattern data. A first pattern 161 is drawn by using an ON/OFF bitmap with respect to the mesh of 20 nm. A second pattern 162 is drawn by using an ON/OFF bitmap with respect to a mesh which has been shifted in the X direction and the Y direction by 10 nm, respectively. Therefore, a space 163 between the first and second patterns is 10 nm. FIG. 15 further indicates that patterns having different meshes can be drawn in the same region with the use of the same square lattice matrix beams.

Figure 16:
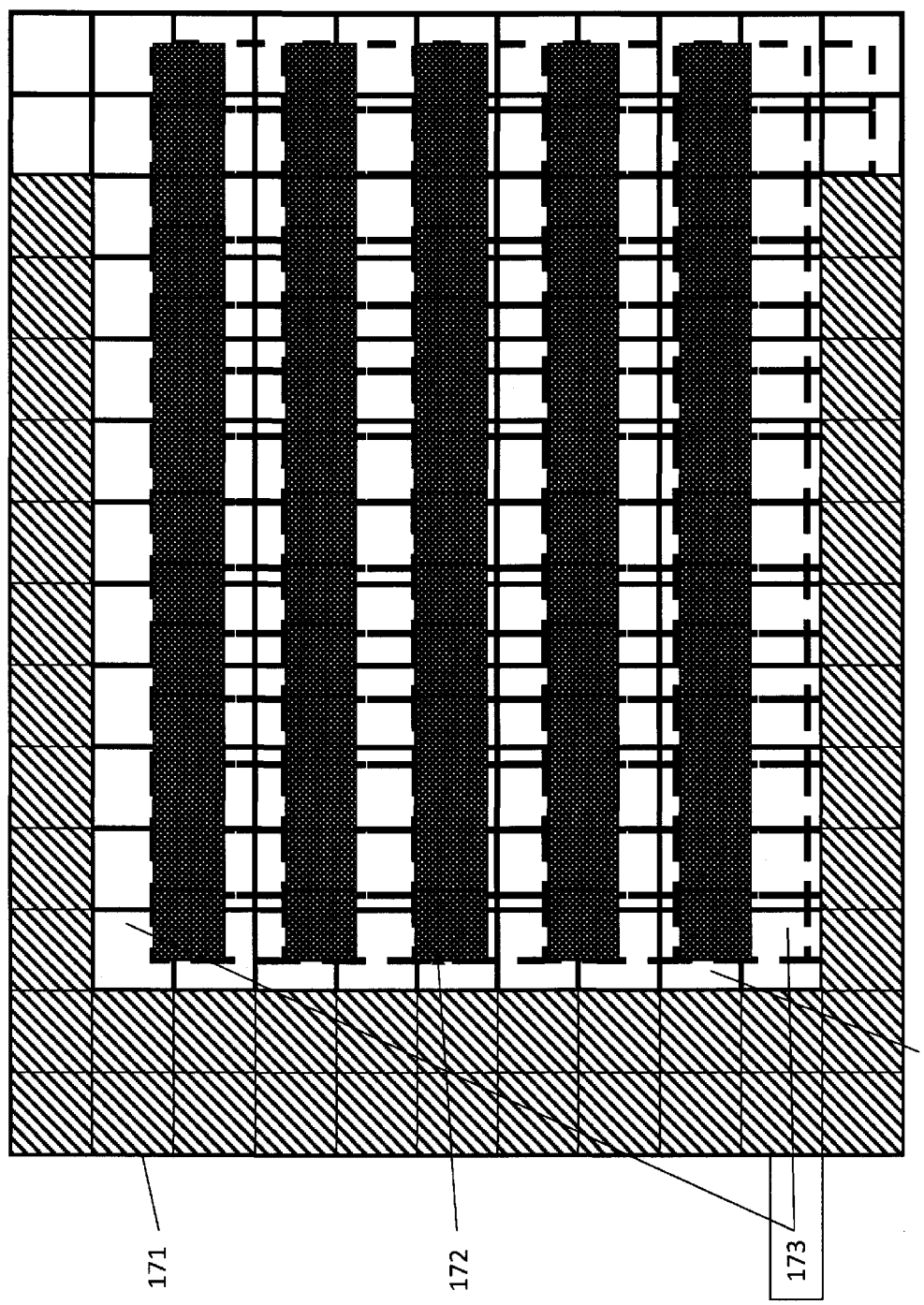
[FIG. 16] View for explaining that a first pattern is drawn on a first pattern mesh of 20 nm and a second pattern is drawn in a second pattern mesh of 16 nm, with a gap between the first and second patterns being 8 nm to 16 nm.

FIG. 16 illustrates an example pattern 2 formed by shifting a mesh. A pattern 171 is a pattern of the 20 nm mesh. A pattern 172 is a pattern which is drawn with the exposure amount being reduced while moving the sub deflector forward by 16 nm. As a result, there can be drawn a pattern in which a space 173 of 16 nm is provided on each of above and below the five horizontal lines. Here, a space 174 is located to each of right and left sides of the horizontal lines.

Figure 17:
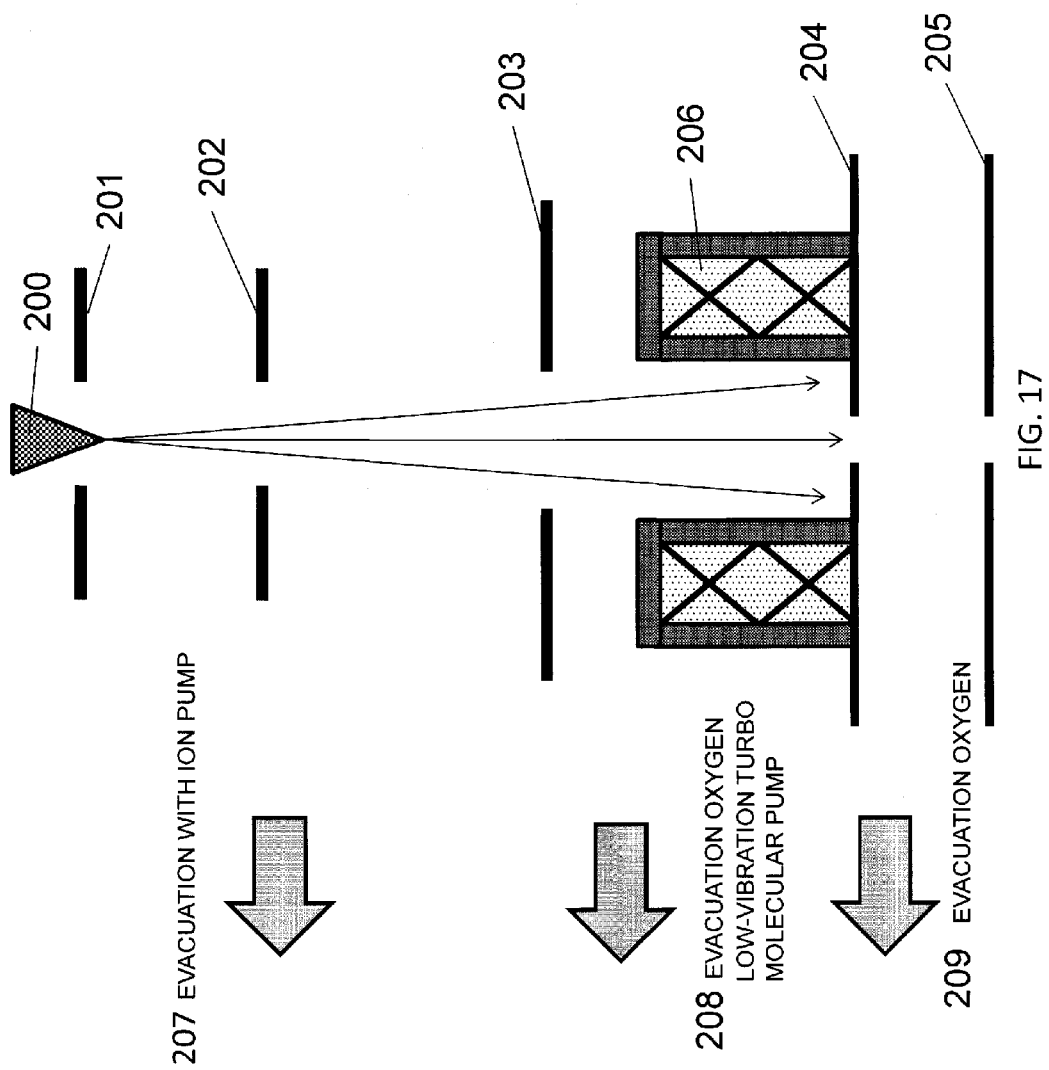
[FIG. 17] View for explaining an electron gun section.

FIG. 17 explains the structure around the electron gun used in the present system. A cathode electrode 200 is a thermal field emission (TFE) electron gun which is designed to enable uniform irradiation of electrons from a tip portion.

The TFT electron gun applies to an extraction electrode 202 a voltage which is positive with respect to the cathode electrode 200 to thereby extract electrons. A negative potential of about −50 KV is generally applied to the cathode electrode 200. The potential of the extraction electrode 202 is −45 KV to −40 KV. Reference numeral 201 denotes a suppressor.

Further, the electrons are accelerated by an anode electrode 203 (potential 0V). In the lower portion of an electron optical column, ozone is made to flow to clean the interior of the column. As the ozone concentration is normally from 10 to 20%, 90% to 80% oxygen is flowing. In order to prevent the oxygen and ozone from adhering to LaB6 on the surface of the electron gun or oxidizing to become a cause of deterioration, intermediate spaces 208 and 209 are evacuated with a turbo molecular pump and the like by using double orifices 204 and 205 so that the degree of vacuum rapidly improves toward the electron gun. As the orifice is a small hole having a diameter of about 100 μm, in order to allow the electrons to pass through the two orifices easily, it is necessary to deflect the electron beam with double alignment coils 206 near the anode electrode to allow the electron beam to pass through the orifices. The turbo molecular pump, which is likely to vibrate, is desirably provided with a vibration isolation function or a vibration correction function.

An electron gun chamber 207 storing the cathode electrode and the extraction electrode is evacuated with an ion pump or a turbo molecular pump.

Figure 18:
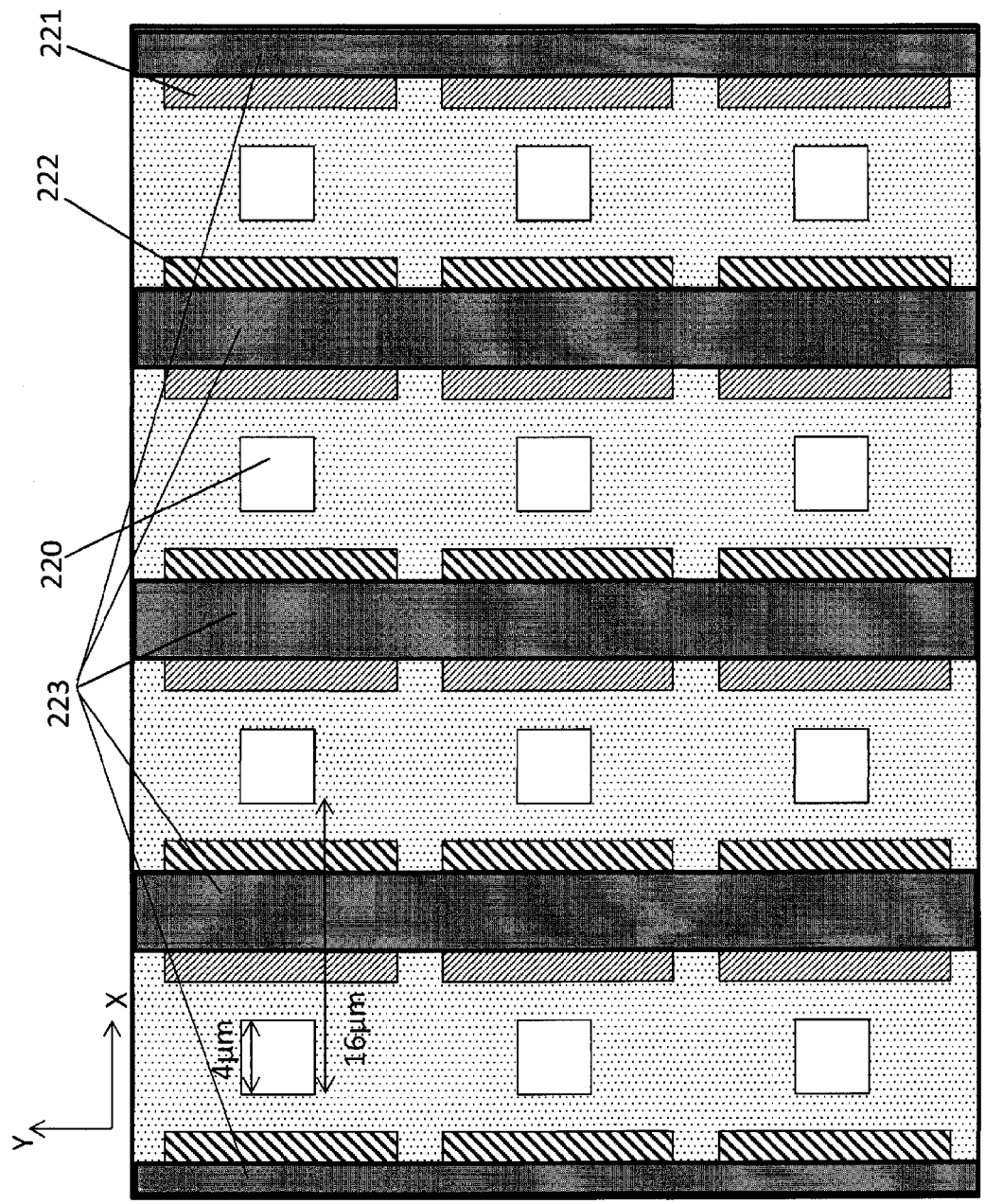
[FIG. 18] Plan view of a PSA-BA substrate.

With reference to FIG. 18, core technology of the PSA-BA substrate described above will be described. A means for forming a square lattice matrix beam group will be described.

An electron shielding plate is irradiated with a uniform electron beam. The beam is shaped in an aperture 220 having a shape of a 4 μm square, so that a beam having a square cross section of 4 μm is emitted. The apertures 220 having a shape of a 4 μm square are arranged with a pitch of 16 μm to form a square matrix. Specifically, the apertures 220 are arranged with 16 μm pitches in the X-axis direction (horizontal direction) and arranged with 16 μm pitches in the Y-axis direction (vertical direction). The X-axis direction and the Y-axis direction are orthogonal to each other.

A pair of two electrodes 221 and 222 of an individual blanker are provided on the respective sides of a passing axis of the 4 μm beam. The pairs of two electrodes 221 and 222 of the individual blanker are arranged such that all the individual element beams are disposed between the two electrodes 221 and 222.

While in FIG. 18, all the electrode groups are arranged in the same direction to form parallel electrode groups, they may be arranged in different directions, so long as the beam can be deflected individually. Further, the dimension of 4 μm may be a different value.

Figure 19:
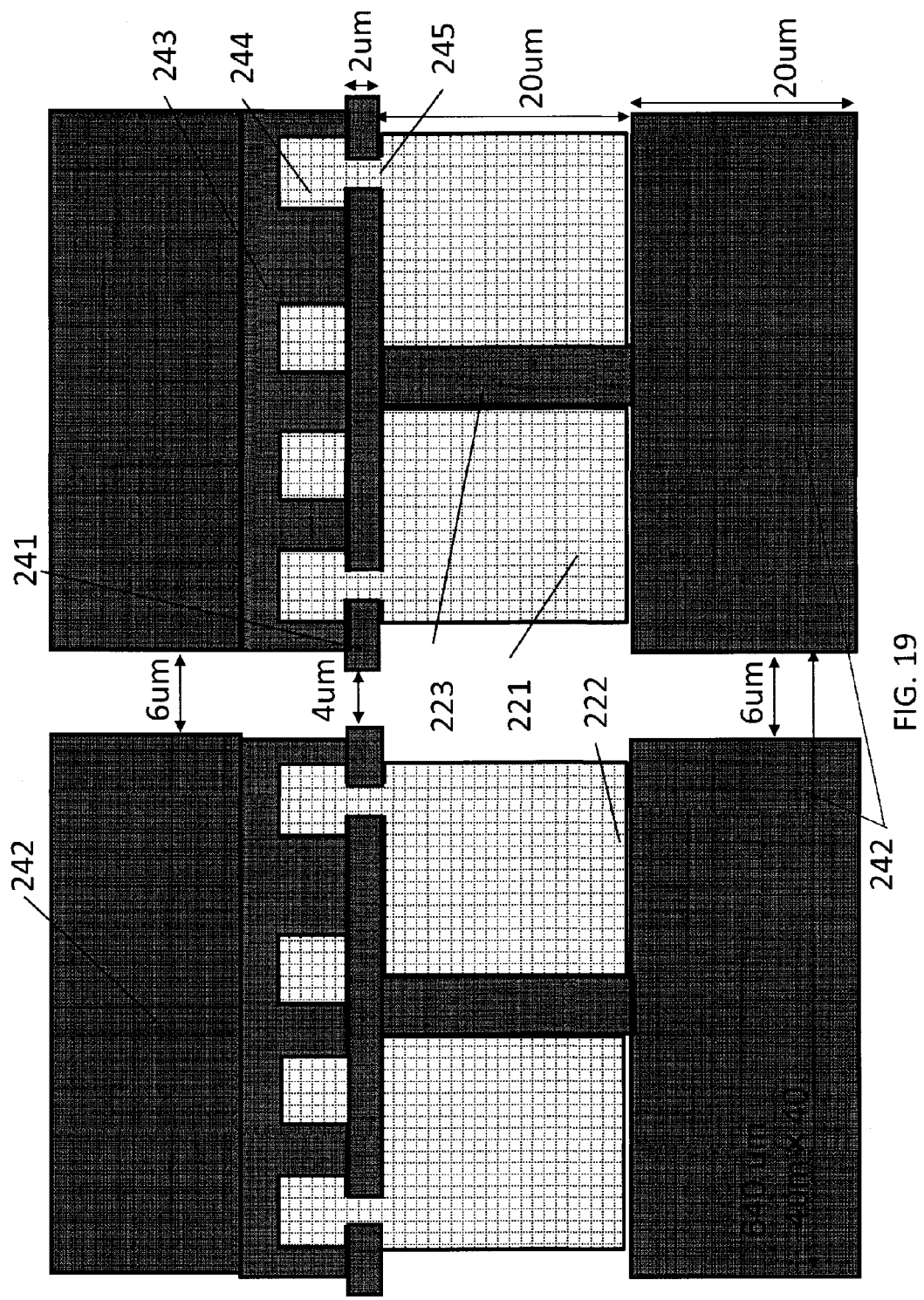
[FIG. 19] Cross sectional view of a PSA-BA substrate, which explains shaping of a beam and the structure of an individual blanker.

With reference to FIG. 19, cross sectional technology of the PSA-BA substrate will be described. The PSA-BA substrate has a function of shaping and deflecting a beam emitted from the above in FIG. 19.

On the uppermost portion, there is provided an electron shielding plate 242 made of a metal, a semiconductor, or a semiconductor amorphous substrate. In FIG. 19, the size of a rectangular aperture is 6 μm, because the electron shielding plate 242 of the present embodiment is configured to have a function of not shaping the beam completely and holding the greater part of the electron beam. While, actually, a hole having a size of 4 μm of an electron shielding plate 241 of a semiconductor substrate provided in the center of FIG. 19 takes on a primary function of beam shaping, as the total quantity of heat of electron beam, the electron shielding plate 241 (242) provided in the uppermost portion absorbs about 90% or more of the heat.

The electron shielding plate 242 is formed of an SiC semiconductor, for example, and has a thickness of 10 to 20 μm, for example. SiC has a thermal conductivity which is similar to that of copper.

When the size of the region having a beam aperture is 640 μm square, the heat from the electron gun can escape by providing on the electron shielding plate 242 a heatsink 251 which is a refractory metal plate having a preferable heat conductive property, has a thickness of several hundreds μm to 2 or 3 mm or more, and an aperture of 640 μm square or more.

As described above, by maintaining the temperature of a portion of the electron shielding plate 242 which is larger than the 640 μm square region at room temperature; i.e., about 23° C., the temperature rise of the electron shielding plate 242 made of SiC within the 640 μm square region, which is a whole size of the thin film region of 10 to 20 μm, can be suppressed within a range of 1 to 5° C.

An electric insulating film 243 of a line 244 is formed of an intrinsic semiconductor.

While the electron shielding plate 242 having an aperture of 6 μm square is further provided at the lowermost portion in FIG. 19, as this electron shielding plate 242, a substrate made of a metal or other materials that are general semiconductors with low resistance may be used, unless the electron shielding plate 242 is not in contact with the wiring line region and the electrodes.

If the electron shielding plate 242 is in contact with the wiring line region and the electrodes in FIG. 19, it is necessary to use a semiconductor substrate with high resistance or an amorphous semiconductor as the electron shielding plate 242.

In this case, the electron shielding plate 241 having an aperture of 4 μm square is formed of SiC high-resistive or insulating semiconductor substrate and has a thickness of about 2 μm.

In a semiconductor substrate having a thickness of 2 μm, machining for forming an aperture of a 4 μm square can be performed in a quite precise manner. The aperture of 4 μm square further shapes an edge portion of the electron beam passing through the aperture of 6 μm square. On the upper surface of the electron shielding plate 241, there is formed the wiring line 244 for applying voltage externally from outside of FIG. 19 to electrodes 221 and 222 that are deflection electrodes of the individual blanker. Here, as the wiring line material, copper is used, but other materials can be used so long as they are formed of a refractory metal with low resistance.

The wiring line has a thickness of about 1 μm and a width of 0.5 μm, and a line interval is about 0.1 μm to 0.5 μm. While in this case the electric insulating film 243 of the line portions between the wiring lines 244 and under the wiring lines 244 is formed of amorphous SiC, any other materials that are high-resistive semiconductors and allow insulation of the wiring line 244 can be used.

Vias 245 are formed of copper in the electron shielding plate 241 from the wiring line 244 through through-holes, and a pair of two electrodes 221 and 222 of the individual blanker are formed under the electron shielding plate 241. The pair of two electrodes 221 and 222 of the individual blanker has a thickness of 2 μm and a height of from 20 μm to 100 μm. While the pair of two electrodes 221 and 222 of the individual blanker are exposed in the aperture portion of 4 μm of the electron shielding plate 241 because electrons pass through the aperture portion, the back surfaces of the pair of electrodes 221 and 222 of the individual blanker of the adjacent individual element beam are fixed in a back to back manner via SiC electrode supporting semiconductors 223 so as to maintain a mechanical structural strength. The pair of two electrodes of the individual blanker are formed of copper.

A characteristic feature of the structure illustrated in FIG. 19 is that no insulating substances are used around the apertures of 4 or 6 μm square, through which the individual element beam passes.

In the prior art BAA patent publication (JP 06-132203 B), an insulating substance was used so as to achieve insulation of the wiring line or the like.

A critical defect of the conventional BAA devices is that an insulating film was used to apply voltage to an electrode within a device. An insulating substance used for insulating a wiring line metal film has adverse effects in the following two respects.

Here, an insulating film refers to a silicon oxide film, a silicon nitride film, an aluminum oxide film; i.e., alumina, sapphire, and tantalum oxide film, and the like.

Normally, however skillfully an insulating film is used, it has been difficult to use the insulating film such that the insulating film can be made completely unseen from the beam passing axis. Therefore, in this case, the scattering electron beam hits and is charged on the insulating film to charge up, resulting in generation of beam drift. Also, because, with charge-up drift, charging and discharging is repeated and therefore positional stability of the beam cannot be obtained, pattern drawing with high accuracy cannot be performed.

The second defect is breakdown of an insulating film. When an insulating film is irradiated with a beam, the insulating film is charged and also has radiation damage, and, with electric current flowing through fine holes and fine cracks inside the insulating film, breakdown of the insulating film occurs. When breakdown of the insulating film occurs, it is not possible to apply voltage to the wiring line. As a result, it is not possible to apply voltage of 5V or the like which is necessary for beam blanking, leading to damage of the function for performing a beam blanking operation. Accordingly, selection of an insulation substance used for Blanker Aperture Array (BAA) has had difficulties.

In the present embodiment, in order to overcome the above difficulties, the following two main methods can be presented.

In the first method, a semiconductor with a large band gap or a high resistive semiconductor is used for insulation.

However, the following should be noted. If a semiconductor is used as an intrinsic semiconductor with an extremely small amount of impurities, it is possible to use such a semiconductor as a material which does not charge up, to thereby prevent occurrence of dielectric breakdown, and which can have sufficient insulating property. Such an intrinsic semiconductor includes silicon, SiC, BN (boron nitride), GaP (gallium phosphorus), GaN (gallium nitride), diamond, aluminum nitride, germanium, gallium arsenide, Gallium Phosphide, and the like.

However, in a semiconductor having a relatively small band gap of 1.1 eV, such as silicon, and so on, mixture of only a small amount of impurities would result in a substrate having N or P type conductivity, and also, when a wiring line is formed of a metal, it is not easy to allow intrinsic silicon crystal to grow once again on the upper surface of the metal.

In the second method, P-type N-type junction of a semiconductor is used to provide insulation resistance.

As a semiconductor is not an insulator, the threshold value at which dielectric breakdown by radiation occurs is significantly greater when compared to an insulator, and radiation resistance is sufficient. A semiconductor is not subject to break by radiation. A pair of an electron and a hole is formed and drawn to electrodes that are mutually applied with voltage, to thereby disappear. As no electric defects are left within a crystal, dielectric breakdown does not occur by discharge.

This embodiment will be described below.

Figure 20:
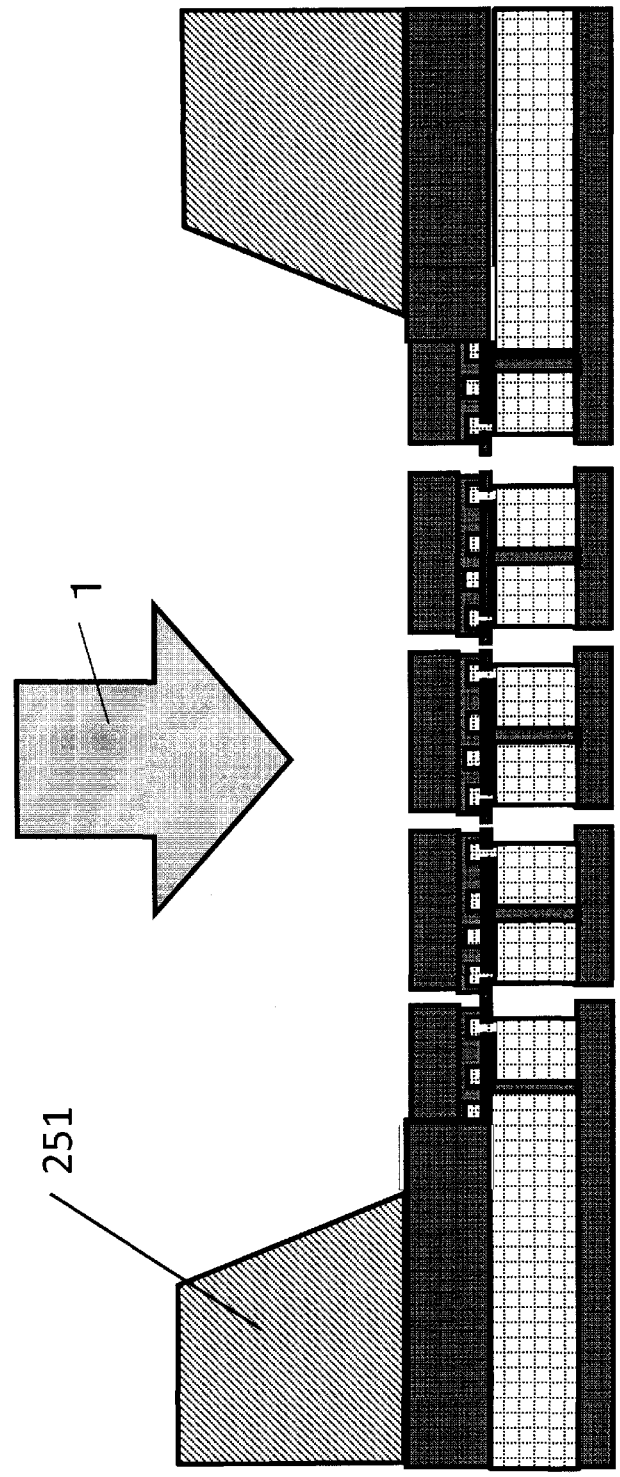
[FIG. 20] Cross sectional view of a PSA-BA substrate, which explains a position with respect to the beam.

FIG. 20 is a reduced cross sectional view of a PSA-BA substrate. On the upper portion of the PSA-BA substrate, the heat sink 251 including an opening which is larger than a square region of 640 μm through which a beam group travels and having an electric conductivity and high thermal conductivity is provided, so as to maintain a fixed temperature by using an external water cooling method or the like.

Figure 21:
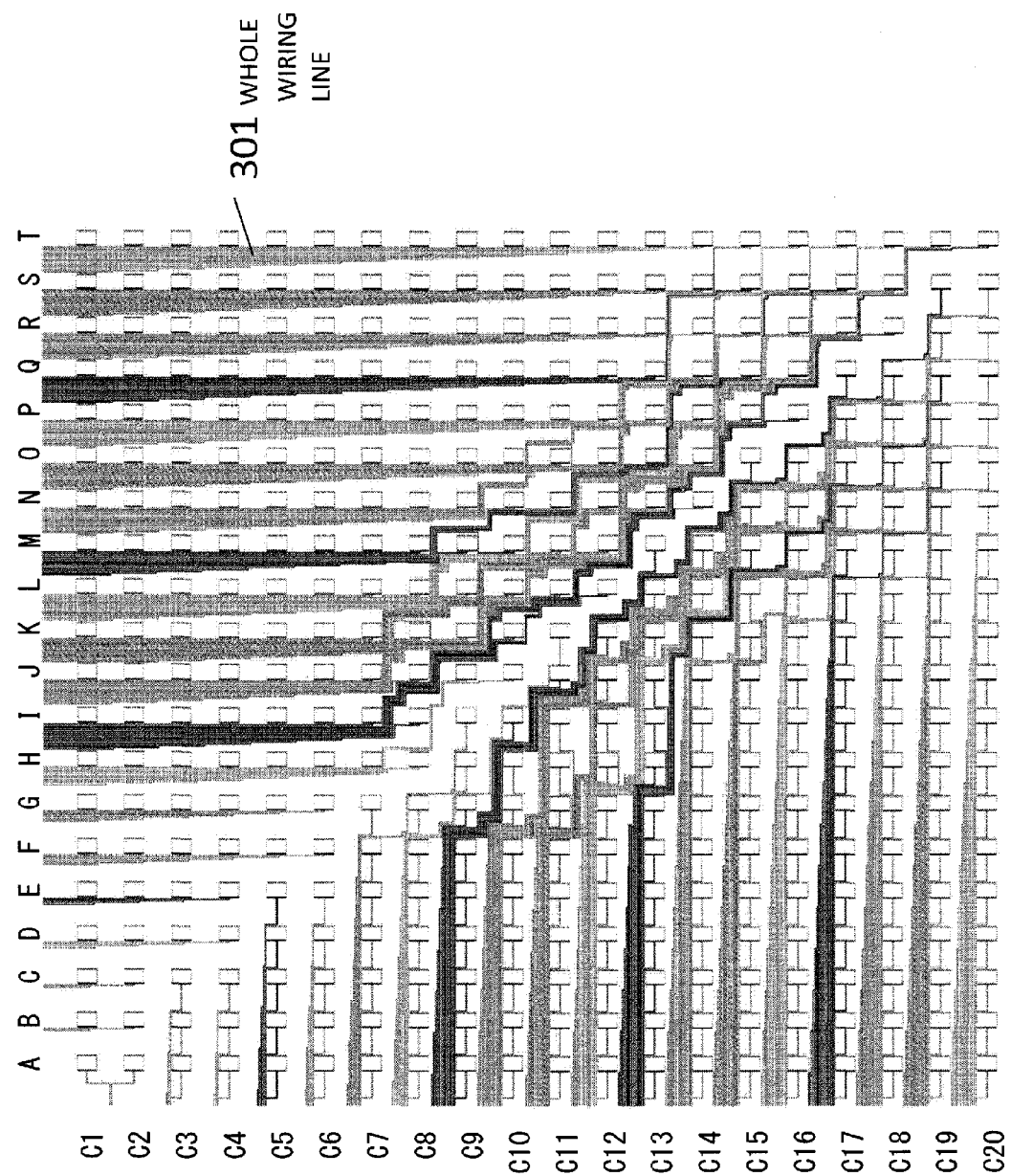
[FIG. 21] Wiring diagram to the electrode of the PSA-BA.

FIG. 21 illustrates a line pattern 301 from outside to electrodes of blankers for 1600 individual element beams in the present embodiment.

As one of the pair of the blanker electrodes is connected to ground, it is considered that there is no need for wiring. While this line pattern includes 40×40=1600 lines, it is possible to divide these lines into four regions and determine the wiring from one electrode for 20×20 blankers, and then determine patterns which are upside down and/or left-right reversed. It is therefore only necessary to determine the line pattern of 20×20=400 wiring lines. As it is not desirable to use a two-layer line so as to avoid complication of the process, a line in a single layer will be considered. While it appears that, because there are 20+20=40 lines in the peripheral portions, it is only necessary to extract the average of 10 lines, as the lines collide with each other in the vicinity of diagonals, it was found, from a wiring diagram which was drawn, that it is preferable to cause a maximum of 14 lines to pass between one opening and another opening. While a beam system with 1600 beams having a beam size of 20 nm has been described for explaining the present invention, there may also be used a system with 2500 beams having a beam size of 16 nm, a system with 4500 beams having a beam size of 12 nm, a system with 6400 beams having a beam size of 10 nm, a system with 10000 beams having a beam size of 8 nm, a system with 18000 beams having a beam size of 8 nm, a system with 18000 beams having a beam size of 6 nm, a system with 25600 beams having a beam size of 5 nm, or a system with 40000 beams having a beam size of 4 nm.

Figure 22:
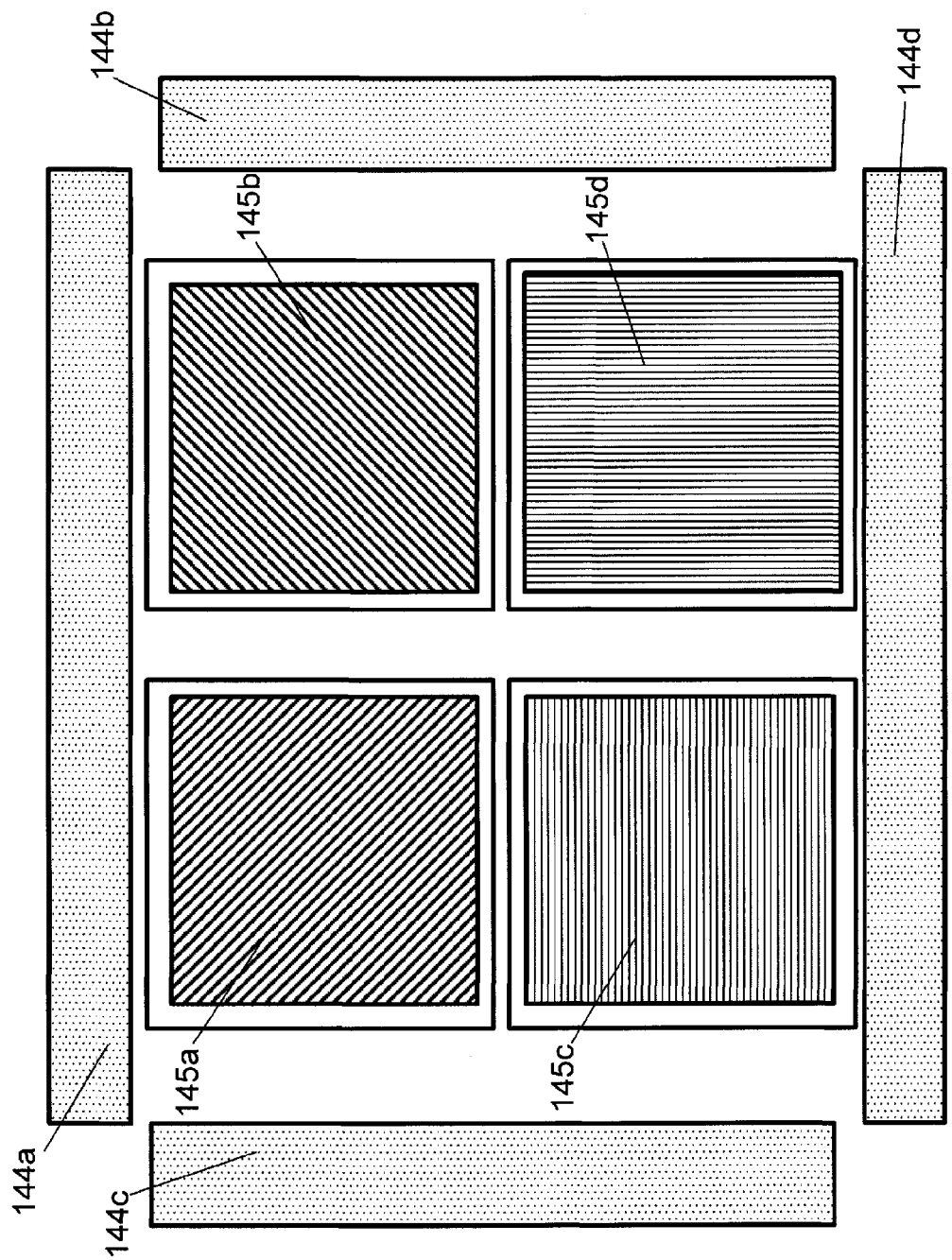
[FIG. 22] View describing PSA-BA apertures capable of forming matrix beams 1, 2, 3, and 4.

FIG. 22 illustrates a PSA-BA substrate which is configured to allow forming and selection among four different types of matrix beams which differ from each other in beam size and the pitch of the square lattice of a square lattice matrix beam group.

In the center of a PSA-BA substrate 145, four types of PSA-BA function elements 145a, 145b, 145c, and 145d are arranged for forming four types of different matrix beams. Amplifiers 144a to 144d are employed for the PSA-BA function elements 145a to 145d. The four types of square lattice matrix beam groups have different beam sizes, different pitches, and different numbers of individual element beams.

For example, the following four types of square lattice matrix beam groups can be provided. In the present embodiment, an example in which the reduction ratio is fixed to 1/500 will be described.

Concerning the matrix beam 145a, the beam size is 8 nm and the pitch between beams is 32 nm, and the number of individual element beams is 100×100=10000. The size of the opening on the PSA-BA substrate is 4 μm and the pitch is 16 μm, and the whole size for the matrix beam 145a is 1600 μm×1600 μm.

Concerning the matrix beam 145b, the beam size is 12 nm and the pitch between beams is 48 nm, and the number of individual element beams is 64×64=4096. The size of the opening on the PSA-BA substrate is 6 μm and the pitch is 24 μm, and the whole size for the matrix beam 145b is 1536 μm×1536 μm.

Concerning the matrix beam 145c, the beam size is 16 nm and the pitch between beams is 64 nm, and the number of individual element beams is 50×50=2500. The size of the opening on the PSA-BA substrate is 8 μm and the pitch is 32 μm, and the whole size for the matrix beam 145c is 1600 μm×1600 μm.

Concerning the matrix beam 145d, the beam size is 20 nm and the pitch between beams is 80 nm, and the number of individual element beams is 40×40=1600. The size of the opening on the PSA-BA substrate is 10 μm and the pitch is 40 μm, and the whole size for the matrix beam 145d is 1600 μm×1600 μm.

Depending on which of the four types of matrix beams is used, a blanker signal for controlling the necessary individual element beams is switched.

Figure 23:
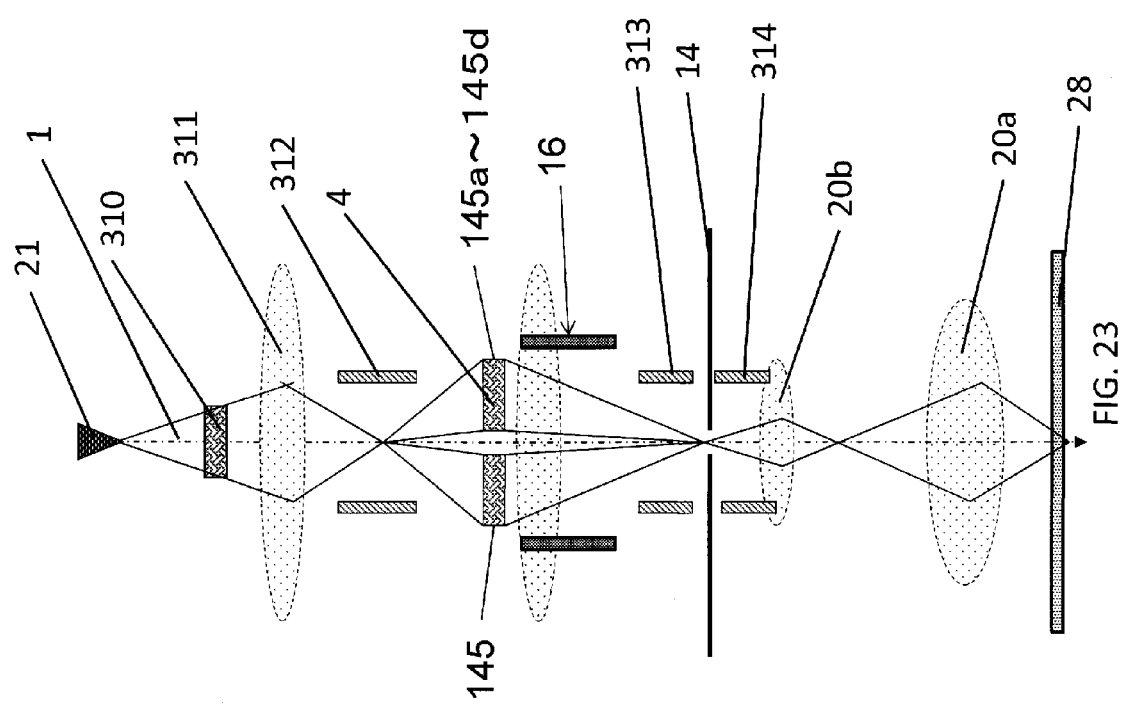
[FIG. 23] Explanatory view of a column when one of the matrix beams 1, 2, 3, and 4 illustrated in FIG. 22 is selected.

FIG. 23 is an explanatory view of a lithography apparatus for using a lithography apparatus including the multiple-type selection PSA-BA substrate illustrated in FIG. 22. A square lattice matrix beam having a different beam size and a different pitch is selected. For this purpose, a beam is first caused to pass through a rectangular aperture 310 for shaping into a rectangular shape. Further, a lens 311 is used to form an image of the rectangular beam on the PSA-BA substrate 145 which is configured to allow formation of the four types of matrix beams. A multiple-type matrix beam selection deflector 312 is driven to select a matrix beam of the desired type.

There is necessary processing in the above case. First, it is necessary to perform control such that the crossover point does not move, in order to prevent a change in the current density. It is therefore necessary to separate the multiple-type matrix beam selection deflector 312 into two stages and determine the deflection efficiency ratio of the respective stages such that the crossover position is stationary at the position of a round aperture 14.

It is further necessary to drive a positional shift correction deflector 314 for the multiple-type matrix beam selection deflection in synchronization with a multiple-type matrix beam selection deflector 313 and to maintain the deflection efficiency ratios of both deflectors at a fixed ratio, thereby making the selected beam position fixed and preventing a change in the current density. The selected matrix beam may have a different size as a whole, and it is therefore necessary to provide coordinates data of a deflector for the whole beam such that the lower left corner position is a fixed point.

Further, a common whole blanker 16 can be provided for the four types of whole matrix beam blankers.

Figure 24:
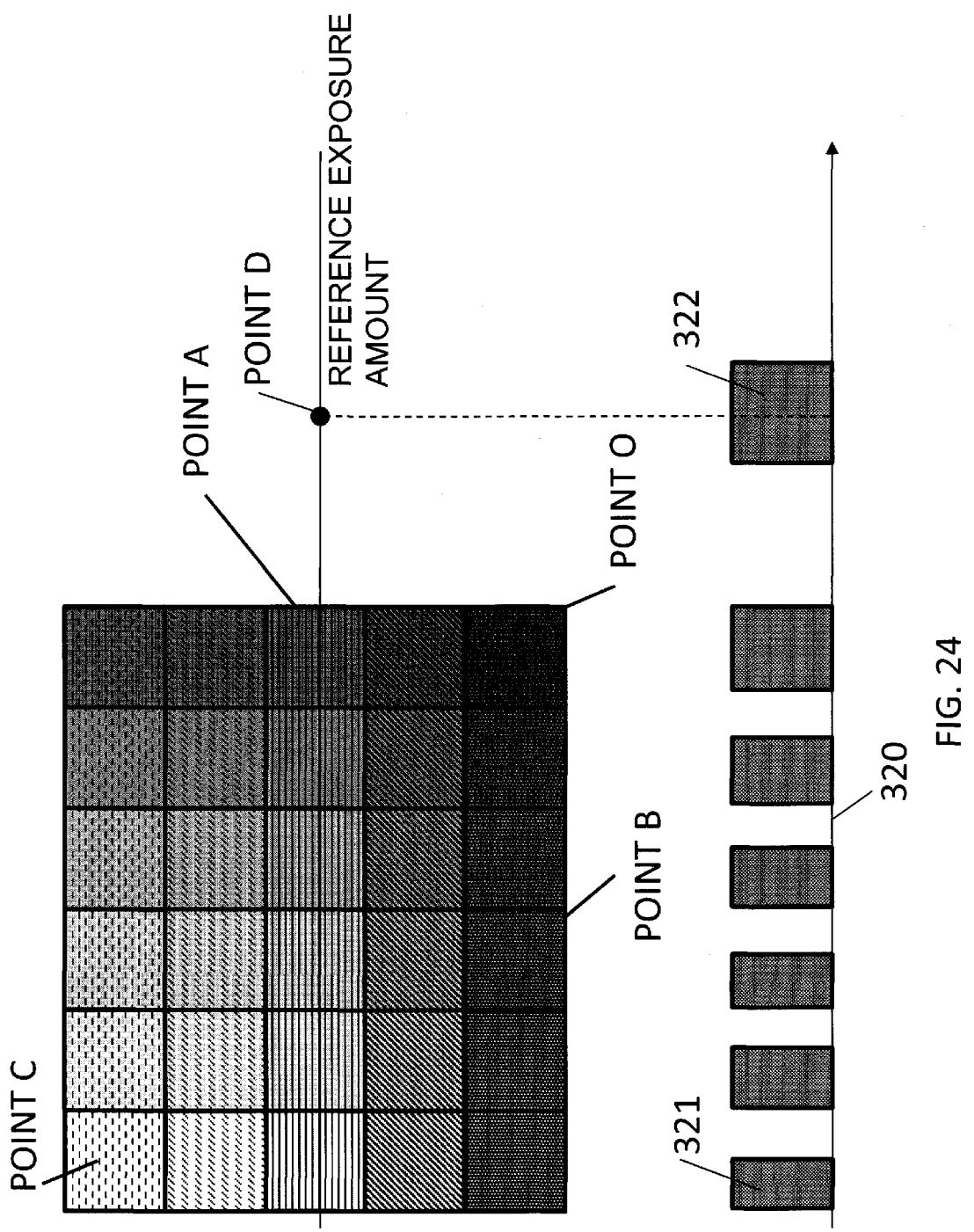
[FIG. 24] View for explaining a proximity effect correction electron intensity distribution when a hole of 20 nm is drawn by line scanning.

FIG. 24 illustrates a distribution of the exposure amount when a fill-in pattern is drawn with line scanning.

The following description will be provided in order to prove that the throughput is reduced in a continuous scan type exposure method as compared to the present embodiment.

Concerning the continuous scan type exposure method, it is emphasized that correction of the proximity effect is achieved by thinning of the exposure time while performing scanning by blanker. However, the conclusion is that, in the case of a fill-in pattern, for example, the throughput in the continuous scan type lithography method is reduced to half that of the present embodiment.

Here, it is assumed that the acceleration voltage of electrons is 50 KV. When the fill-in area ratio is 100%, the energy of incident beam and the total energy of reflection electron beam are equal to each other.

In the above-described case, because the exposure energy at the 100% fill-in region is exactly twice the exposure energy at an isolated point and is overexposure, it is necessary to reduce the total amount of incident electrons to 50%. In order to make the exposure amount at an isolated point D a required value, according to the continuous scan type exposure method in which drawing is performed at the same scanning speed, the beam should not be emitted for 50% of the time within a pattern of fill-in ratio of 100%. When scanning is performed along the solid line including point D, the blanker waveform as a whole (i.e. the blanker waveform in the fixed speed continuous scan mode) is as indicated by a waveform 320, and the waveform in the fill-in region (a portion with the fill-in area ratio of 100%) is as indicated by a waveform 321, which is a 50% OFF state, and it is indicated that exposure including wastes time is being performed. A waveform 322 is a blanker waveform near point D. As such, the throughput is reduced to half.

Figure 25:
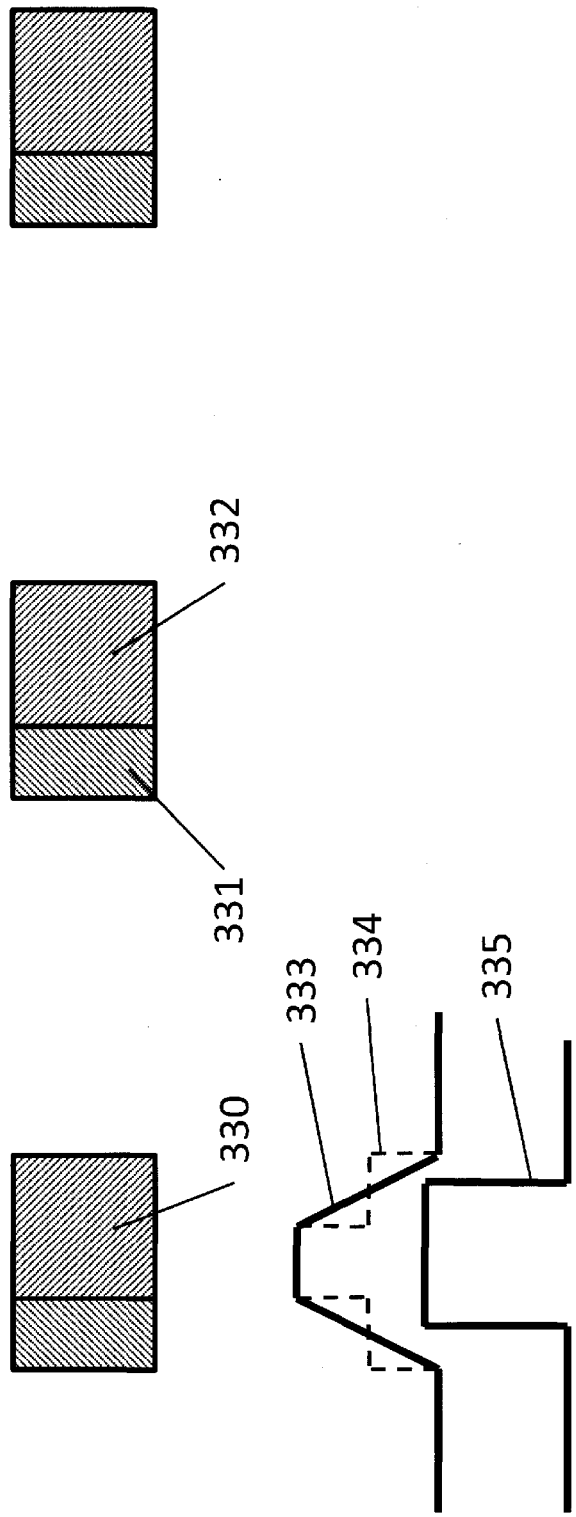
[FIG. 25] View for explaining a beam intensity distribution in a fill-in pattern.

Description will be made with reference to FIG. 25. In the present embodiment, because, when the beam is deflected to another position, the whole blanker 16 always turns the beam OFF and thereafter beam deflection by the deflector is performed, a situation in which the beam is continuously emitted with deflection will never occur. However, in the conventional continuous scanning exposure by BAA and the general multi-beam lithography method by raster scan, the beam scanning is continued while the beam is continuously emitted. When a lithographic pattern 330 is drawn, the beam is turned ON, and the exposure amount distribution increases linearly at a certain inclination angle as indicated by a solid line 333. Then, after reaching a fixed value, the exposure amount then decreases at a certain inclination angle.

However, when irradiation is performed at two points 331 and 332 for a predetermined time, the electron beam irradiation intensity is as indicated by a step function 334 in dotted line. While it is not clear which of these distribution patterns is preferable, in either case, the sharpness of edges of the lithographic pattern is more deteriorated than when drawing is performed at one isolated point, and irradiation as indicted by desired electron quantity distribution 335 cannot be achieved.

Here, it should be noted that when performing beam exposure by continuous scanning, the sharpness of the pattern edges is completely different between the scanning direction and the non-scanning direction, and therefore drawing cannot be performed in the same manner.

In the present embodiment, a method in which the proximity effect can be corrected and also the throughput is not reduced can be presented.

Figure 26:
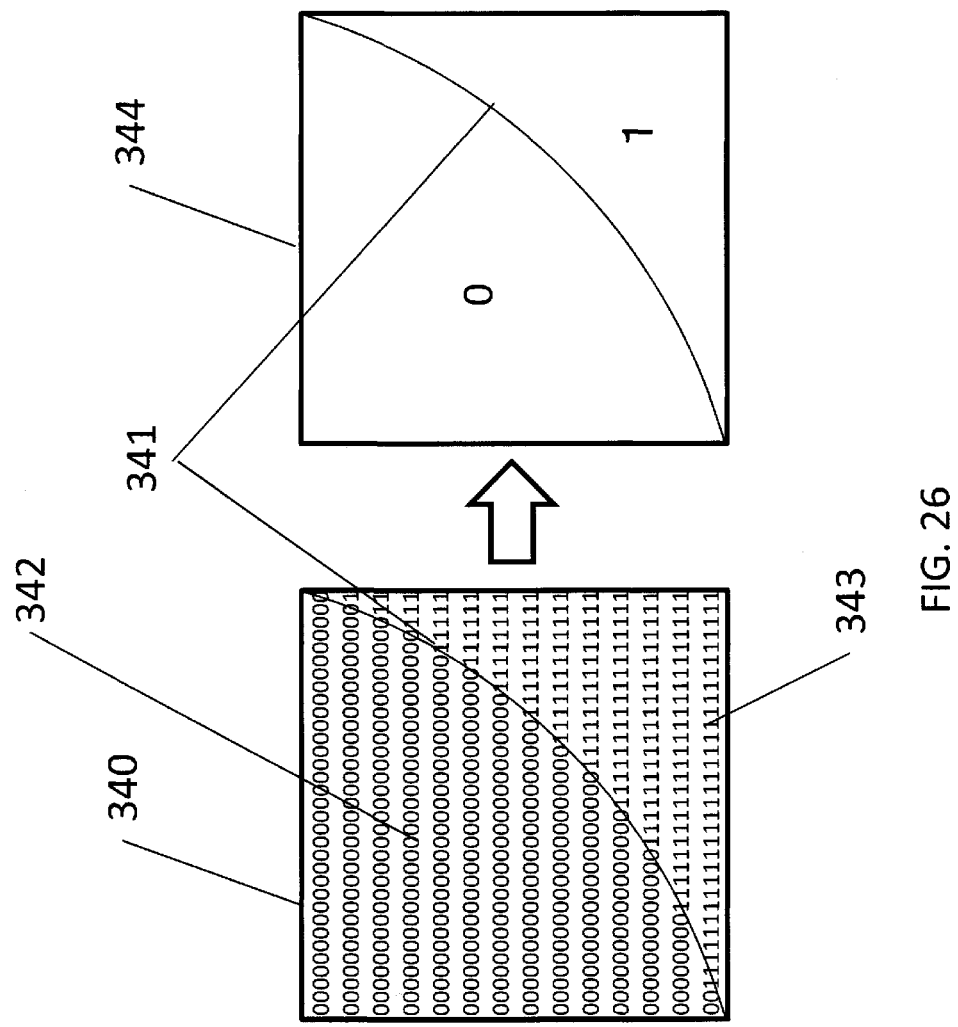
[FIG. 26] View for explaining an exposure intensity distribution in the proximity effect correction.

With reference to FIG. 26, in order to explain a method for correcting the proximity effect, a method for providing the exposure amount distribution in a curved manner in the square exposure amount region will be described. Specifically, among the 40×40=1600 square lattice matrix beams 340, with respect to the boundary portion indicated by a curve 341, a beam portion 342 in which the bitmap is OFF is designated as <0> and a beam portion 343 in which the bitmap is ON is designated as <1>.

This is briefly illustrated in a partial view 344 of FIG. 26 in a simplified manner, which indicates <0> and <1> on the opposing sides of the curve 341.

As illustrated in FIG. 27, a case in which a fill-in pattern is found in only the second quadrant of a XY coordinate system will be considered. Point 0 in the figure is an origin. In this figure, a region of (−1, 2), which is a 3.2 μm square region, will be described.

The (−1, 2) region is located at a position which is shifted, with respect to the 0 point, by one, corresponding to a 3.2 μm square, in the −X direction; i.e., by one to the left and also by two in the +Y direction; i.e., by two in the upward direction. In order to perform the proximity effect correction correctly, it is necessary to vary the exposure intensity in accordance with three contours by which four regions; i.e., a region of drawing time=t1, a region of drawing time=t1+t2, a region of drawing time=t1+t2+3, and a region of drawing time=t1+t2+3+t4, are separated from each other, as illustrated in a partial view 345.

First, concerning the bitmap illustrated in a state of 345*a*, a bitmap which is 1 for the whole square matrix elements is provided to a beam for performing beam drawing for the drawing time t1. Thereafter, with a bitmap which is 0 in the upper left portion with respect to the leftmost curve and is 1 in the lower right portion, beam drawing is performed for the drawing time t2 as illustrated in 345*b*. Thereafter, with a bitmap which is 0 in the upper left portion with respect to the second leftmost curve and is 1 in the lower right portion, beam drawing is performed for the drawing time t3 as illustrated in 345*c*. Thereafter, with a bitmap which is 0 in the upper left portion with respect to the third leftmost curve and is 1 in the lower right portion, beam drawing is performed for the drawing time t4 as illustrated in 345*d*.

As described above, by performing superposed drawing with different bitmaps at the same deflection position of the main deflector and the sub deflector, it is possible to vary the exposure amount with respect to each beam element. In this manner, it is possible to perform proximity effect correction or exposure amount correction while performing vector scanning and also in a state in which the beam is stationary.

This method can provide an advantage that the edge position of the lithographic pattern does not move, as compared with the continuous scanning exposure method in which the exposure time is thinned to thereby control the exposure amount.

Further, because, in the region near the region for which the proximity effect correction is needed, the patterns are sparse and the drawing time is often short, the correction can be performed without lowering the throughput.

As described above, when compared to the continuous scan type exposure method, the throughput of the present embodiment can be advantageously increased to about twice.

It may appear that, in the present embodiment, a special lithography method in which lithography is achieved by a square lattice matrix beam group is adopted and therefore there is a concern that the lithography method of the present embodiment may be considered to be less flexible than the general multi-beam lithography method. However, in the case of forming a large number of beams by using an electronic shielding plate, it is simplest to form multiple beams which are arranged in a square lattice matrix beam group.

According to many of various suggestions concerning complicated multi-beam lithography, beams are arranged in a staggered form or the beams form beam groups that are shifted in the XY directions little by little, and these beam groups are used to finely control the whole deflection position and exposure irradiation amount and are superposed to achieve multiple lithography, which basically results in deterioration of accuracy in lithography and an increase in the drawing time. Further, in a method in which ON/OFF time control of the blanker is performed at different timings for each individual element beam of the beam groups to thereby draw a subtle pattern, an explosive increase in the pattern data is caused and, due to complexity of the pattern lithography, reliability of the lithographic patterns is lost.

According to the present embodiment, by maintaining a simple lithography method in which ON/OFF control is performed with bitmaps by using a simple square lattice matrix beam group and, after all the analog signals are stabilized, the beams as a whole are radiated, minimization of the pattern data quantity, attainment of accuracy in lithography, and high-speed lithography can be achieved simultaneously.

Concerning the pitch of the square lattice matrix beam group, drawing is performed with a pitch that matches the finest device region. In a case where the fineness is reduced in other regions of the device pattern, an increase in the number of shots often occurs. However, by modifying the shape of the device pattern toward the pitch for the pattern lithography with the highest fineness such that drawing can be achieved within the required drawing time to thereby deform the pattern, it is possible to increase the accuracy of lithography and achieve the high-speed lithography without losing the function of the device, thereby comprehensively maximizing the production efficiency of the device.

In the square lattice matrix beam group, the pitches in the horizontal and vertical directions may be varied or the number of beams arranged in the horizontal and vertical directions may be varied, thereby forming a rectangular lattice matrix beam group.

The individual element beam may be a beam having a circular or a rectangular cross section, rather than a square cross section.

Once the pattern rule of the device to be manufactured is determined and the production plan is determined, the PSA-BA substrate of the apparatus is reinstalled so as to match the pattern rule. Specifically, similar to a die of sheet metal working and a mask of semiconductor lithography, the device is manufactured according to the manufacturing plan and installed. However, among design types having pattern rules of the same size, it is possible to draw different patterns continuously in a smooth manner without manufacturing a different mask or changing a mask.

It is also possible to adopt a method in which four types of PSA-BA substrates with the size of the individual element square beams being 20 nm, 16 nm, 12 nm, and 8 nm, respectively, are provided and one type square lattice matrix beam group is selected for drawing.

It would be the most effective method for achieving both accuracy and high-speed lithography to form a square lattice matrix beam group in accordance with the pattern rule of the device to be drawn and perform drawing.

"Using PN Junction for Insulation of Individual Blanker Electrode"

The conventional PSA, which was manufactured by using the Si semiconductor process, suffered from the following problems:

1. Because insulation between electrodes was achieved by using insulation substances such as an Si nitride film, an Si oxidation film, and polyimide, electric current flows in a defect portion of the insulation substances which was formed by irradiation of scattering beam by means of 50 kV electron beam irradiation, resulting in occurrence of dielectric breakdown in which the insulation property is broken in a predetermined time period to prevent application of voltage between the electrodes or between the wiring lines. As such, the PSA had a limited life, and it was not possible to use this method as is.

2. As the electrodes were manufactured by patterning a thick film resist and applying gold plating or the like to a resist removed portion, it was not possible to obtain electrodes with a predetermined degree of aspect ratio or higher aspect ratio.

Accordingly, there was provided an apparatus which could not deflect the electron beam with sufficient efficiency and was therefore used with the acceleration voltage of 5 kV, which is one-tenth of 50 kV, or the like, leading to a problem that sufficient resolution could not be obtained. Further, there was proposed an electron beam lithography apparatus of 50 kV, in which the voltage is decreased to 5 kV when passing the individual blanker and is then accelerated back to 50 kV after passing the individual blanker. However, with such an apparatus, it was necessary to apply high voltage of −45 kV around the individual blanker, causing a number of difficulties in apparatus structure, such as a discharge issue.

3. Further, extraction of wiring lines from the electrodes of an individual blanker was achieved by automatic arrangement and wiring of 2500 to 10000 lines from the center portion to the peripheral portion, which lacked regularity and worsened visibility when manufacturing the wiring layer. As such, the visibility is also poor at the time of diagnosing failure.

According to the present embodiment, the following advantages can be obtained.

1. As the backward diode property of PN junction is used for an insulating film of PSA, no defects of the insulating substances can be formed by irradiation of scattering beams by means of irradiation of electron beam of 50 kV, and dielectric breakdown does not occur in a predetermined time, which makes the lifetime of PSA incomparably longer. As such, actually usable technology can be provided.

2. Because, in forming the electrodes, there is used a semiconductor layer in which impurities of a type opposite that of the substrate are doped on a side surface of an opening of semiconductor crystal, the aspect ratio can be drastically increased.

More specifically, when the substrate is a P-type semiconductor, a semiconductor having N-type impurities doped on the surface thereof is provided, and a potential of +5V is applied to this N-type impurities-doped semiconductor layer to thereby form a deflected electric field with the opposing electrode being an earth electrode.

When the substrate is an N-type semiconductor, a semiconductor having P-type impurities doped on the surface thereof is provided, and a potential of −5V is applied to this P-type impurities-doped semiconductor layer to thereby form a deflected electric field with the opposing electrode being an earth electrode.

Further, a semiconductor layer of the same type as that of the semiconductor layer on the aperture side surface is formed above and below the formed layer, and a metal layer is caused to grow further thereon.

3. A plurality of substrates in which the aperture side surface of the above-described semiconductor is a beam deflection electrode are superposed on each other, and the metal films are bonded together by heat, pressure, or vibration, or a combination of these three, so that an electrode having a further higher aspect ratio can be formed. (For example, five substrates of 10 μm are bonded together, so that an electrode with a high aspect ratio, which has a thickness of 50 μm and an electrode-electrode distance of 4 μm, can be formed.)

4. A multilayer wiring layer is used in order to extract electrode wiring lines of the individual blanker of the whole lattice points, and the whole number is divided by an integer to divide into a plurality of separate small groups, and wiring of the respective groups is performed in the same layer in the vertical and horizontal directions.

Wiring of the electrode of the whole lattice point is performed within one layer, and is then connected to another layer by using a through-silicon via (TSV: Through-Silicon Via).

5. While a metal having sufficiently small wiring resistance is used for the wiring line, because an insulating substance surrounding the wiring line cannot be used, the backward diode of PN junction is used to wrap the metal line.

The present embodiment will be described in detail below.

Figure 28:
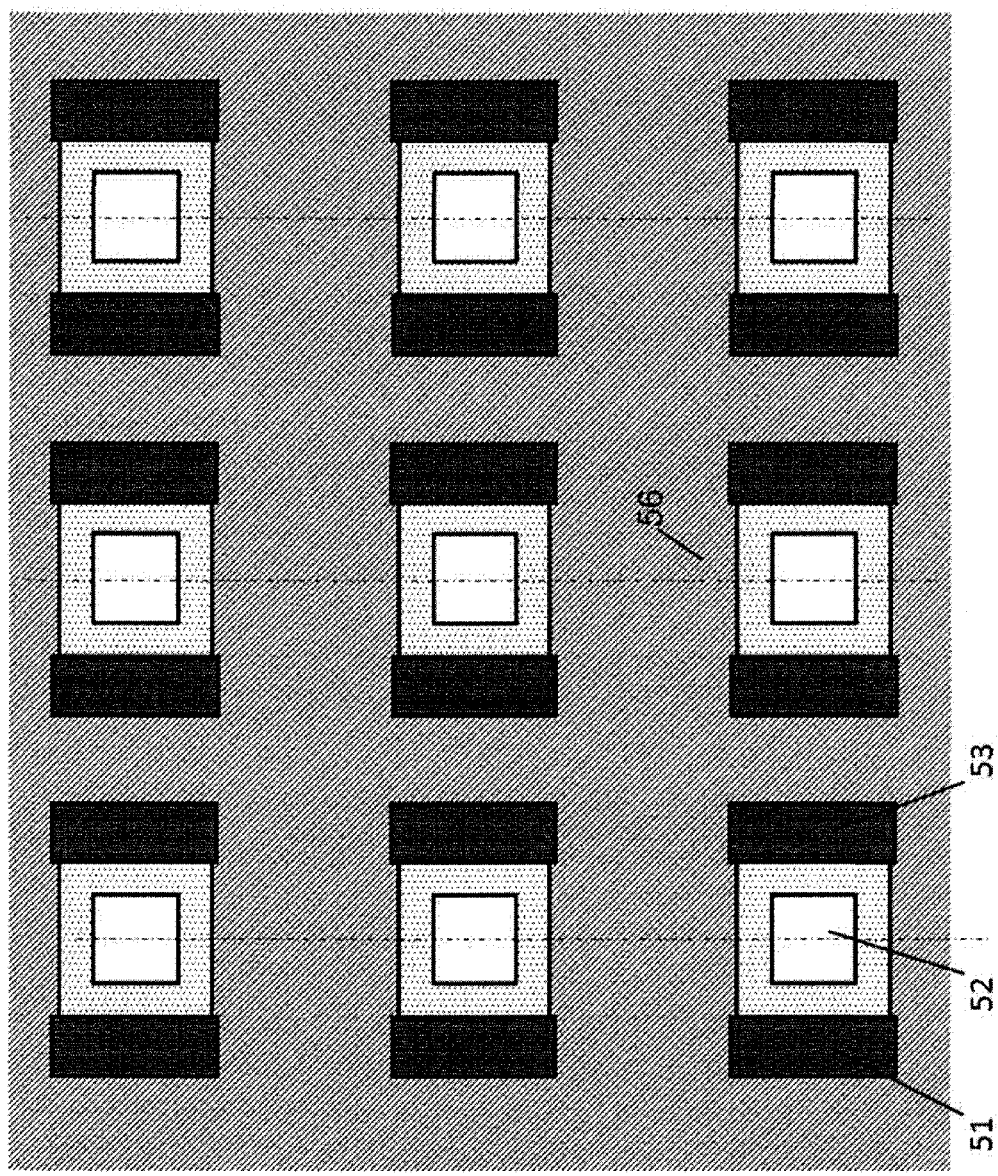
[FIG. 28] View illustrating apertures and electrodes for forming a square lattice matrix beam group according to the present embodiment.

FIG. 28 illustrates a method for forming an individual blanker of PSA according to the present embodiment. In the present embodiment, a PN junction of a semiconductor substrate is used to form an electrode.

For example, assuming that a substrate 56 is a P-type, and N-type impurities are diffused on left and right side surfaces of a rectangular aperture 52 to thereby form a pair of N-type impurity-doped layers (a blanking electrode 51 and an earth electrode 53). Accordingly, the blanking electrode 51 and the earth electrode 53 are a pair of electrodes of the individual blanker. Therefore, when +5V and 0V are applied to the left electrodes, an electric field is generated. The substrate 56 is grounded to 0V. The earth electrode (N-type impurity doped layer) 53 on the right side to which 0V is applied has the same potential as that of the peripheral earth. The blanking electrode (N-type impurity doped layer) 51 on the left side to which 0V is applied has diode connection in the opposite direction to the peripheral P-type substrate 56 and no electric current flows, so that +5V is applied in a stable manner.

As no Si oxide film and nitride film are used for this individual blanker of PSA, sufficiently long life can be obtained.

Here, in the figure, a portion indicated by reference numeral 54 schematically illustrates a rectangular beam forming separation plate (Si membrane) for shaping the electron beam in a rectangular shape. The electron beam passes through a portion in the rectangular aperture 52 where the separation plate 54 does not exist.

Further, a metal layer may be provided on the surface of the blanking electrode 51 and the earth electrode 53 on the aperture side.

Figure 36:
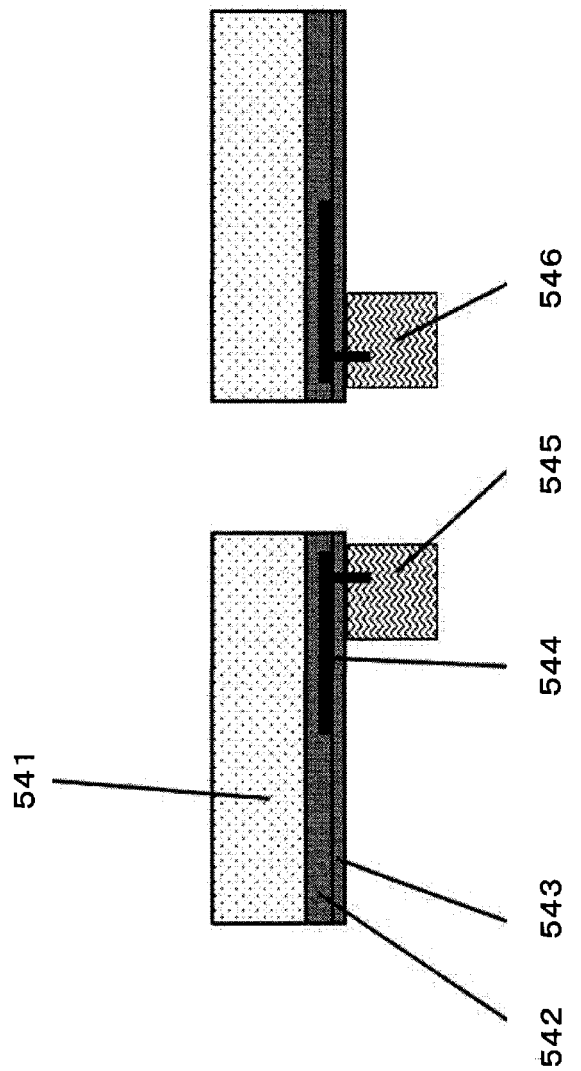
[FIG. 36] View illustrating a cross section of an electrode of PSA according to the prior art.

Here, with reference to FIG. 36, PSA according to the conventional art will be described. On the lower side of a silicon substrate 541 in the figure, silicon oxide films 542 and 543 are formed and a wiring line 544 is disposed between the silicon oxide film 542 and the oxide film 543. A blanking electrode 545 and an earth electrode 546 are formed by forming an aperture in a resist and attaching a metal thereto by electroplating. Here, after the electroplating process, the resist is removed. With such a method of forming electrodes, as the thickness of the electrode is thin and the aspect ratio is not sufficient, and as the efficiency for deflecting the beam is not sufficient, beam cut in the off state cannot be performed sufficiently. More specifically, as the beam slightly leaks in a surface of the specimen even in the off state, only lithography without contrast can be performed.

Figure 29:
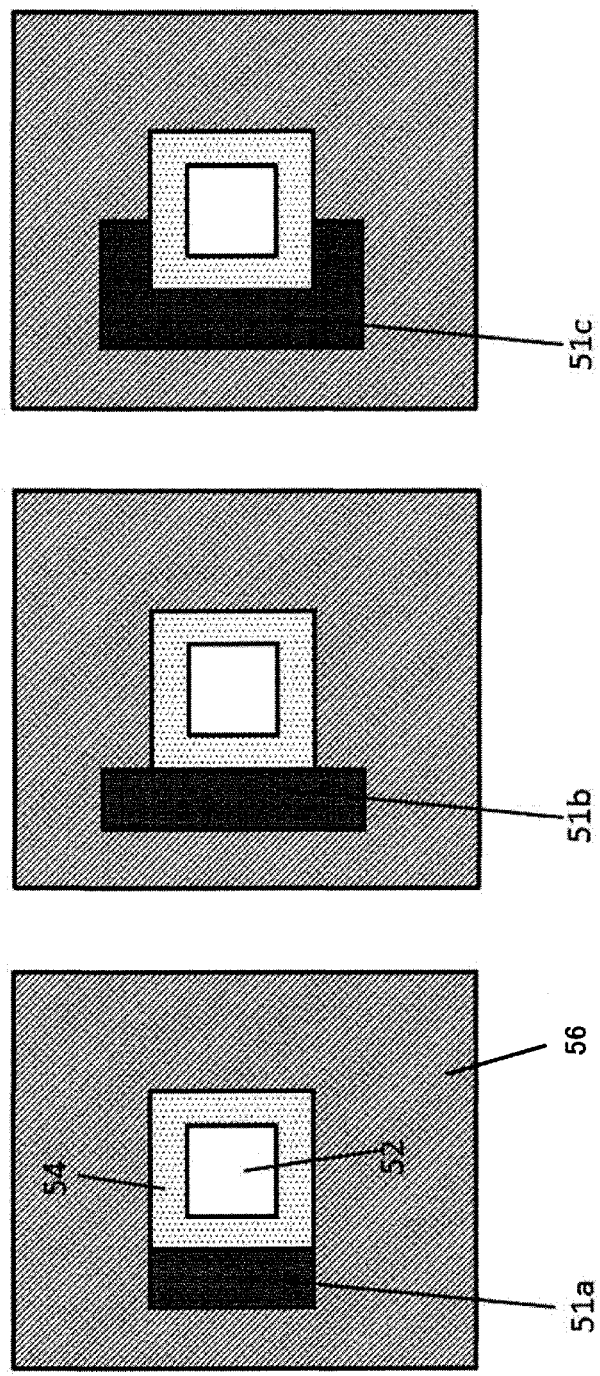
[FIG. 29] View illustrating apertures for forming a square lattice matrix beam group and various types of electrodes for controlling according to the present embodiment.

FIG. 29 illustrates a method for forming an individual blanker of PSA according to the present embodiment.

It is not necessary to form electrodes on side walls on both sides of an aperture of a P-type substrate. As one side is always earth, it is not necessary to dope N-type impurities on this side. Further, it is not necessary to apply voltage to this side.

Further, as illustrated in the left part of FIG. 29, a blanking electrode 51a which is an N-type impurity-doped layer may be formed by doping impurities such that the length in the vertical direction is short. In this example, the length in the vertical direction is substantially the same as the length of a rectangular aperture 52.

Also, as illustrated in the center part of FIG. 29, an N-type impurity-doped layer (blanking electrode) 51b may be formed such that the length in the vertical direction is long. Further, as illustrated in the right part of FIG. 29, an N-type impurity-doped layer (blanking electrode) 51c may be formed so as to cover half of the periphery of the rectangular aperture 52 on the left side.

Figure 30:
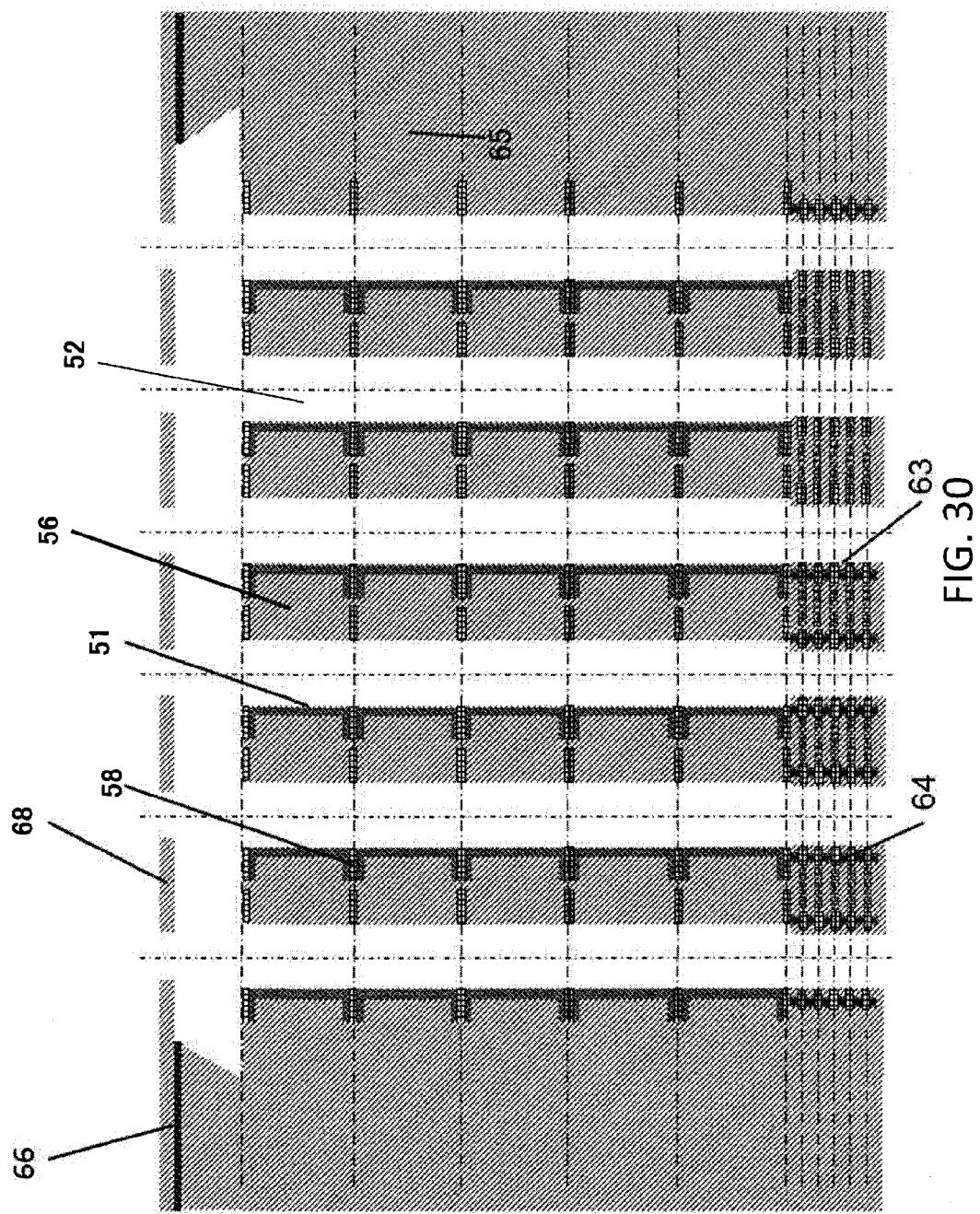
[FIG. 30] View illustrating a cross section of apertures for forming a square lattice matrix beam group and a PSA for controlling according to the present embodiment.

FIG. 30 illustrates a PSA according to the present embodiment. On the uppermost portion, there is a rectangular beam forming separating plate (Si membrane) 68 for separating the beam into a plurality of beams. The separating plate 54 in FIGS. 28 and 29 indicates a portion of the rectangular beam forming separating plate (Si membrane) 68 of FIG. 30 which is located above the aperture.

In this example, a bond wafer formed by bonding a plurality of wafers together is used for the PSA. While a bonding oxide film 66 is used for wafer bonding, it is preferable to remove the bonding oxide film 66 except for the portions supported by a thick film Si substrate P-type semiconductor 65 provided on the right and left sides, as illustrated, in order to avoid charge-up.

On at least one side of the substrate (P-type semiconductor) 56 of an individual element beam blanking electrode, an N-type doped layer is formed in the vertical direction to form a blanking electrode 51.

On upper and lower portions of this substrate 56, an N-type impurity diffusion layer is formed so as to extend in a flange shape from the aperture side. Further, on this N-type impurity diffusion layer, a bonding metal pattern 58 such as gold is formed.

The substrates (P-type semiconductors) 56 of a plurality of individual element beam blanking electrodes are aligned such that the metal patterns 58 are mutually superimposed, and are bonded together by high temperature, high pressure, vibration, or the like. Similarly, the substrates 56 of the plurality of individual element beam blanking electrodes are bonded together. Thus, the blanking electrode 51 of each substrate is electrically connected on one surface side of the aperture.

In the present embodiment, with respect to the size of the rectangular aperture 52 which is 4 μm, the thickness of the substrate 65 of the individual element beam blanking electrode is 10 µm, and five substrates are bonded together.

A wiring line 64 is further provided in the lowermost level and the multilayer substrate is bonded by technology similar to that described above. A metal 63 with a low resistivity, such as copper, is used as the wiring line 64 in order to make the wiring line 64 low-resistive. For establishing insulation between the wiring lines 64, the substrate (P-type semiconductor) 56 of the individual element beam blanking electrode is provided and the peripheral portion of the wiring line is set to an N-type semiconductor 55, and, with respect to the wiring line potential of 5V, a backward PN junction is formed between the N-type semiconductor 55 and the substrate (P-type semiconductor) 56 of the individual element beam blanking electrode in the peripheral portion, for achieving insulation.

Each of the wiring line substrates is set to about 10 µm, although it appears to be thin in FIG. 30.

Figure 31:
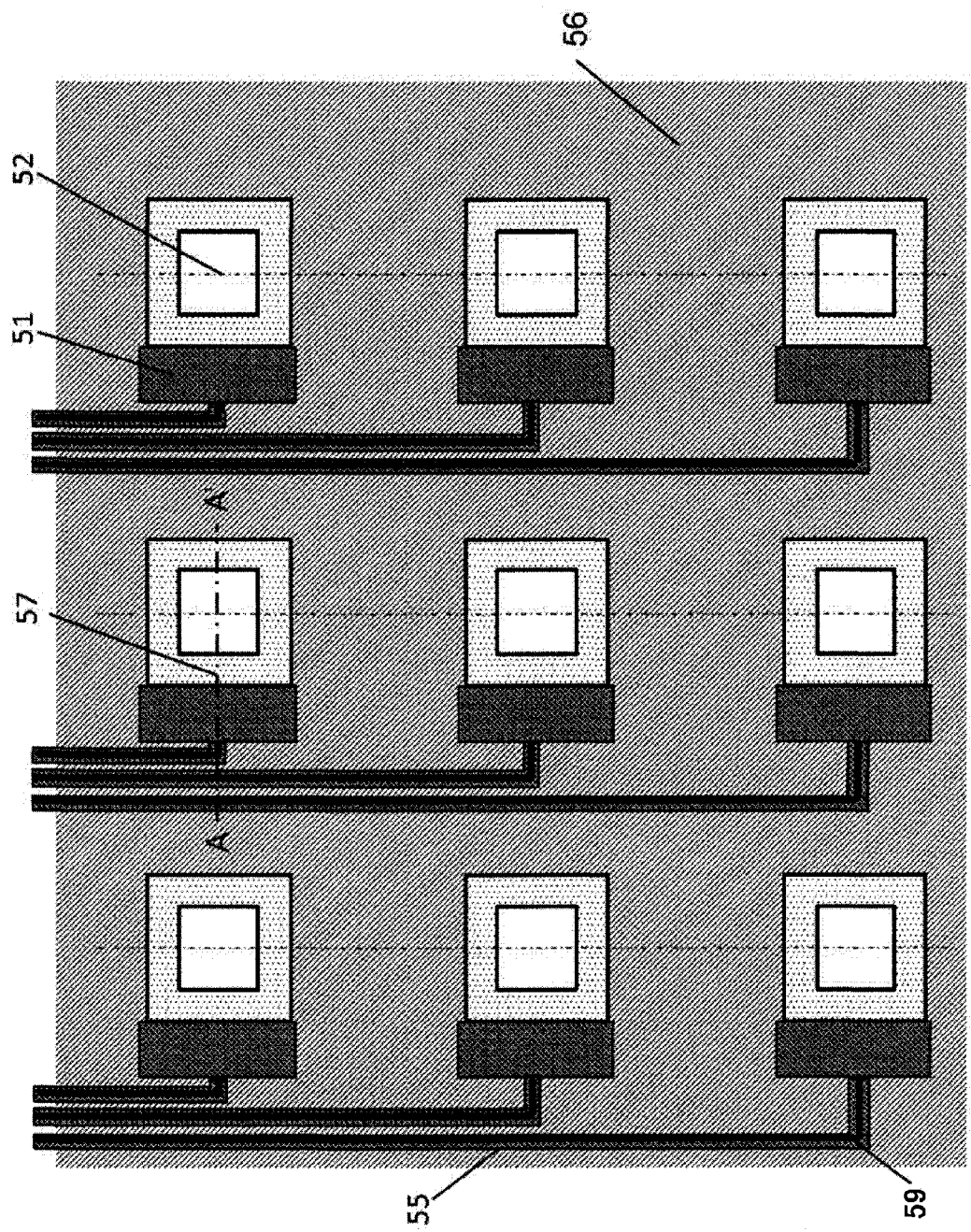
[FIG. 31] View illustrating a relationship among an array of a square lattice matrix beam group, controlling electrodes, and wiring lines according to the present embodiment.

FIG. 31 is a view for explaining wiring from the blanking electrode of the individual element within the PSA substrate.

The drawing illustrates 3×3=9 apertures and individual element blanking electrodes 51. A copper wiring line 59 is extracted from each electrode blanking 51. The N-type semiconductor 55 exists in the periphery of the wiring line 59.

Figure 32:
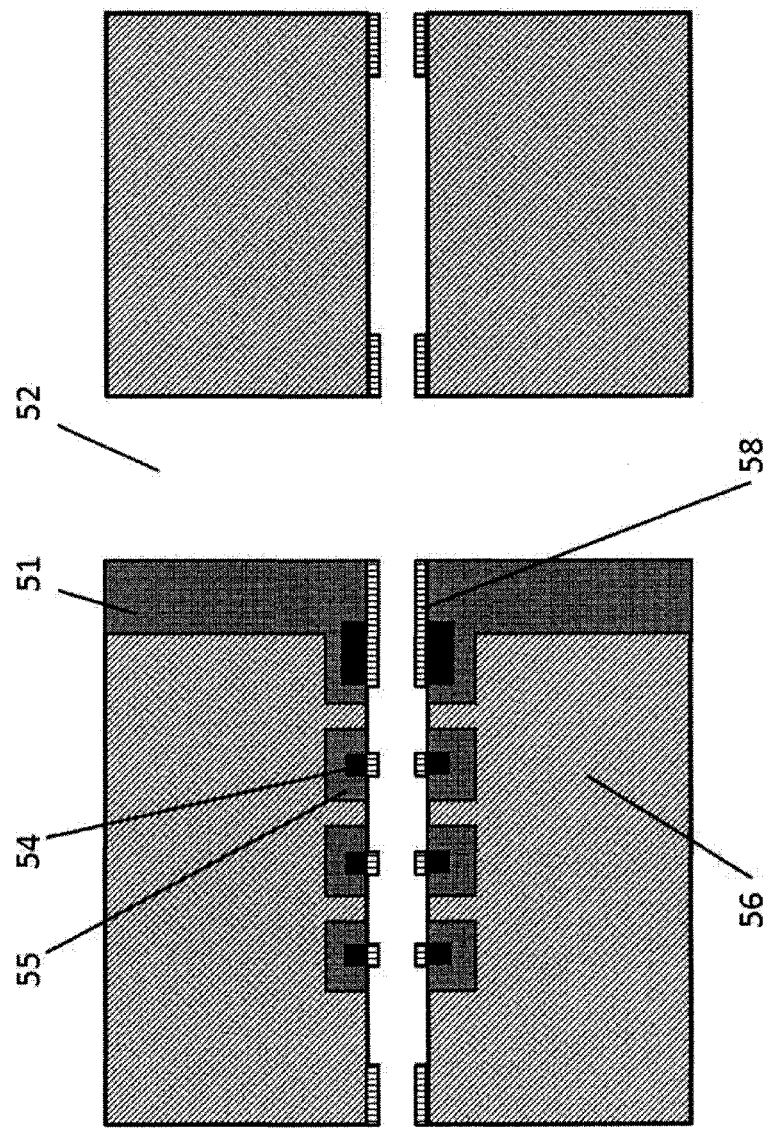
[FIG. 32] View for illustrating insulation between an individual blanker element and a wiring line, and a bonding relationship between semiconductor substrates according to the present embodiment.

FIG. 32 is a cross sectional view concerning the wiring from the blanking electrode of the individual element within the PSA substrate, and is a cross sectional view taken along line A-A' 57 in FIG. 31. In the center portion, an aperture through which a beam travels exists in the vertical direction. On the right side of the aperture, a P-type substrate exists, which serves as an earth electrode. On the left side of the aperture is an N-type impurity-doped layer, which is a blanking electrode.

The line is wired so as to be aligned between two substrates, an upper substrate and a lower substrate. The N-type semiconductor is disposed so as to surround the wiring line 59. A bonding metal pattern 58 is formed on the semiconductor layer and the wiring line 59, and they are bonded to each other by heating, high pressure, or vibration.

Figure 33:
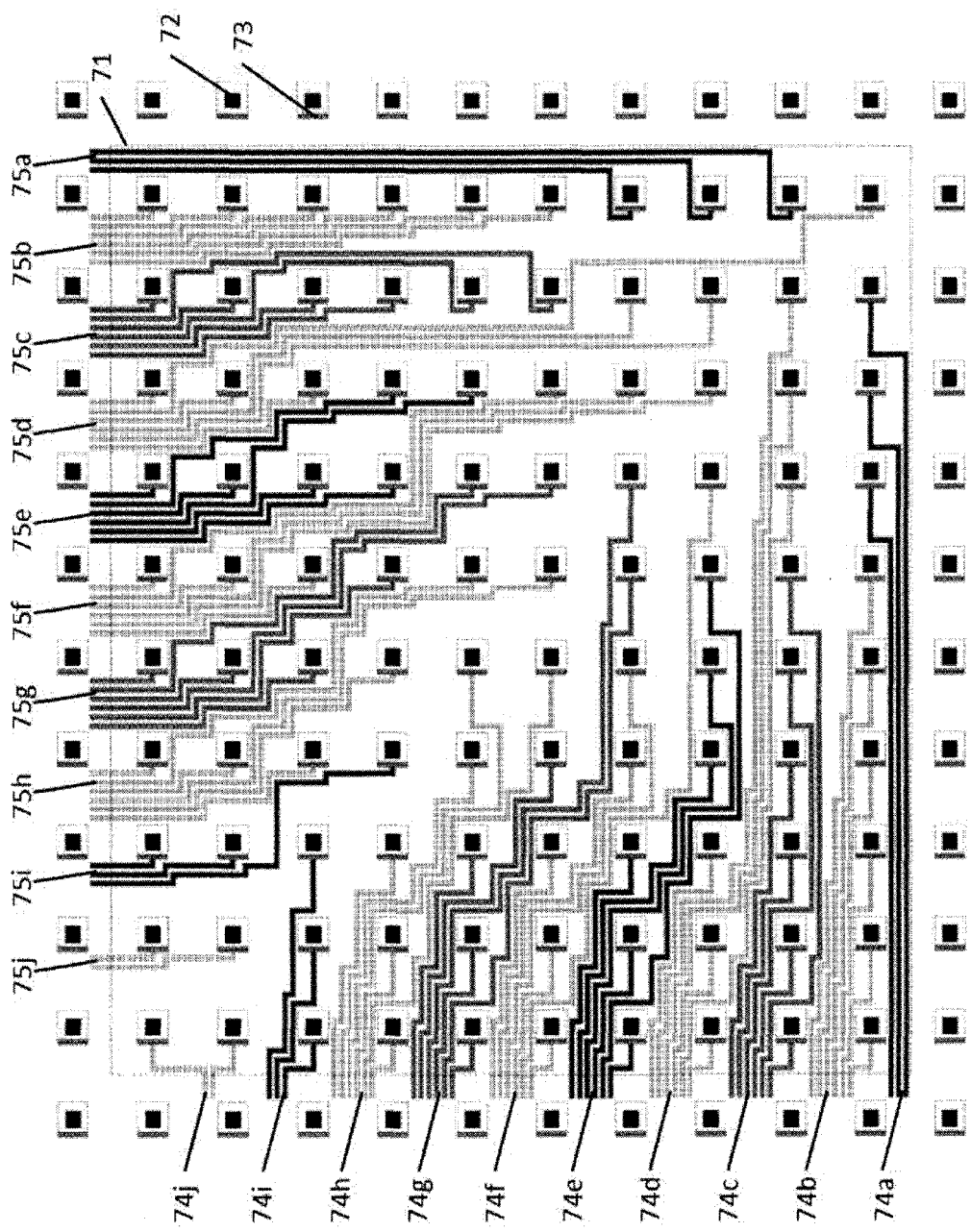
[FIG. 33] View for explaining electrode wiring in a small region including 10×10 individual blankers.

FIG. 33 is a view for explaining wiring from the blanking electrodes of the individual elements of 10×10=100 rectangular apertures indicated in a small region 71. In the drawing, as an individual column, a blanking electrode 73 and a rectangular aperture 72 of the individual element are illustrated.

As the individual elements are arranged in a square matrix, the wiring lines are extracted from inside toward the outside, and four symmetrical arrangements can be considered. FIG. 33 illustrates one example in which a group of lines 75a to 75j and a group of lines 74a to 74j for extracting the 100 lines toward the upper portion and toward the left portion, respectively, from the 100 individual element blanking electrodes are wired.

As there are a total of twenty gaps in the upper portion and the left portion with respect to the 100 wiring lines, it may be considered that it is possible to extract an average of five lines through each gap between the rectangular apertures. It can be found, however, that actually only a small number of lines can be made through in the upper left portion. Therefore, after deep deliberation, the minimum number of passing wiring lines is found to be six. Specifically, the number of wiring lines, which is 20% to 30% more than the average number of passing lines, is the number of wiring lines passing through a gap between the rectangular apertures.

Figure 34:
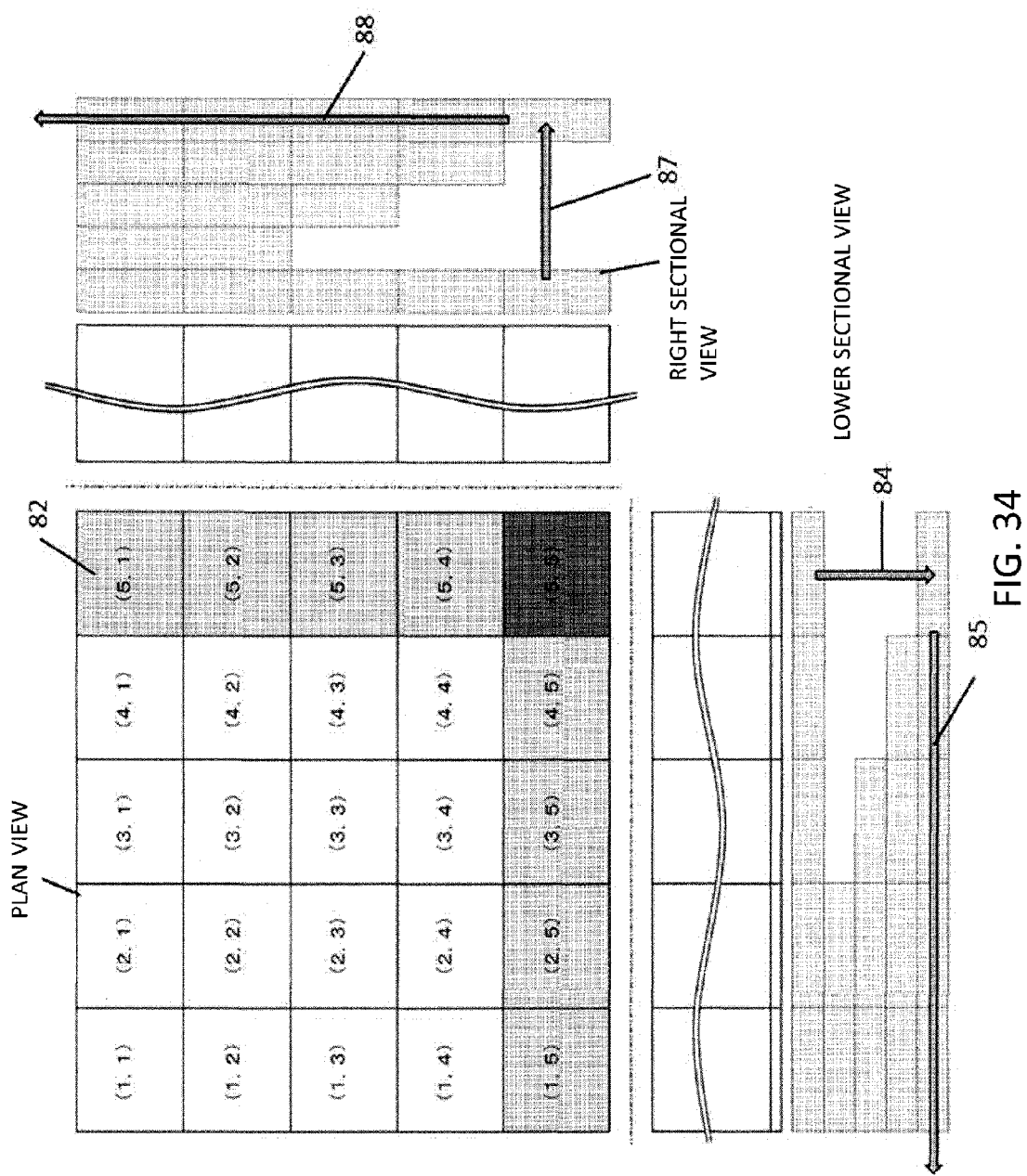
[FIG. 34] View for explaining dividing a whole of individual blankers into 5×5 wiring region groups for extraction.

FIG. 34 is a view for explaining a system for extracting wiring lines by multilayer interconnection.

In this figure, five wiring line substrates are bonded together to form a whole wiring line. As a total of 100× 100=10000 wiring lines are extracted by the five layers, it is sufficient that 2000 lines are extracted per each layer.

As the arrangement is symmetrical in four directions, it is sufficient that 500 lines are extracted from an upper left small region including 25 individual elements. FIG. 34 illustrates the lines in bundles of 50 lines. In FIG. 34, 400 lines in small regions (1,1) to (4,4) are not illustrated, whereas lines in a small region 82 which includes a small region (5,5) are illustrated. Specifically, a total of 100 lines disposed in the fifth row and the fifth column; that is, 50 lines toward above and 50 lines toward the left, are illustrated. All the lines are extracted through the fifth layer.

Concerning the small region (5,5), 50 lines reach the fifth layer through a through-hole 84 and are then extracted to the left by a group of lines 85. Further, another 50 lines in the small region (5,5) reach the fifth layer through a through-hole 87 and extracted above by a group of lines 88. Here, FIG. 34 illustrates a plan view in the upper left portion and illustrates cross sectional views in the lower and right portions.

Figure 35:
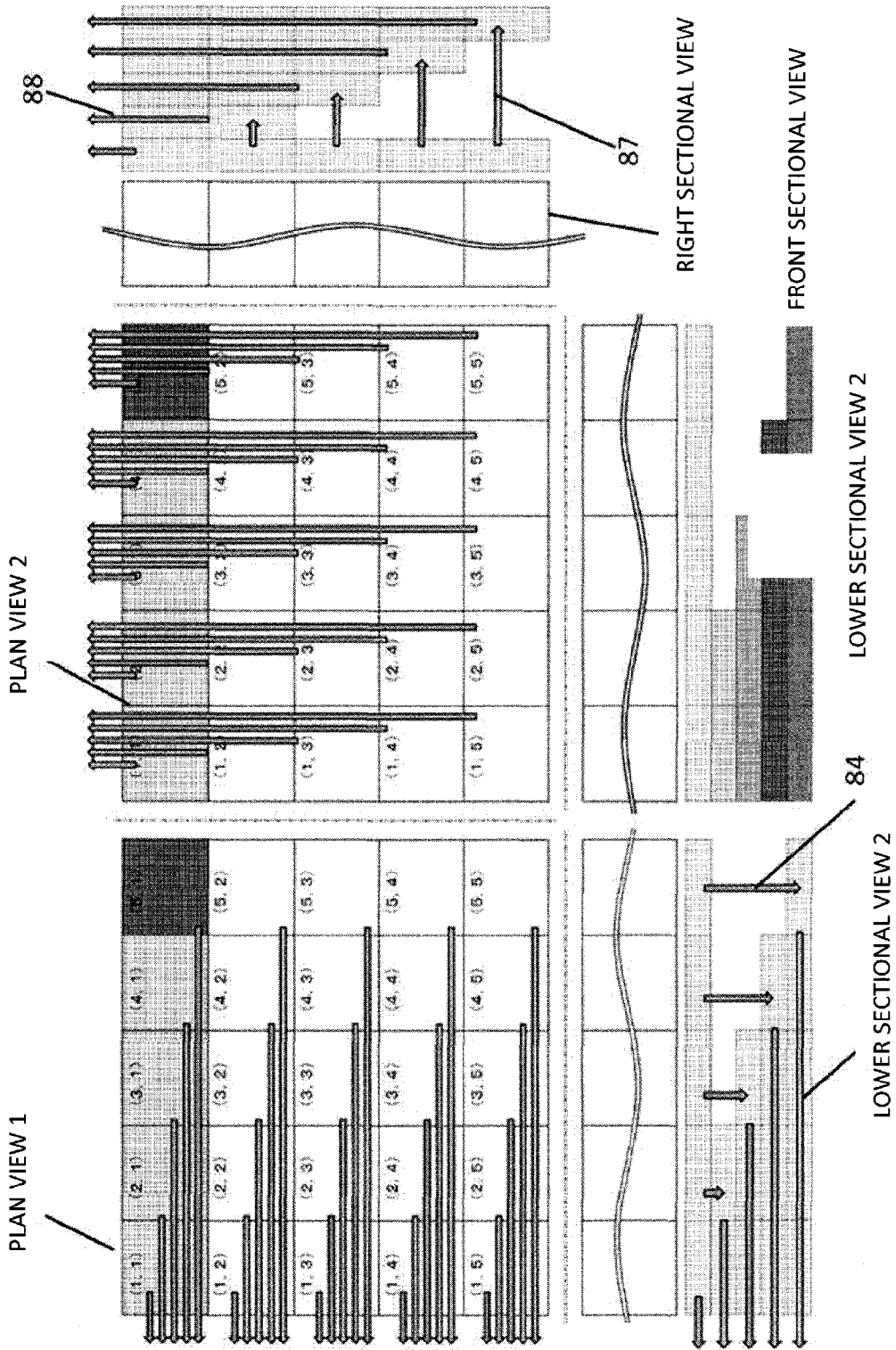
[FIG. 35] View for explaining, in further detail, dividing a whole of individual blankers into 5×5 wiring region groups for extraction.

FIG. 35 is a view for explaining a system for extracting lines by multilayer interconnection. Actually, 10000 lines are necessary. Extracting all these lines by the first to fifth layers would provide poor visibility unless determined systematically. Accordingly, the 10000 lines are first divided into 4 symmetrical sets of 2500 lines, which are further divided into 25 sets of 100 lines corresponding to 25 small regions. These regions will be represented by (n,m).

Here, each of n and m indicates an integer from 1 to 5. In this case, the following 25 small regions are present.

In a small region (5,5), 100 lines are divided into two sets of 50 lines, and one set of 50 lines is extracted toward above in the fifth layer, and another set of 50 lines is extracted to the left in the fifth layer.

In a small region (5,4), 100 lines are divided into two sets of 50 lines, and one set of 50 lines is extracted in the fourth layer, and another set of 50 lines is extracted in the fifth layer.

In a small region (5,3), 100 lines are divided into two sets of 50 lines, and one set of 50 lines is extracted in the third layer, and another set of 50 lines is extracted to the left in the fifth layer.

In a small region (5,2), 100 lines are divided into two sets of 50 lines, and one set of 50 lines is extracted toward above in the second layer, and another set of 50 lines is extracted to the left in the fifth layer.

In a small region (5,1), 100 lines are divided into two sets of 50 lines, and one set of 50 lines is extracted toward above in the first layer, and another set of 50 lines is extracted to the left in the fifth layer.

In a small region (4,5), 100 lines are divided into two sets of 50 lines, and one set of 50 lines is extracted toward above in the fifth layer, and another set of 50 lines is extracted to the left in the fourth layer.

In a small region (4,4), 100 lines are divided into two sets of 50 lines, and one set of 50 lines is extracted in the fourth layer, and another set of 50 lines is extracted in the fourth layer.

In a small region (4,3), 100 lines are divided into two sets of 50 lines, and one set of 50 lines is extracted in the third layer, and another set of 50 lines is extracted to the left in the fourth layer.

In a small region (4,2), 100 lines are divided into two sets of 50 lines, and one set of 50 lines is extracted toward above in the second layer, and another set of 50 lines is extracted to the left in the fourth layer.

In a small region (4,1), 100 lines are divided into two sets of 50 lines, and one set of 50 lines is extracted toward above in the first layer, and another set of 50 lines is extracted to the left in the fourth layer.

In a small region (3,5), 100 lines are divided into two sets of 50 lines, and one set of 50 lines is extracted toward above in the fifth layer, and another set of 50 lines is extracted to the left in the third layer.

In a small region (3,4), 100 lines are divided into two sets of 50 lines, and one set of 50 lines is extracted in the fourth layer, and another set of 50 lines is extracted in the third layer.

In a small region (3,3), 100 lines are divided into two sets of 50 lines, and one set of 50 lines is extracted in the third layer, and another set of 50 lines is extracted to the left in the third layer.

In a small region (3,2), 100 lines are divided into two sets of 50 lines, and one set of 50 lines is extracted toward above in the second layer, and another set of 50 lines is extracted to the left in the third layer.

In a small region (3,1), 100 lines are divided into two sets of 50 lines, and one set of 50 lines is extracted toward above in the first layer, and another set of 50 lines is extracted to the left in the third layer.

In a small region (2,5), 100 lines are divided into two sets of 50 lines, and one set of 50 lines is extracted toward above in the fifth layer, and another set of 50 lines is extracted to the left in the second layer.

In a small region (2,4), 100 lines are divided into two sets of 50 lines, and one set of 50 lines is extracted in the fourth layer, and another set of 50 lines is extracted in the second layer.

In a small region (2,3), 100 lines are divided into two sets of 50 lines, and one set of 50 lines is extracted in the third layer, and another set of 50 lines is extracted to the left in the second layer.

In a small region (2,2), 100 lines are divided into two sets of 50 lines, and one set of 50 lines is extracted toward above in the second layer, and another set of 50 lines is extracted to the left in the second layer.

In a small region (2,1), 100 lines are divided into two sets of 50 lines, and one set of 50 lines is extracted toward above in the first layer, and another set of 50 lines is extracted to the left in the second layer.

In a small region (1,3), 100 lines are divided into two sets of 50 lines, and one set of 50 lines is extracted in the third layer, and another set of 50 lines is extracted to the left in the first layer.

In a small region (1,2), 100 lines are divided into two sets of 50 lines, and one set of 50 lines is extracted toward above in the second layer, and another set of 50 lines is extracted to the left in the first layer.

In a small region (1,1), 100 lines are divided into two sets of 50 lines, and one set of 50 lines is extracted toward above in the first layer, and another set of 50 lines is extracted to the left in the first layer.

The lines are divided for respective small regions to reduce the number, and inter-layer connection is performed by TSV by using a copper line. Further, the periphery of TSV is insulated by an N-type semiconductor impurity-doped layer.

Here, FIG. 35 illustrates a plan view 1 showing lines to the left direction, a plan view 2 showing lines to the upper direction, cross sections of plan views 1 and 2 in the horizontal direction, and a cross section of plan view 2 in the vertical direction.

The semiconductor substrate which has been described heretofore refers to Si, SiC, germanium, gallium arsenide, gallium nitride, and so on.

The N-type semiconductor impurities described above generally include arsenic and phosphorus. The P-type semiconductor impurities are often boron.

As a backward bias diode of PN junction is used for insulation of the wiring lines and electrodes described above, dielectric breakdown does not occur within a finite time with respect to electron irradiation of 50 kV.

Further, it is also possible to make the substrate of N-type and provide a P-type impurity-doped layer in the periphery of the electrodes and the wiring lines. In this case, the blanking potential is −5V.

The electrode formed by doping impurities on the side wall of the individual blanker may be formed on the side wall of an aperture or the side wall of a groove.

INDUSTRIAL APPLICABILITY

With the electron beam lithography method according to the present embodiment, as 8 nm or more fine pattern lithography can be performed at a high speed, high-speed exposure of a device having a size of 6 nm or less, which will be instrumental for future key industries, such as a high-speed MPU, an artificial intelligence MPU, and so on, can be achieved, which will greatly contribute to industry.

REFERENCE SYMBOL LIST

1 electron beam, 2 column, 3 PSA-BA function section, 4 PSA-BA substrate, 10 control device, 11, 12 electron shielding plate, 13 individual blanker, 14 round aperture, 16 whole blanker, 17 main deflector, 18 sub deflector, 19 lens, 20*a* reducing lens, 20*b* projection lens, 21 electron gun, 22 rectangular aperture, 23 BAA, 24 round aperture, 25 main deflector, 26 blanker, 27 sub deflector, 28 wafer, 29 chip, 30 stripe, 31 main deflection range, 32 sub field, 33 frame, 34 image of BAA, 40 beam, 41 beam size, 42 beam gap, 43 beam pitch, 44 beam size, 45 beam gap, 46 beam pitch, 47 mesh size in X direction, 48 mesh size in Y direction, 51, 51*a*, 51*b*, 51*c* blanking electrode, 52 rectangular aperture, 53 earth electrode, 54 wiring line, 55 N-type semiconductor, 56 P-type semiconductor, 57 A-A' line, 58 bonding metal film (gold), 59 copper line, 61*a*, 61*b*-61*j* 30 nm line-and-space pattern, 62*a*, 62*b*-62*j*, 62*k*, 62*l* 25 nm line-and-space pattern, 63 metal, 64 wiring line, 65 P-type semiconductor, 66 bonding oxide film, 68 rectangular beam forming separation plate (Si membrane), 71 small region, 72 rectangular aperture, 73 blanking electrode, 74*a*, 74*b*, 74*c*, 74*d*, 74*e*, 74*f*, 74*g*, 74*h*, 74*i*, 74*j* line group, 75*a*, 75*b*, 75*c*, 75*d*, 75*e*, 75*f*, 75*g*, 75*h*, 75*i*, 75*j* line group, 82 small region, 84 through hole, 85 line group, 87 through hole, 88 line group, 101 drawing sequence control circuit, 102 bitmap storage device, 103 data sorting device, 104 serializer, 105 driver, 106 laser, 107 photo diode, 108 amplifier, 109 deserializer, 110 circuit from serializer to deserializer, 111, 112 to 118 register, 121, 122 to 128 amplifier, 140 optical fiber, 141 data serial parallel transmission circuit, 142 register A, 143 register B, 144 amplifier, 144*a* amplifier a, 144*b* amplifier b, 144*c* amplifier c, 144*d* amplifier d, 145 PSA-BA substrate, 145*a* PSA-BA substrate a, 145*b* PSA-BA substrate b, 145*c* PSA-BA substrate c, 145*d* PSA-BA substrate d, 146 substrate, 147 ball grid, 151 20 nm mesh, 152 20 nm mesh, 161 first pattern, 162 second pattern, 163 space, 171 pattern, 172 pattern, 173 space, 174 space, 200 cathode, 201 suppressor, 202 extraction electrode, 203 anode, 204, 205 orifice, 206 double alignment coil, 207 electron gun chamber, 208 intermediate space, 209 intermediate space, 220 beam aperture, 221 a pair of two electrodes of individual blanker, 222 a pair of two electrodes of individual blanker, 223 electrode supporting semiconductor, 241 electron shielding plate, 242 electron shielding plate, 243 electric insulating film of wiring line portion, 244 line, 245 via, 251 heat sink, 301 wiring pattern, 310 rectangular aperture, 311 lens, 312 multiple-type matrix beam selection deflector, 313 shift correction deflector in multiple-type matrix beam selection deflection, 314 shift correction deflector in multiple-type matrix beam selection deflection, 320 blanker waveform in fixed speed continuous scan mode, 321 blanker waveform at portion of 100% fill-in area ratio, 322 blanker waveform near D point, 330 lithographic pattern, 331 figure, 332 figure, 333 solid line indicating exposure amount distribution, 334 dashed line indicating exposure amount distribution, 335 desired electron amount distribution, 340 square lattice matrix beam, 341 curve, 342 beam portion where bitmap is OFF, 343 beam portion where bitmap is ON, 344 partial view, 345 partial view, 345*a* state view illustrating bitmap state, 345*b* state view illustrating bitmap state, 345*c* state view illustrating bitmap state, 345*d* state view illustrating bitmap state, 541 silicon substrate, 542 silicon oxide film, 543 silicon oxide film, 544 wiring line, 545 blanking electrode, 546 earth electrode

The invention claimed is:

1. An electron beam lithographic method in which an electron beam lithography device is used for scanning a plurality of individual element beams on a specimen for lithography,
the electron beam lithography device comprising:
an electron gun which emits an electron beam in a Z-axis direction;
a shielding plate having a plurality of openings arranged in X and Y directions at a predetermined arrangement pitch, the shielding plate obtaining a plurality of individual element beams having a beam size which is restricted to a size of the opening from the electron beam emitted from the electron gun;
a plurality of individual blankers configured to turn the plurality of individual element beams obtained by the shielding plate ON/OFF individually;
a whole blanker configured to turn the plurality of individual element beams emitted from the plurality of individual blankers ON/OFF as a whole; and
a deflector which deflects the plurality of individual element beams having passed through the plurality of individual blankers and the whole blanker as a whole by every predetermined pitch, so as to scan the plurality of individual element beams stepwise with respect to the specimen,
the method comprising the steps of:
in a state in which emission of the plurality of individual element beams from the whole blanker is turned OFF, the deflector determining a direction of emission of the plurality of individual element beams, and, in accordance with a bitmap indicating ON/OFF of emission of the individual element beam from each individual blanker which is generated per shot in each emission direction, controlling the plurality of individual element blankers to control ON/OFF of the individual element beams emitted from the respective individual element blankers,
after processing for emitting the individual element beam from each individual blanker is settled, with the emission of the plurality of individual element beams from the whole blanker being turned ON, emitting to the specimen one shot formed by the individual element beams from the plurality of individual blankers in the ON state, and, with repetition of this one-shot emission formed by the plurality of individual element beams while shifting positions of the plurality of individual element beams by the deflector, drawing on the specimen a pattern in accordance with pattern data which is a target of lithography, and
generating the bitmap based on comparison between the pattern data and irradiation positions of the plurality of individual element beams onto the specimen that are determined in accordance with the arrangement pitch of the openings in the shielding plate, and, at the time of generating the bitmap, calculating the number of shots that is necessary for performing lithography corresponding to the pattern data, and when the number of necessary shots which is calculated exceeds the predetermined number, changing the pattern data.

2. The electron beam lithographic method according to claim 1, further comprising
assuming that the arrangement pitch of the plurality of individual blankers is P and a repetition pitch of a pattern in the pattern data is L, selecting an appropriate value of L such that a value obtained by dividing the least common multiple of P and L by L or P does not exceed a predetermined value, and modifying the pattern data to be drawn based on the value of L which is selected.

3. The electron beam lithographic method according to claim 1, further comprising:
providing a plurality of sets of the shielding plate and the individual blanker, with the arrangement pitch in the X and Y directions in each set being different from each other, and selecting one of the plurality of sets, for lithography, in accordance with the pattern data.

4. The electron beam lithographic method according to claim 1, further comprising:
externally supplying the bitmap data via a parallel serial data conversion circuit and storing the bitmap data as parallel data in a register through a deserializer.

5. The electron beam lithographic method according to claim 4, further comprising:
in a process in which the bitmap data are externally supplied via a parallel serial data conversion circuit and stored, as parallel data, in a register through a deserializer, employing laser optical communication using an optical fiber.

6. An electron beam lithography device for use in the electron beam lithographic method according to claim 1, wherein
the individual blanker includes a pair of electrodes for deflecting the individual element beam, and
in the pair of electrodes, an intrinsic semiconductor layer including SiC, Si, and the like, or a semiconductor depletion layer is used as an insulating film.

7. An electron beam lithography device, comprising:
an electron gun which emits an electron beam in a Z-axis direction;
a shielding plate having a plurality of openings arranged in X and Y directions at a predetermined arrangement pitch, the shielding plate obtaining a plurality of individual element beams having a beam size which is restricted to a size of the opening from the electron beam emitted from the electron gun;
a plurality of individual blankers configured to turn the plurality of individual element beams obtained by the shielding plate ON/OFF individually;
a whole blanker configured to turn the plurality of individual element beams emitted from the plurality of individual blankers ON/OFF as a whole;
a deflector which deflects the plurality of individual element beams having passed through the plurality of individual blankers and the whole blanker as a whole by every predetermined pitch, so as to scan the plurality of individual element beams stepwise with respect to the specimen; and a control device which performs control such that in a state in which emission of the plurality of individual element beams from the whole blanker is turned OFF, a direction of emission of the plurality of individual element beams is determined by the deflector, and, in accordance with a bitmap indicating ON/OFF of emission of the individual element beam from each individual blanker which is generated per shot in each emission direction, the bitmap being generated based on comparison between the pattern data, which is a target of lithography, and irradiation positions of the plurality of individual element beams onto the specimen that are determined in accordance with the arrangement pitch of the openings in the shielding plate, the plurality of individual element blankers are controlled to control ON/OFF of the individual element beam emitted from each individual element blanker; and, after processing for emitting the individual element beam from each individual blanker is settled, with emission of the plurality of individual element beams from the whole blanker being turned ON, one shot formed by the individual element beams from a plurality of individual blankers in the ON state is emitted to the specimen, and, with repetition of this one-shot emission formed by a plurality of individual beams while shifting positions of the plurality of individual element beams by the deflector, a pattern in accordance with pattern data which is a target of lithography is drawn on the specimen, wherein the individual blanker includes a pair of electrodes for deflecting the individual element beam, and the pair of electrodes are formed using a semiconductor layer which is provided at a location of a P-type or N-type semiconductor substrate through which the individual element beam passes and in which N-type or P-type impurities which are of a type opposite the type of the semiconductor substrate are doped on a side surface of the opening.

8. The electron beam lithography device according to claim 7, wherein a plurality of the semiconductor substrates are bonded together to form a blanking electrode which is elongated in a beam traveling direction.

9. The electron beam lithography device according to claim 7, wherein in order to insulate wiring metals connected to the blanking electrode from each other, the wiring metal is covered with a PN junction diode, and the PN junction diode has a backward bias property so as to prevent electric current from flowing in the semiconductor substrate in the periphery when a voltage other than 0 voltage is applied to the wiring metal.

10. The electron beam lithography device according to claim 7, wherein a multilayer wiring substrate is used for a wiring line for connection to the blanking electrode of each individual blanker, and the total number of individual blankers is divided by an integer to separate the individual blankers into a plurality of small groups, wherein in each of the groups, wiring is performed in the same layer in the vertical direction and the horizontal direction.

11. The electron beam lithography device according to claim 7, wherein wiring for connecting to the blanking electrode of each individual blanker is performed within one layer, and connection to another layer is performed by using a through hole.

* * * * *